US007432717B2

(12) United States Patent
Frederick et al.

(10) Patent No.: US 7,432,717 B2
(45) Date of Patent: Oct. 7, 2008

(54) REPAIR DEVICE FOR DECORATIVE LIGHT SHUNT

(75) Inventors: W. Richard Frederick, Mundelein, IL (US); John Prey, Tower Lake, IL (US)

(73) Assignee: Ulta-Lit Tree Co., Glenview, IL (US)

( * ) Notice: Subject to any disclaimer, the term of this patent is extended or adjusted under 35 U.S.C. 154(b) by 0 days.

(21) Appl. No.: 11/601,428

(22) Filed: Nov. 17, 2006

(65) Prior Publication Data

US 2007/0063706 A1    Mar. 22, 2007

Related U.S. Application Data

(60) Continuation of application No. 11/257,623, filed on Oct. 25, 2005, now Pat. No. 7,145,343, which is a division of application No. 10/703,858, filed on Nov. 6, 2003, now Pat. No. 6,984,984, which is a continuation-in-part of application No. 10/041,032, filed on Dec. 28, 2002, now Pat. No. 6,734,678.

(60) Provisional application No. 60/289,865, filed on May 9, 2001, provisional application No. 60/277,481, filed on Mar. 20, 2001.

(51) Int. Cl.
*G01R 31/00* (2006.01)
*G01R 29/12* (2006.01)

(52) U.S. Cl. .................. 324/414; 324/457; 324/530; 324/686

(58) Field of Classification Search ............... 324/414, 324/406, 456, 530; 315/185 S
See application file for complete search history.

(56) References Cited

U.S. PATENT DOCUMENTS 3,063,006 A    11/1962    Steinberger ................. 324/51

3,214,579 A    10/1965    Pacini ........................ 240/10
3,749,975 A     7/1973    Walters .................. 315/227 R
3,964,040 A     6/1976    Behl ......................... 340/251
4,034,259 A     7/1977    Schoch ....................... 315/93

(Continued)

FOREIGN PATENT DOCUMENTS

JP    54026483 A  *  2/1979

(Continued)

OTHER PUBLICATIONS

Christmas Wonderland Website: www.christmaswonderland.org , Just the FAQS (Frequently Asked Questions), Feb. 15, 2003, p. 3.

(Continued)

*Primary Examiner*—Diego Gutierrez
*Assistant Examiner*—John Zhu
(74) *Attorney, Agent, or Firm*—Nixon Peabody LLP

(57) ABSTRACT

A repair device for fixing a malfunctioning shunt across a failed filament in a light bulb in a group of series-connected miniature decorative bulbs includes a high-voltage pulse generator producing one or more pulses of a magnitude greater than the standard AC power line voltage. A connector receives the pulses from the pulse generator and supplies them to the group of series-connected miniature decorative bulbs. The pulse generator may be a piezoelectric pulse generator, a battery-powered electronic pulse generator, and/or an AC-powered electrical pulse generator.

1 Claim, 42 Drawing Sheets

U.S. PATENT DOCUMENTS

| | | | | |
|---|---|---|---|---|
| 4,233,543 | A | 11/1980 | Hickok | 315/75 |
| 4,340,841 | A | 7/1982 | Schupp | 315/75 |
| 4,349,783 | A * | 9/1982 | Robson et al. | 324/457 |
| 4,425,605 | A | 1/1984 | Cheng | 362/227 |
| 4,608,508 | A | 8/1986 | Ohnishi | 310/339 |
| 4,610,624 | A | 9/1986 | Bruhn | 431/255 |
| 4,646,338 | A | 2/1987 | Skillicorn | 378/110 |
| 4,727,449 | A | 2/1988 | Fleck | 361/54 |
| 4,943,752 | A | 7/1990 | Todd et al. | 310/339 |
| 5,008,626 | A | 4/1991 | Boyd, Sr. | 324/414 |
| 5,032,961 | A | 7/1991 | Pouyanne et al. | 362/251 |
| 5,047,721 | A * | 9/1991 | Farley | 324/414 |
| 5,065,067 | A | 11/1991 | Todd et al. | 310/339 |
| 5,150,964 | A | 9/1992 | Tsui | 362/251 |
| 5,179,339 | A | 1/1993 | Volk, Jr. | 324/414 |
| 5,262,697 | A | 11/1993 | Meury | 310/339 |
| 5,290,986 | A | 3/1994 | Colon et al. | 219/770 |
| 5,317,491 | A | 5/1994 | Lee | 362/249 |
| 5,319,312 | A | 6/1994 | Segilia | 324/556 |
| 5,365,145 | A | 11/1994 | Fields | 315/86 |
| 5,369,363 | A | 11/1994 | Hey | 324/414 |
| 5,453,664 | A | 9/1995 | Harris | 315/185 |
| 5,539,317 | A | 7/1996 | Janning | 324/414 |
| 5,604,436 | A | 2/1997 | Henritzy et al. | 324/414 |
| 5,676,250 | A | 10/1997 | Walters | 206/419 |
| 5,745,410 | A | 4/1998 | Yiu et al. | 365/185.11 |
| 5,877,618 | A | 3/1999 | Luebke et al. | 324/72.5 |
| 5,955,845 | A | 9/1999 | Fellows | 315/189 |
| 5,975,717 | A | 11/1999 | Rahman | 362/251 |
| 5,990,807 | A * | 11/1999 | Cloutier et al. | 340/870.37 |
| 6,031,742 | A | 2/2000 | Journeau | 363/60 |
| 6,065,958 | A | 5/2000 | Adams et al. | 431/153 |
| 6,095,796 | A | 8/2000 | Sung | 431/153 |
| 6,095,799 | A | 8/2000 | McDonough et al. | 431/255 |
| 6,116,892 | A | 9/2000 | Yang | 431/153 |
| 6,224,228 | B1 | 5/2001 | Frederick | 362/116 |
| 6,340,868 | B1 * | 1/2002 | Lys et al. | 315/185 S |
| 6,344,716 | B1 | 2/2002 | Gibboney, Jr. | 315/185 S |
| 6,480,001 | B2 | 11/2002 | Frederick | 324/403 |
| D467,150 | S | 12/2002 | Frederick | D8/68 |
| 6,603,302 | B2 * | 8/2003 | Prineppi | 324/133 |
| 2002/0175666 | A1 | 11/2002 | Benton | 324/72.5 |
| 2002/0180455 | A1 * | 12/2002 | Okano et al. | 324/530 |
| 2002/0195945 | A1 | 12/2002 | Gershen et al. | 315/55 |
| 2005/0184876 | A1 * | 8/2005 | Tokudome | 340/573.1 |

FOREIGN PATENT DOCUMENTS

WO    WO 02/075862 A1    9/2002

OTHER PUBLICATIONS

Christmas Factory Website: www.christmasfactory.com, Christmas Factory Catalog Intro., Feb. 15, 2003, 1 page.

Roman, Inc. Rep Website: rep.roman.com. Item Lookup, Feb. 18, 2003, 1 page.

Lincoln Imports, Ltd. Website: www.e-silkflower.com, Troubleshooting Using the Tester for Pre-Lighted Trees, Feb. 19, 2003, 2 pages.

Performance Certification to EMC Directive, Normative Standards: Federal Communication Part 15, Test Unit Description and Serial No.: Roam Lights High Voltage Light Tester Item # 161255, dated Mar. 6, 2003, 25 pages.

ST Product Literature for Hex Inverter Model No. HCF4069UB, dated Sep. 2001, 7 pages.

* cited by examiner

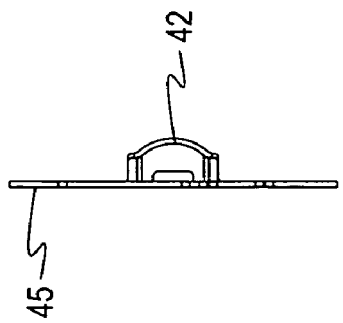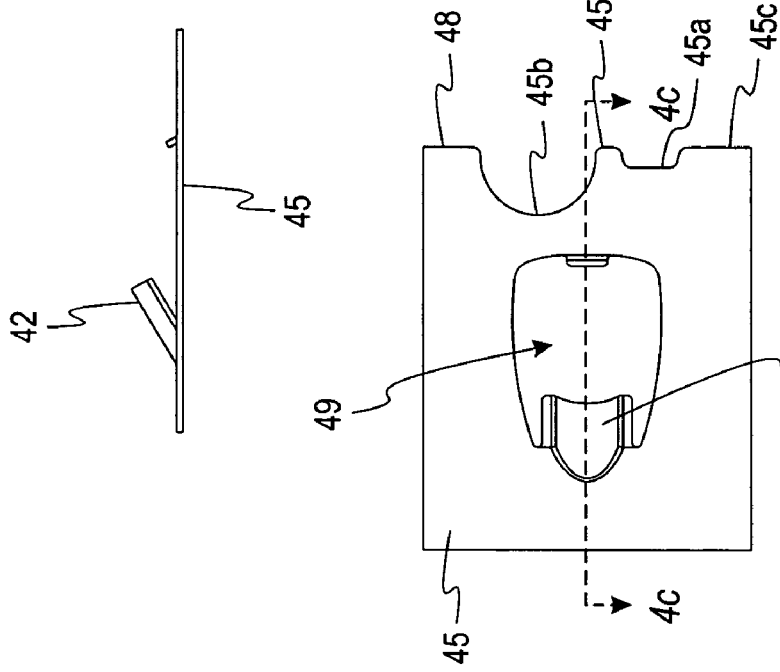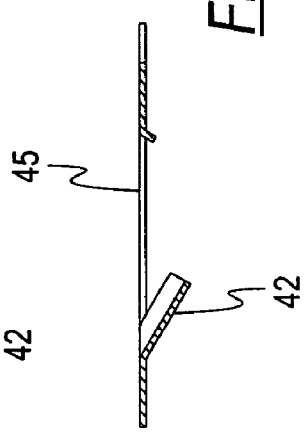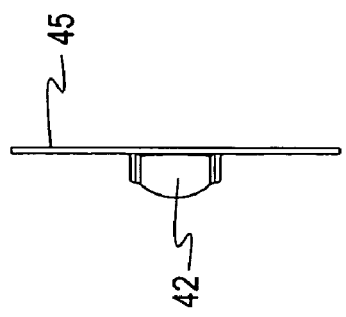

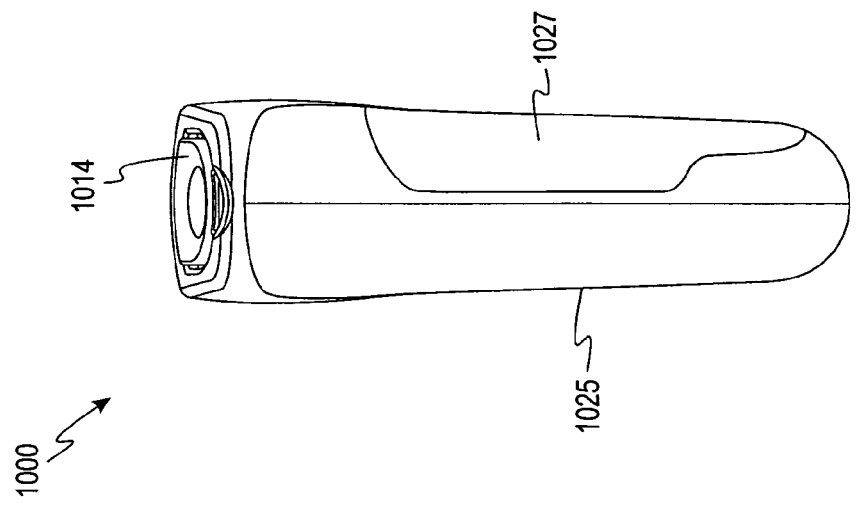
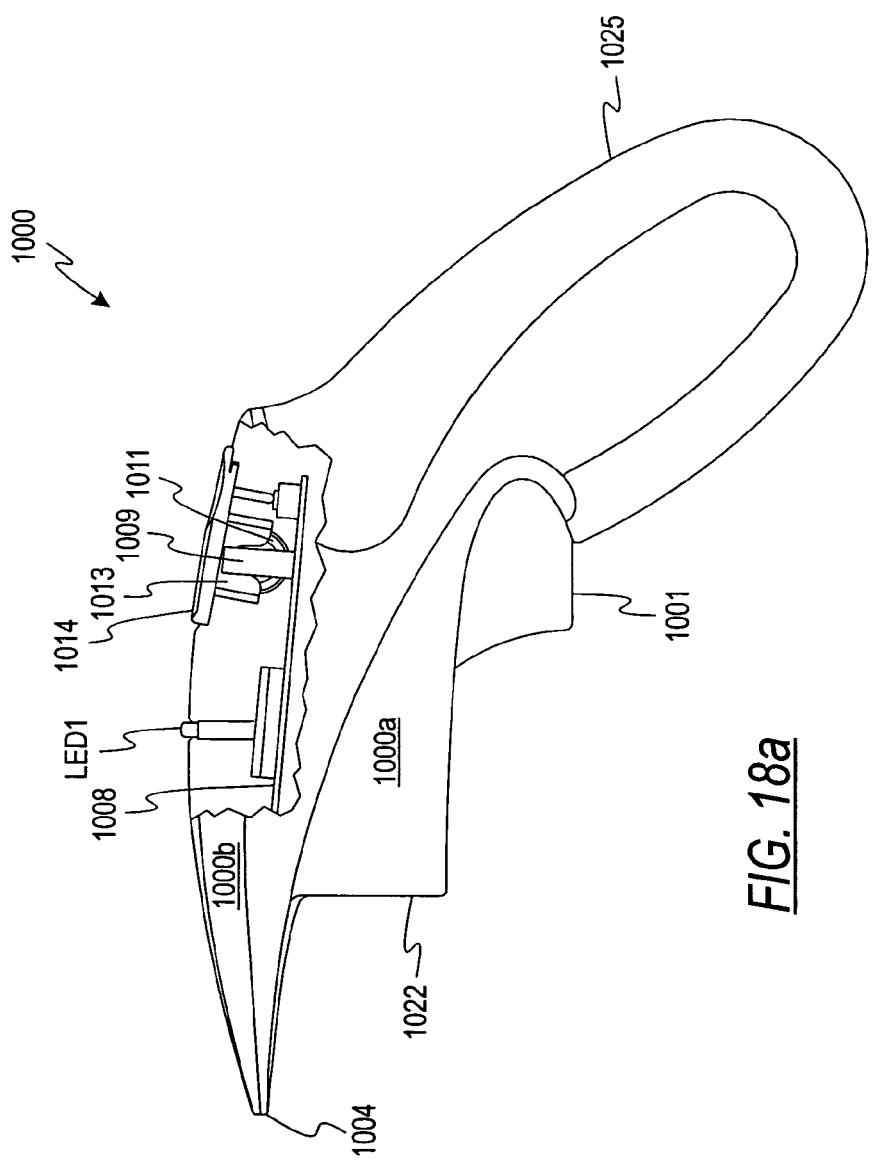
FIG. 18b
FIG. 18a

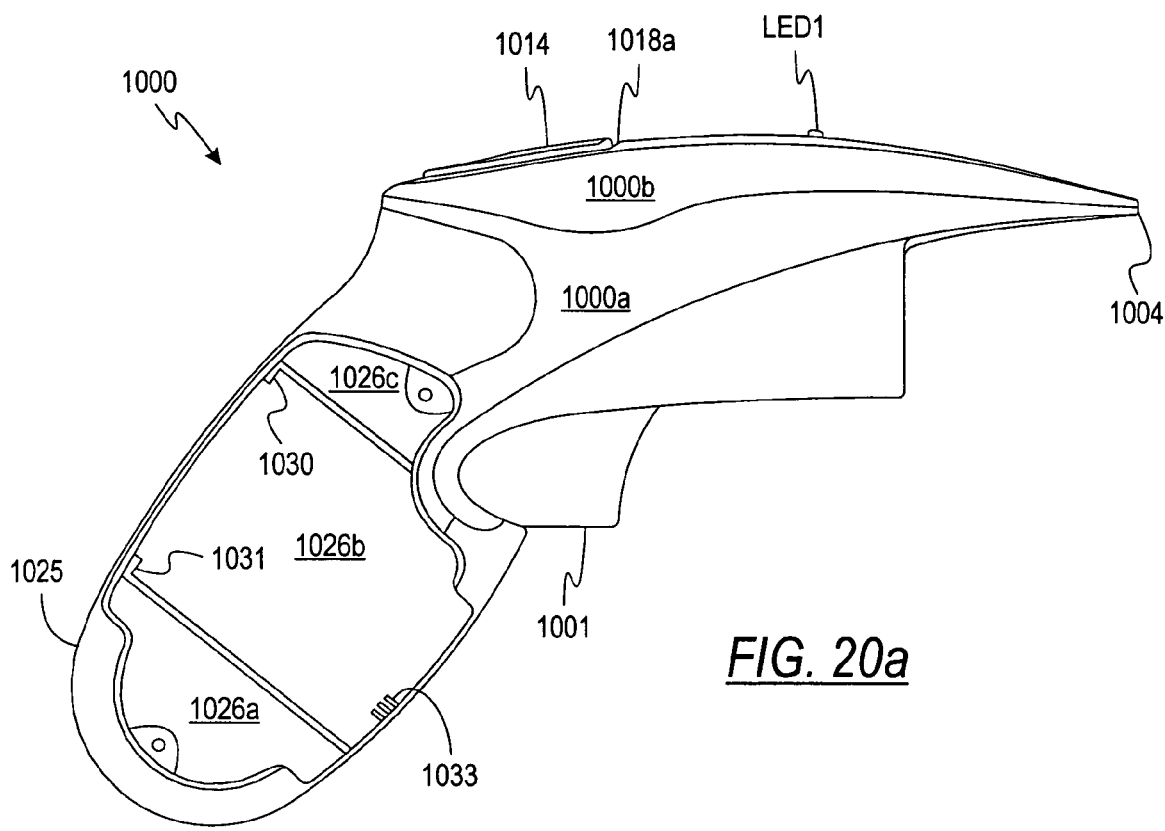
FIG. 20a
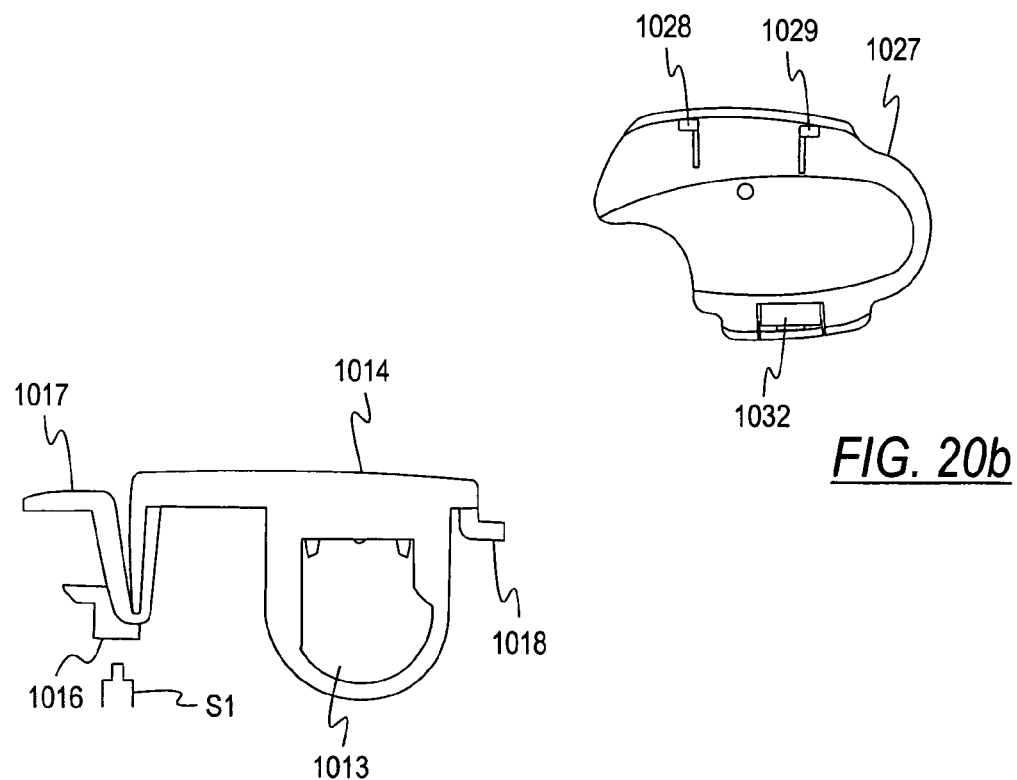
FIG. 20b
FIG. 21

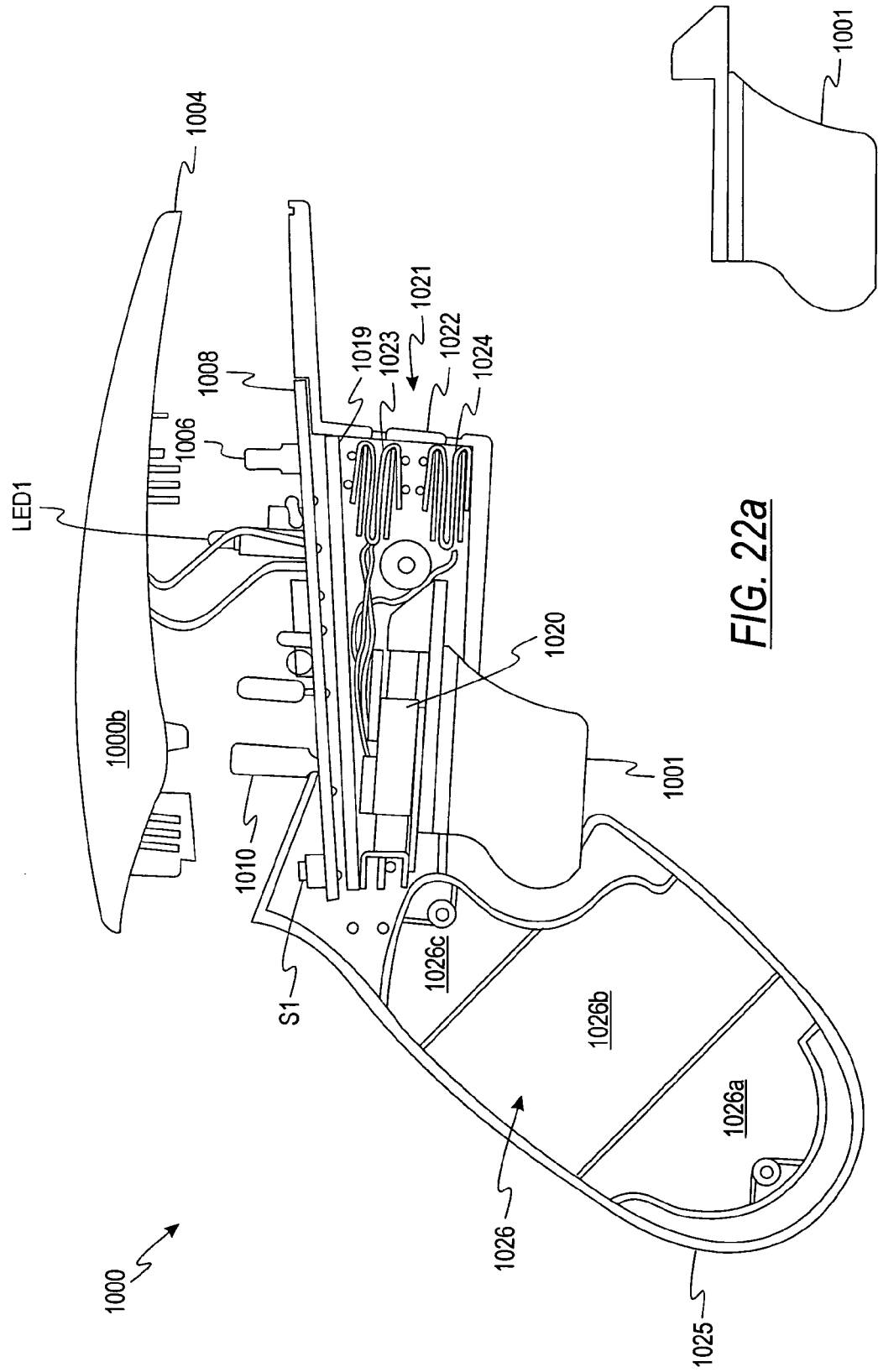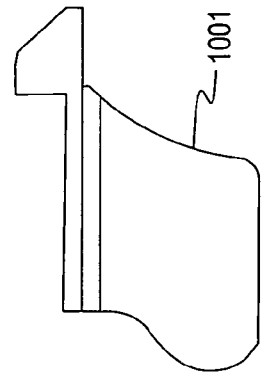
FIG. 22a
FIG. 22b

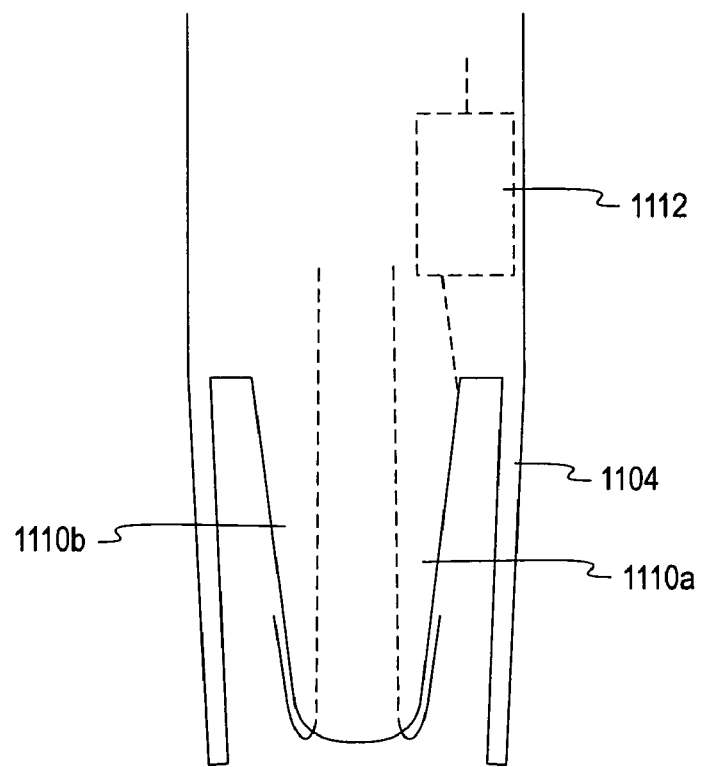
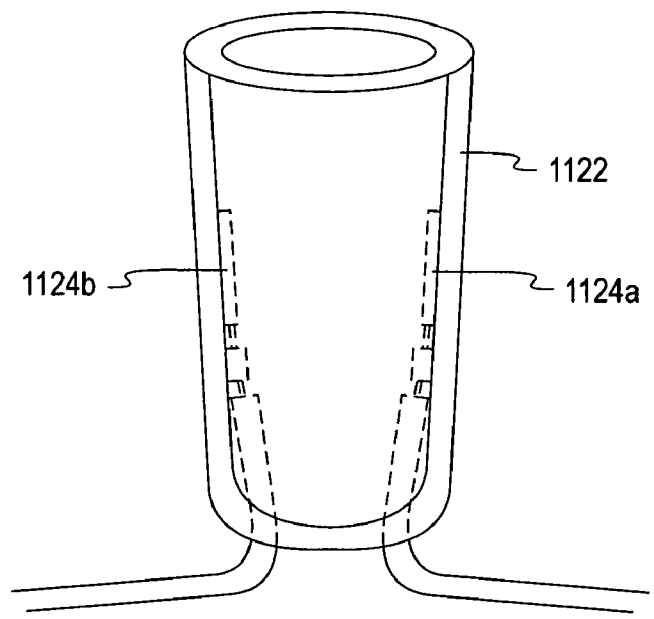
FIG. 27

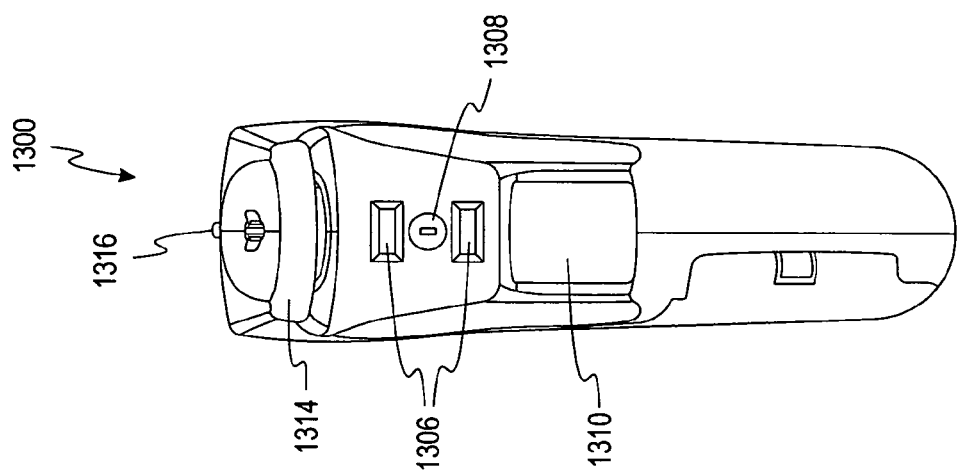
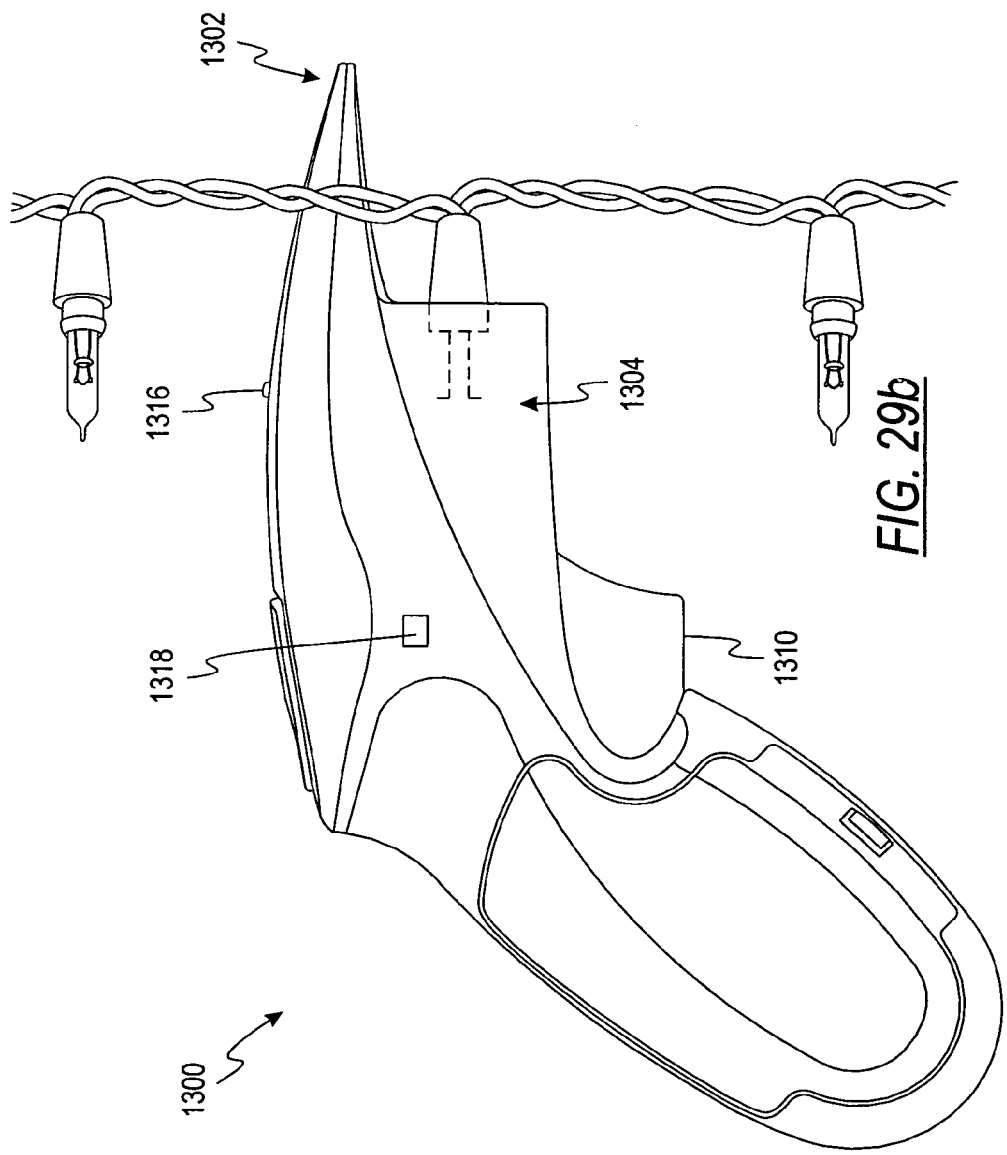

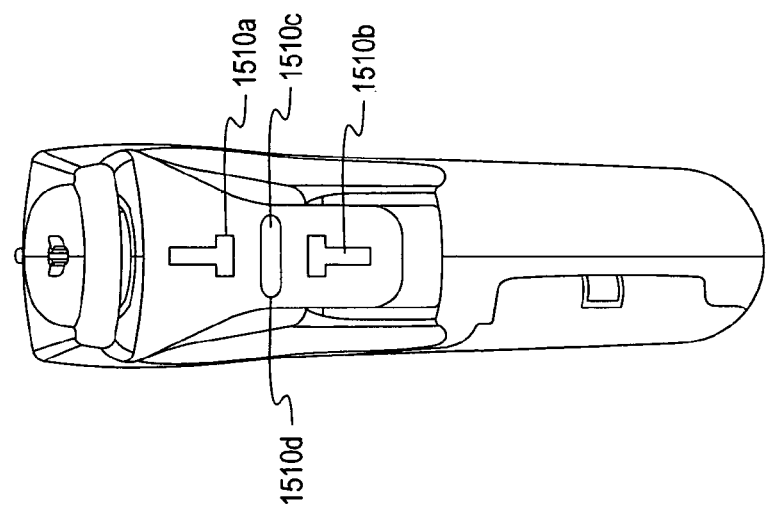
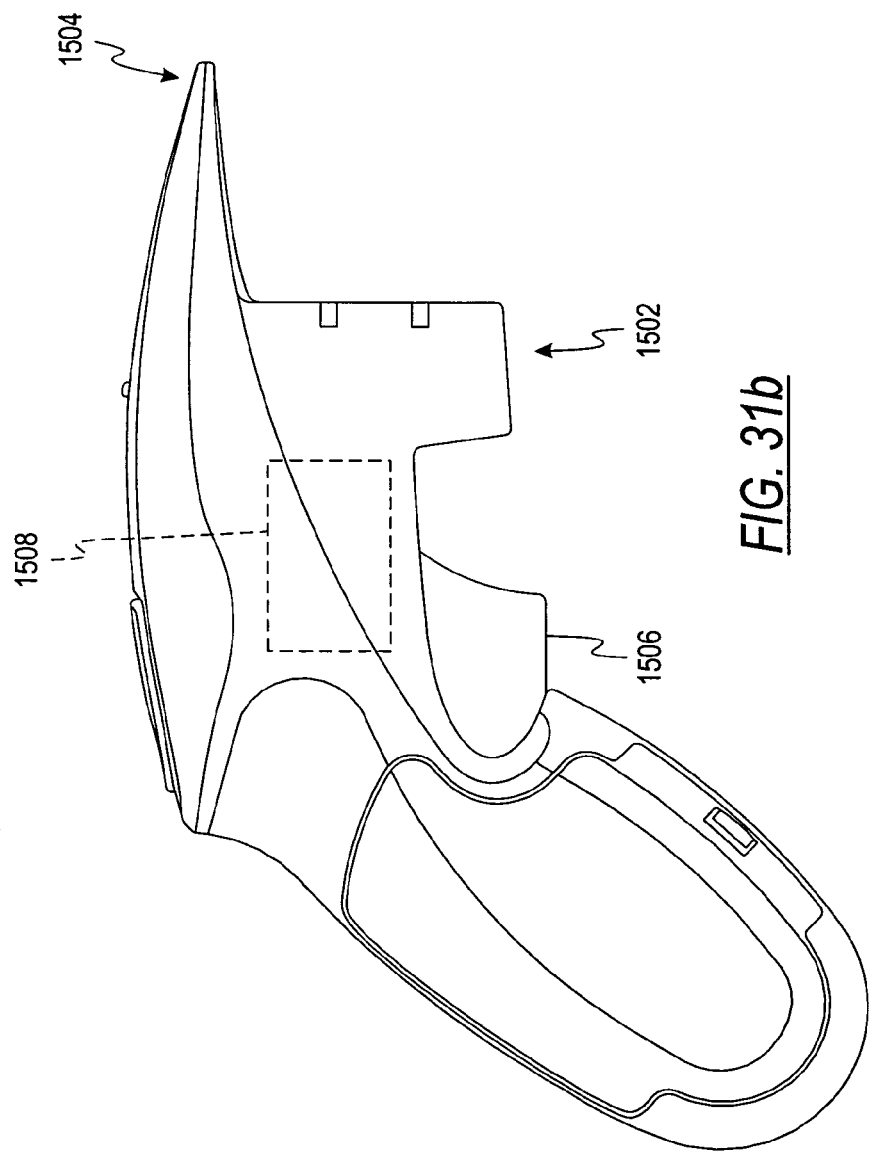

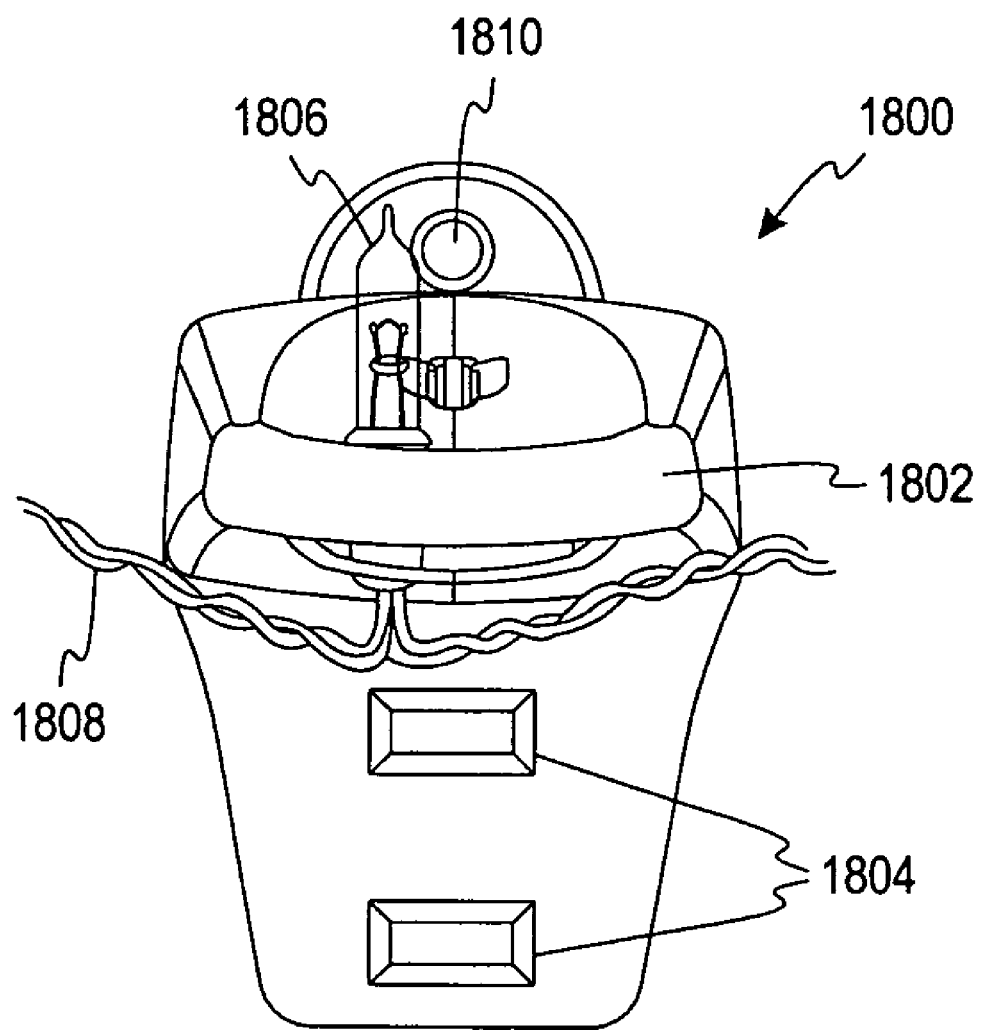
*FIG. 34*

REPAIR DEVICE FOR DECORATIVE LIGHT SHUNT

CROSS-REFERENCE TO RELATED APPLICATIONS

This application is a continuation of U.S. application Ser. No. 11/257,623 filed Oct. 25, 2005 now U.S. Pat. No. 7,145,343, which is a divisional of U.S. application Ser. No. 10/703,858 filed Nov. 6, 2003, now U.S. Pat. No. 6,984,984, issued Jan. 10, 2006, which is a continuation-in-part of U.S. application Ser. No. 10/041,032 filed Dec. 28, 2001, now U.S. Pat. No. 6,734,678, issued May 11, 2004, claiming priority to U.S. Provisional Application Ser. No. 60/277,481 filed Mar. 20, 2001, and to U.S. Provisional Application Ser. No. 60/289,865 filed May 9, 2001, all of which are incorporated by reference in their entireties.

FIELD OF THE INVENTION

The present invention relates to devices for repairing and testing decorative lights, including lights for Christmas trees, including pre-strung or "pre-lit" artificial trees.

BACKGROUND OF THE INVENTION

One of the most common uses of series-connected light strings, particularly of the commonly called "miniature" type, is for decoration and display purposes, particularly during Christmas time and other holidays. Such light strings are especially popular for the decoration of Christmas trees, both inside and outside commercial, industrial and residential buildings, trees and shrubbery, and the like.

Probably the most popular light set currently available on the U.S. market comprises one or more strings of 50 miniature light bulbs each. In Europe and other countries that have 240-volt power rather than 120 volts, strings of 100 lights are more common. Each bulb typically has an operating voltage of 2.5 volts, and the filaments of each 50-bulb string are connected in an electrical series circuit arrangement. If overall light sets of more than 50 bulbs are desired, the common practice is to provide a plurality of 50-bulb strings, with the bulbs in each string connected in electrical series, and with the plurality of strings being connected in a parallel circuit arrangement with respect to each other to form the light set.

As the bulbs in each string are connected in series, when a single bulb fails to illuminate for any reason, the whole string fails to light, and it is very frustrating and time consuming to locate and replace a defective bulb or bulbs. Usually many bulbs have to be checked in order to find the failed bulb. In fact, in many instances, the frustration and time-consuming efforts are so great as to cause one to completely discard and replace the string with a new string. Replacement, however, does not offer a practical solution if the lights are on an already decorated Christmas tree where removal could cause damage to the ornaments, or on wire frame yard decorations where the lights have many clips and wire ties holding them to the frame.

Light bulb manufacturers have also attempted to solve the problem of light section or string failures caused by single bulb failure by designing each light bulb in the string in a manner whereby the filament in each light bulb is shorted by a shunting device whenever it burns out for any reason, thereby preventing an open circuit condition from occurring in the socket of the burned-out bulb. However, in actual practice, it has been found that such short circuiting feature within the bulb does not always operate in the manner intended, resulting in the entire series section or string going out whenever a single bulb burns out.

The above-cited attempts to prevent string failure in series-circuit light strings have included the use of one or more shunt devices in association with each bulb and socket combination. The shunt is typically positioned directly within the glass envelope of each bulb in the string, making the effectiveness of the shunt depend on the presence at all times of a bulb within each of the bulb sockets in the string. In operation, the shunt provides an alternate path through which electric current will flow in the event of filament failure. After bulb failure and as long as the bulb remains in the string, the shunt allows current to continue to flow through the bulb, thereby preventing the failure of the entire series section of the light string.

The shunt is typically made at least in part of a material that is non-conductive as long as the bulb filament is operative, but becomes conductive whenever the filament fails. In normal operation, current will flow through the filament to produce incandescent light within the bulb envelope. When the filament breaks, however, the increased voltage differential across the bulb lead wires causes the non-conductive material to break down so that current continues to flow through the shunt in the failed bulb to the other bulbs in series therewith. That is, each shunt is inoperative unless and until it is subjected to substantially the full output voltage of the power source. When the bulb filament associated with a shunt fails, that shunt is subjected to the full voltage of the power supply, which renders that shunt operative to bypass the failed filament. A variety of different shunt structures and materials are well known in the industry, such as those described in U.S. Pat. Nos. 4,340,841 and 4,808,885.

In actual practice, the shunts described above do not function with a high degree of reliability, and thus the failure of a single bulb still often extinguishes the entire string.

SUMMARY OF THE INVENTION

In accordance with the present invention, there is provided a repair device for fixing a malfunctioning shunt across a failed filament in a light bulb in a group of series-connected miniature decorative bulbs. The device includes a high-voltage generator producing at least one electrical signal of a magnitude greater than the standard AC power line voltage. A connector receives the electrical signals from the voltage generator and supplies them to the group of series-connected miniature decorative bulbs. The voltage generator may be a piezoelectric generator, a battery-powered electronic generator, a non-battery DC powered electrical generator, and/or an AC-powered electrical generator.

The group of series-connected miniature decorative bulbs is typically all or part of a light string that includes wires connecting the bulbs to each other and conducting electrical power to the bulbs. The repair device preferably includes a sensor for sensing the strength of the AC electrostatic field around a portion of the wires adjacent to the sensor and producing an electrical signal representing the field strength. An electrical detector receives the signal and detects a change in the signal that corresponds to a change in the strength of the AC electrostatic field in the vicinity of a failed bulb. The detector produces an output signal when such a change is detected, and a signaling device connected to the detector produces a visible and/or audible signal when the output signal is produced to indicate that the sensor is in the vicinity of a failed bulb or other circuit interruption. The failed bulb can then be identified and replaced or the circuit interruption can be identified and repaired.

The repair device is preferably made in the form of a portable tool with a housing that forms at least one storage compartment so that replacement bulbs and fuses can be stored directly in the repair device. The storage compartment preferably includes multiple cavities so that fuses and bulbs of different voltage ratings and sizes can be stored separated from each other, to permit easy and safe identification of desired replacement components.

The housing also includes a bulb test socket connected to an electrical power source within the portable tool to facilitate bulb testing. A functioning bulb inserted into the socket is illuminated, while non-functioning bulbs are not illuminated. A similar test socket may be provided for fuses, with an indicator light signaling whether a fuse is good or bad.

BRIEF DESCRIPTION OF THE DRAWINGS

The invention may best be understood by reference to the following description taken in conjunction with the accompanying drawings, in which:

FIG. 4a is a top plan view of the tool built into the tip of the device of FIG. 2, for assisting the removal of a failed bulb from a light string;

FIG. 4b is a left end elevation of the tool shown in FIG. 4a;

FIG. 4c is a section taken along line 4c-4c in FIG. 4a;

FIG. 4d is a right end elevation of the tool shown in FIG. 4a;

FIG. 4e is a side elevation of the tool shown in FIG. 4a;

FIG. 7a is a schematic diagram of a simplified version of the circuit of FIG. 5 for detecting failed bulbs;

FIG. 7b is a schematic diagram of a power source and bulb tester for use with the circuit of FIG. 7a;

FIG. 8b is a schematic diagram of a circuit for implementing the block diagram of FIG. 8a;

FIG. 18a is a left side elevation with a partial cutout exposing some of the internal parts of the embodiment shown in FIGS. 15-17;

FIG. 18b is a back elevation of the embodiment shown in FIG. 18a;

FIG. 20a is a right side elevation of the embodiment shown in FIGS. 14-18b, with the storage compartment cover removed;

FIG. 20b is a plan view of the interior surface of the cover removed from the device as shown in FIG. 20a;

FIG. 21 is a side elevation of the battery-containing and switch-actuating element of the embodiment shown in FIGS. 15-18;

FIG. 22a is an exploded right side elevation of the left-hand and upper segments of the body portion of the embodiment shown in FIGS. 14-18b;

FIG. 22b is a side elevation of the trigger element of the embodiment shown in FIGS. 15-18;

FIG. 27 is an enlarged view of the repair device of FIG. 26;

FIG. 29a is a front view of a repair device according to another embodiment of the present invention;

FIG. 29b is a side view of the repair device of FIG. 29a;

FIG. 31a is a front view of a repair device according to another embodiment of the present invention; and FIG. 31b is a side view of the repair device of FIG. 31a.

FIG. 34 is a front view of a sensing device according to another embodiment of the present invention;

DETAILED DESCRIPTION OF THE PREFERRED EMBODIMENTS

Although the invention will be described in connection with certain preferred embodiments, it will be understood that the invention is not limited to those particular embodiments. On the contrary, the invention is intended to include all alternatives, modifications and equivalent arrangements as may be included within the spirit and scope of the invention as defined by the appended claims.

Figure 1:
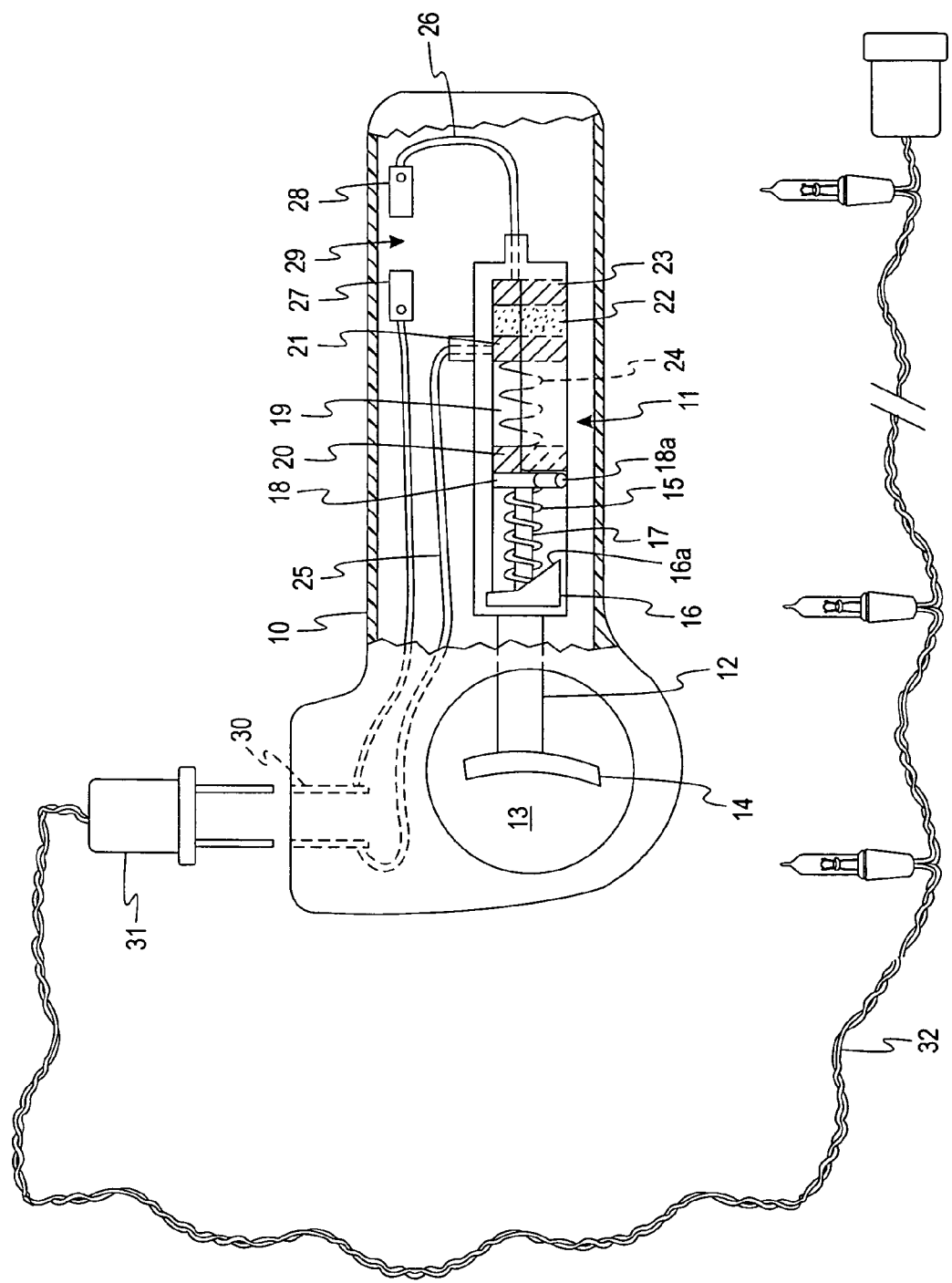
FIG. 1 is a schematic diagram of a string of decorative lights being plugged into a repair device embodying the present invention, with the repair device shown in side elevation with a portion of the housing broken away to show the internal structure, portions of which are also shown in section.

In the illustrative embodiment shown in FIG. 1, a portable, hand-held housing 10 contains a conventional high voltage generator for generating an electrical signal at a greater magnitude than the standard AC power line voltage. In this embodiment, the high voltage generator is a piezoelectric device 11 of the type used in lighters for gas grills, for example. The piezoelectric device 11 is actuated by a rod 12 that extends out of the housing 10 into a finger hole 13 where the rod 12 is attached to a trigger 14. When the trigger 14 is pulled, the rod 12 is retracted and retracts with it the left-hand end of a compression spring 15 and a cam element 16. The compression spring 15 is supported by a stationary rod 17 which telescopes inside the retracting rod 12 while the spring 15 is being compressed against a latch plate 18 at the right-hand end of the spring.

When the spring 15 is fully compressed, an angled camming surface 16a on the cam element 16 engages a pin 18a extending laterally from the latch plate 18, which is free to turn around the axis of the rod 17. The camming surface 16a turns the pin 18a until the pin reaches a longitudinal slot 19, at which point the compression spring 15 is released to rapidly advance a metal striker 20 against a striker cap 21 on one end of a piezoelectric crystal 22. The opposite end of the crystal 22 carries a second metal cap 23, and the force applied to the crystal 22 by the striker 20 produces a rapidly rising output voltage across the two metal caps 21 and 23. When the trigger 14 is released, a light return spring 24 returns the striker 20 and the latch plate 18 to their original positions, which in turn returns the cam element 16, the rod 12 and the trigger 14 to their original positions.

Figure 24:
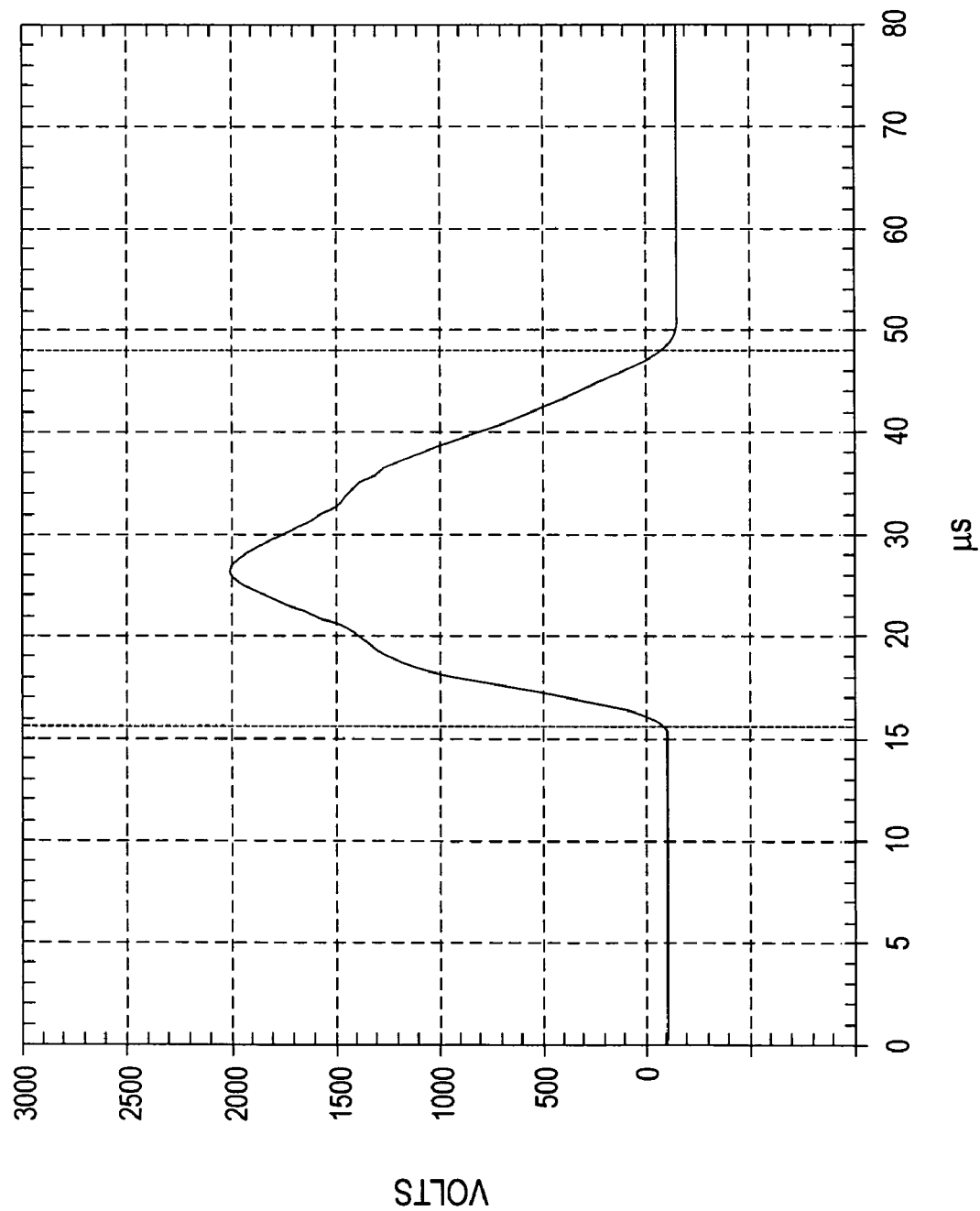
FIGS. 24-25 are the actual shapes of pulses produced by a pulse generating device for use in repair devices embodying the invention.

Although the piezoelectric device is illustrated in FIG. 1 as containing a single crystal 22, it is preferred to use commercially available devices. The striking mechanism in such a device strikes both crystals in tandem, producing an output pulse that is the sum of the pulses produced by both crystals. FIG. 24 illustrates a pulse generated by such a pulse source connected to a 100-bulb light string with the first and last bulbs removed to show the pulse that would be applied to a defective shunt.

The metal caps 21, 23 are connected to a pair of conductors 25 and 26 leading to a socket 30 for receiving a plug 31 on the end of a light string 32. The conductor 26 may be interrupted by a pulse-triggering air gap 29 formed between a pair of electrodes 27 and 28, forming an air gap having a width from about 0.20 to about 0.25 inch. The voltage output from the piezoelectric crystal 22 builds up across the electrodes 27, 28 until the voltage causes an arc across the gap 29. The arcing produces a sharp voltage pulse at the socket 30 connected to the conductor 26, and in the light string 32 plugged into the socket 30. The trigger 14 is typically pulled several times to supply repetitive pulses to the light string.

Substantially the entire voltage of each pulse is applied to any inoperative shunt in a failed bulb in the light string, because the failed shunt in a failed bulb appears as an open circuit in the light string. The light string is then unplugged from the socket 30 and plugged into a standard AC electrical outlet to render conductive a malfunctioning shunt not repaired by the pulses. It has been found that the combination of the high-voltage pulses and the subsequent application of sustained lower-voltage power (e.g., 110 volts) repairs a high percentage of failed bulbs with malfunctioning shunts. When a malfunctioning shunt is fixed, electrical current then flows through the failed bulb containing that shunt, causing all the bulbs in the light string except the failed bulb to become illuminated. The failed bulb can then be easily identified and replaced.

The piezoelectric device 11 may be used without the spark gap 29, in which event the malfunctioning shunt itself acts as a spark gap. As will be described in more detail below, the piezoelectric device may be replaced with a pulse-generating circuit and an electrical power source. Circuitry may also be added to stretch the pulses (from any type of source) before they are applied to the light string so as to increase the time interval during which the high voltage is applied to the malfunctioning shunt.

In cases where a hundred-light set comprises two fifty-light sections connected in parallel with each other, each applied pulse is divided between these two sections and may not have enough potential to activate a malfunctioning shunt in either section. In these cases, an additional and rather simple step is added. First, any bulb from the working section of lights is removed from its base. This extinguishes the lights in the working section and isolates this working section from the one with the bad bulb. Next, the string of series-connected bulbs is plugged into the socket of the repair device, and the trigger-pulling procedure is repeated. The lights are then unplugged from the repair device, the removed bulb is re-installed, and the light set is re-plugged into its usual power source. Since the shunt in the bad bulb is now operative, all the lights except the burned out one(s) will become illuminated.

When a bulb does not illuminate because of a bad connection in the base of the bulb, the pulse from the piezoelectric element will not fix/clear this type of problem. Bad connections in the base and other miscellaneous problems usually account for less than 20% of the overall failures of light strings.

To offer the broadest range of capabilities, a modified embodiment of the present invention, illustrated in FIGS. 2-4d, incorporates both an open-circuit detection system and a bulb tester, thus providing the user a complete light care system. The detection system in the illustrative device of FIGS. 2-4 locates burned-out bulbs in a string that is plugged into a power source. A pair of batteries 40 power a circuit 41 built into a housing 42 and connected to a probe 45 for sensing an AC electrostatic field emanating from the light string. When the probe 45 is moved along the light string, it alters the operation of the circuit 41, which in turn energizes a visual and/or audible signaling device such as a light-emitting diode ("LED") 43 projecting through an aperture in the top wall of the housing 42. Another suitable signaling device is a buzzer that can be energized by the circuit 41 to produce a beeping sound, as will be described in more detail below.

The circuit 41 is activated by a spring-loaded switch 44 that connects the circuit 41 with the batteries 40 when depressed by the user. The batteries 40 remain connected with the circuit 41 only as long as the switch 44 remains depressed, and are disconnected by the opening of the spring-loaded switch 44 as soon as the switch is released.

The circuit 41 includes a conventional oscillator and supplies a continual series of pulses to the LED 43 as long as (1) the circuit remains connected to the batteries, and (2) the probe detects an AC electrostatic field. As the detector is moved along the light string toward the burned-out bulb, the pulses supplied to the LED 43 cause it to flash at regular intervals. The same pulses may cause a buzzer to beep at regular intervals. There is no need for the user to repeatedly press and release the switch to produce multiple pulses as the detector traverses the light string. As the detector passes the burned-out bulb, the open circuit created by that bulb greatly reduces the electrostatic field strength, and thus the LED 43 is extinguished, indicating that the probe is located near the bad bulb.

Figure 4G:
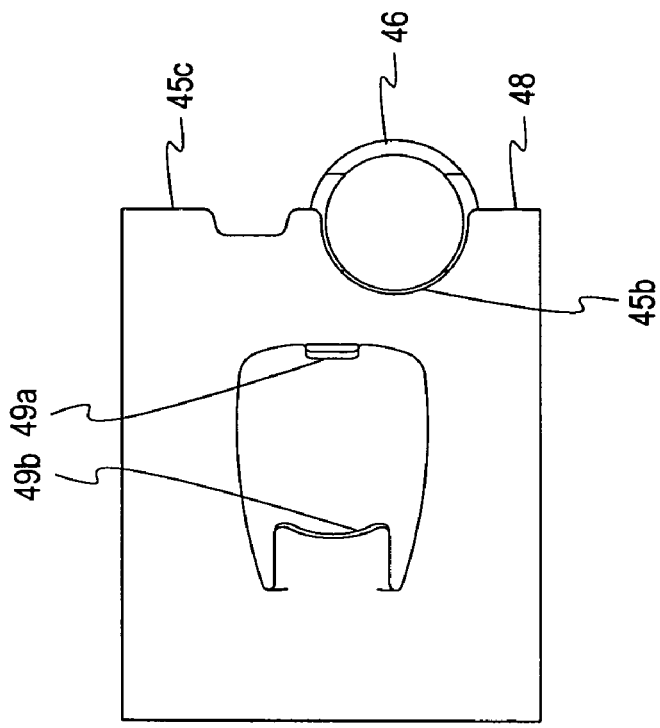
FIG. 4g is a top plan view of the tool shown in FIG. 4a and a light bulb, illustrating the use of the larger arcuate recess to pry the bulb from its socket.
Figure 4F:
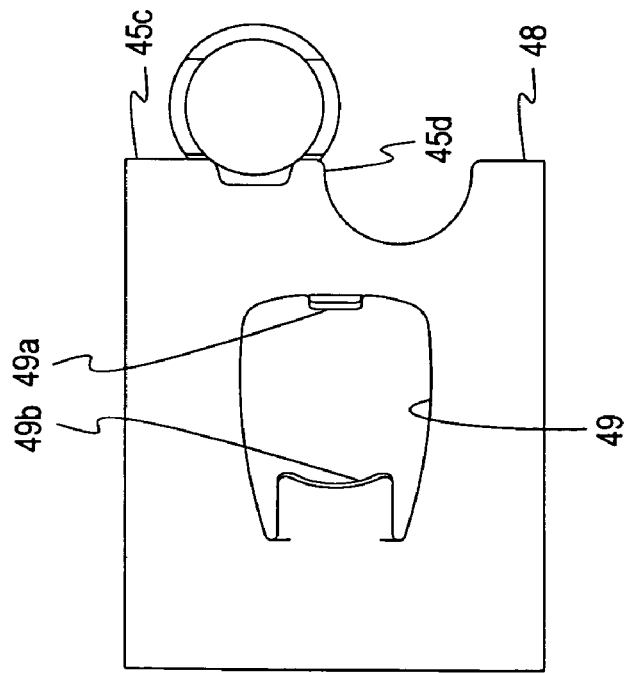
FIG. 4f is a top plan view of the tool shown in FIG. 4a and a light bulb, illustrating the use of the smaller arcuate recess to pry the bulb from its socket.
Figure 4H:
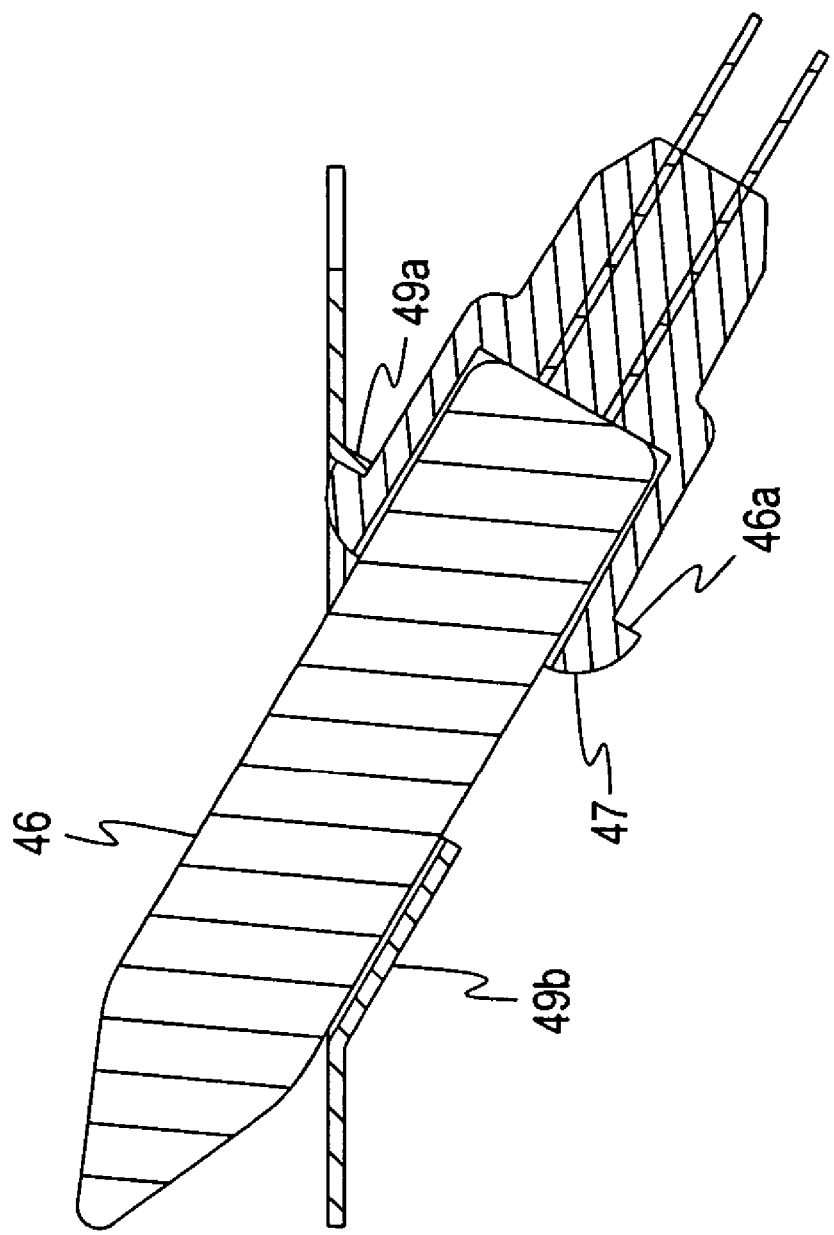
FIG. 4h illustrates a cross-sectional view of the tool shown in FIG. 4a and a light bulb, illustrating the use of the aperture in the tool to remove the light bulb from its socket.

As can be seen in FIGS. 4a-4e, a tool 45 for facilitating removal of a burned-out bulb is mounted on the distal end of the housing 42. In the illustrative embodiment, the tool 45 is in the form of a flat blade having a front edge that forms a pair of arcuate recesses 45a and 45b that mate with the interface between a bulb 46 and its socket 47. The smaller recess 45a is flanked by a pair of tapered surfaces 45c and 45d that can be pressed into the bulb/socket interface to penetrate into that interface, as illustrated in FIG. 4f, and then twisted to pry the bulb out of its socket. After the interface has been opened slightly, the larger recess 45b can be pushed into the interface to open it more widely, as illustrated in FIG. 4g, and then twisted or tilted to remove the bulb from its socket. A tapered tab 48 at one end of the recess 45b can be inserted into the interface and twisted to pry the two parts away from each other. The central portion of the tool 45 forms an opening 49 shaped to permit the bulb 46 to extend through the blade, as illustrated in FIG. 4h, with the wide end of the opening 49 fitting over a flange 46a on the bulb base. A small tab 49a on the wide end of the opening 49 fits under a flange on the bulb base so that when the blade is pulled longitudinally away from the socket 47, the bulb and its base can be pulled out of the socket. The narrow end of the opening 49 is curved out of the plane of the blade to form a cradle 49b shaped to conform to the shape of the adjacent portion of the bulb, to avoid a sharp edge that might break the bulb while it is being extracted from its socket.

Figure 5:
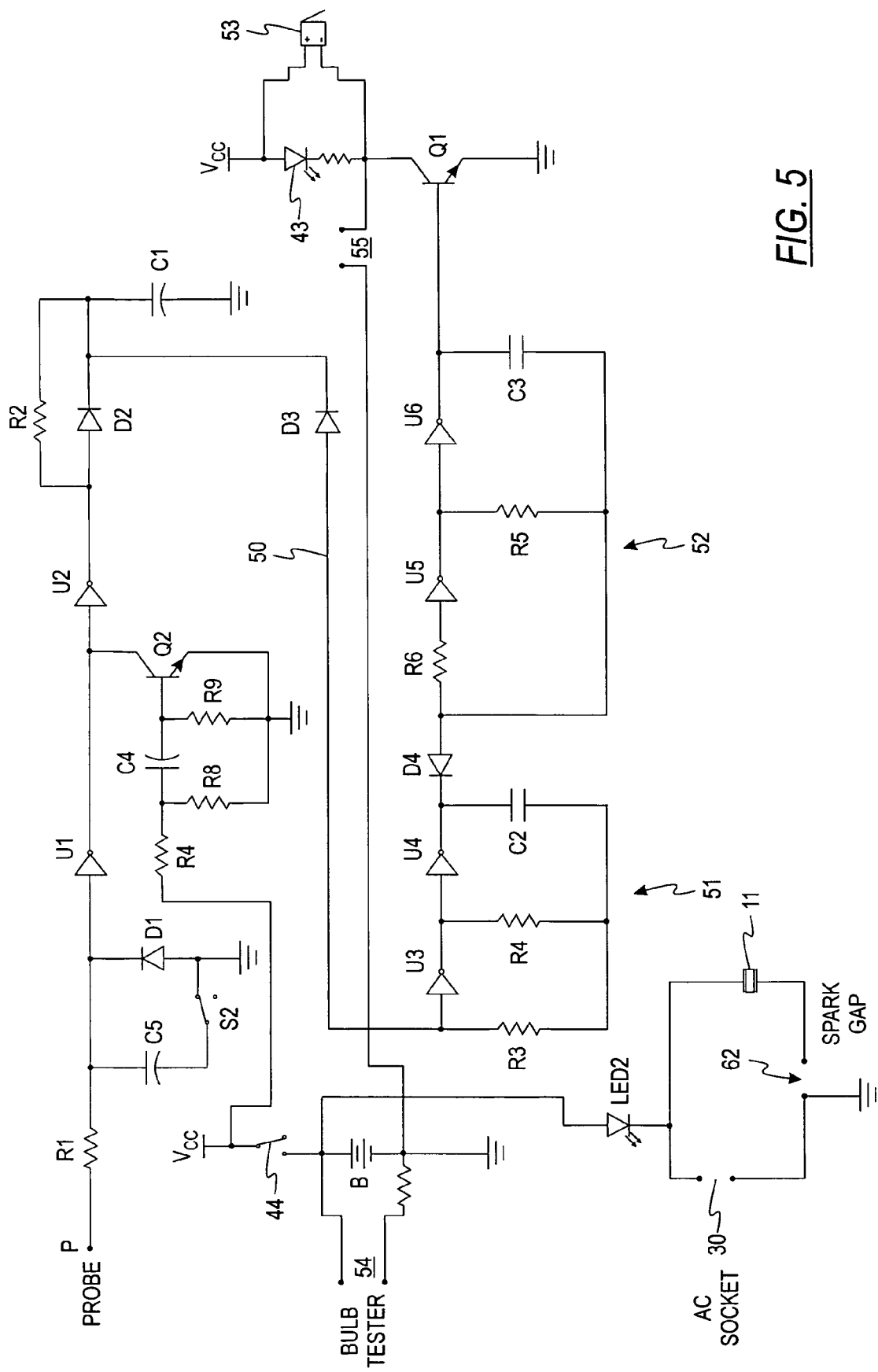
FIG. 5 is schematic circuit diagram of a piezoelectric high-voltage pulse source, dual sensitivity electrostatic field detector, bulb tester, fuse tester and continuity detector for use in the device of FIGS. 1-4.

In a preferred electrostatic field detection circuit illustrated in FIG. 5, the manually operated switch 44 applies power to the circuit when moved to the closed position where it connects a battery B to Vcc. The battery B applies a voltage $V_{cc}$ to the LED 43 which is then illuminated whenever it is connected to ground by a switching transistor Q1. The battery voltage $V_{cc}$ also charges a capacitor C4 through a resistor R4. As the capacitor C4 charges, it turns on a transistor Q2, which pulls low the signal line between a pair of inverters U1 and U2 described below. The transistor Q2 turns off when the capacitor C4 is charged. The momentary low produced during the time the transistor Q2 is on triggers a pair of oscillators also described below, causing the LED 43 to flash to indicate that the circuit is energized, the battery is good, and the circuit is functional.

The probe P of the detector is connected to a resistor R1 providing a high-impedance, which in turn is connected to an HCMOS high-gain inverter U1 and a positive voltage clamp formed by a diode D1. When the probe P is adjacent a conductor connected to an AC power source, the AC electrostatic field surrounding the conductor induces an AC signal in the probe. This signal is typically a sinusoidal 60-Hz signal, which is converted into an amplified square wave by the high-gain inverter U1. This square wave is passed through a second inverter U2, which charges a capacitor C1 through a diode D2 and discharges the capacitor through a resistor R2. The successive charging and discharging of the capacitor C1 produces a sawtooth signal in a line 50 leading to a pair of oscillators 51 and 52 via diode D3.

The signal that passes through the diode D3 triggers the oscillators 51 and 52. The first oscillator 51 is a low-frequency square-wave oscillator that operates at ~10 Hz and is formed by inverters U3 and U4, resistors R3 and R4 and a capacitor C2. The second oscillator 52 is a high-frequency square-wave oscillator that operates at ~2.8 kHz and is formed by inverters U5 and U6, resistors R5 and R6, and a capacitor C3. Both oscillators are conventional free-running oscillators, and the output of the low-frequency oscillator 51 controls the on-time of the high-frequency oscillator 52. The modulated output of the high-frequency oscillator 52 drives the transistor Q1, turning the transistor on and off at the 25-Hz rate to produce visible blinking of the LED 43. The high-frequency (2.8 kHz) component of the oscillator output also drives a buzzer 53 connected in parallel with the LED 43, so that the buzzer produces a beeping sound that can be heard by the user.

To locate a failed bulb, the switch 44 is held in the closed position while the probe is moved along the length of the light string, keeping the probe within one inch or less from the light string (the sensitivity increases as the probe is moved closer to the light string). The LED 43 flashes repetitively and the buzzer 53 beeps until the probe moves past the failed bulb, and then the LED 43 and the buzzer 53 are de-energized as the probe passes the failed bulb, thereby indicating to the user that this is the location of the bulb to be replaced. Alternatively, the LED 43 and the buzzer 53 will remain de-energized until the probe reaches the failed bulb and then become energized as the probe passes the failed bulb or other discontinuity in the light string, again indicating the location of the defect.

This detection system is not sensitive to the polarization of the energization of the light string while it is being scanned. Regardless of the polarization, both the LED 43 and the buzzer 53 change, either from activated to deactivated or from deactivated to activated, as the probe P moves past a failed bulb. Specifically, when the probe P approaches the failed bulb along the "hot" wire leading to that bulb, the LED 43 flashes and the buzzer 53 beeps until the probe P reaches the bad bulb, at which time the LED 43 is extinguished and the buzzer 53 is silenced. When the probe P approaches the failed bulb along the neutral wire, the LED 43 remains extinguished and the buzzer 53 remains silent until the probe P is adjacent the bad bulb, at which time the LED 43 begins to flash and the buzzer 53 begins to beep. Thus, in either case there is a clear change in the status of both the LED 43 and the buzzer 53 to indicate to the user the location of the bad bulb.

Another advantage of this detection system is that the automatic continuous pulsing of the LED 43 and the buzzer 53 provides both visual and audible feedback signals to the user that enable the user to judge the optimum distance between the detector and the light string being scanned. The user can move the detector toward and away from the light string while observing the LED 43 and listening to the buzzer to determine the distance at which the visual and audible signals repeat consistently at regular intervals.

To permit the sensitivity of the detector circuit to be reduced, a switch S2 permits a capacitor C5 to be connected to ground from a point between the resistor R1 and the inverter U1. This sensitivity adjustment is desirable because in the presence of a strong electrostatic field from a nearby light string, the LED 43 may continue to flash and give false readings.

Figure 2:
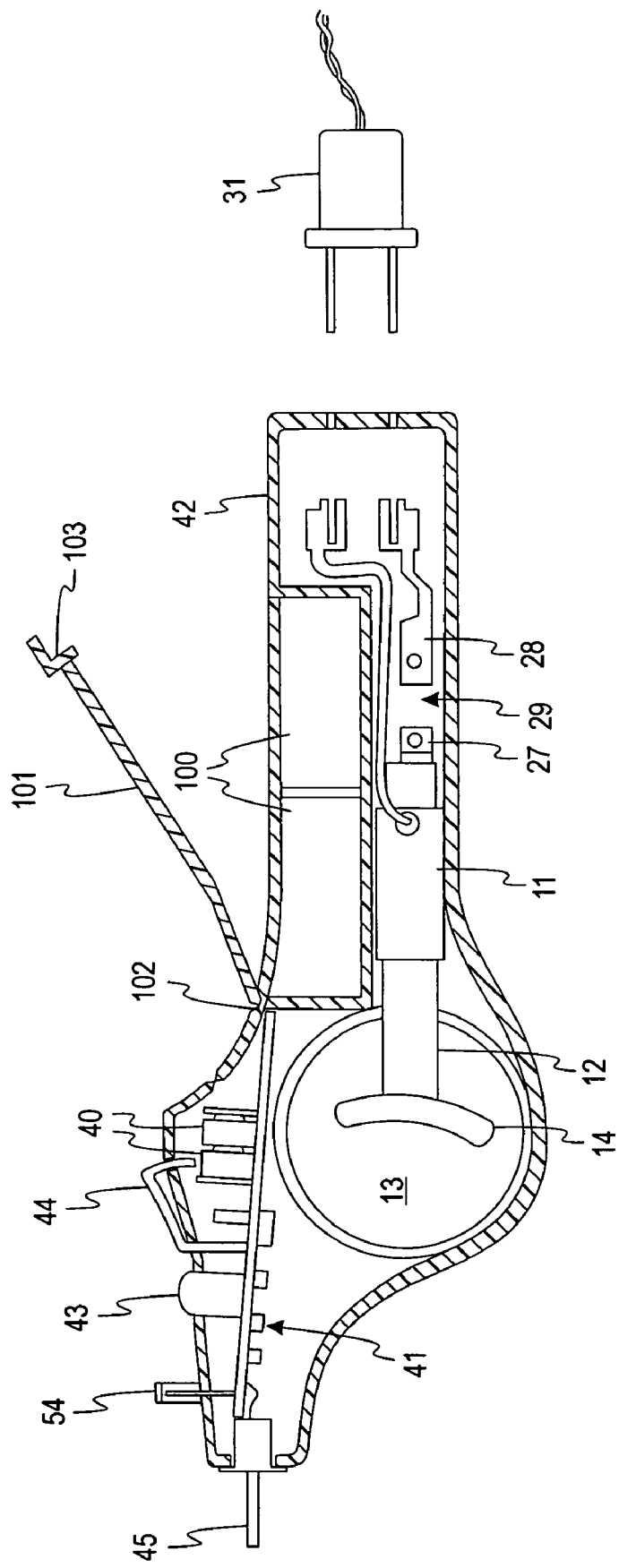
FIG. 2 is a cross-sectional side view of a modified repair device embodying the invention.
Figure 3:
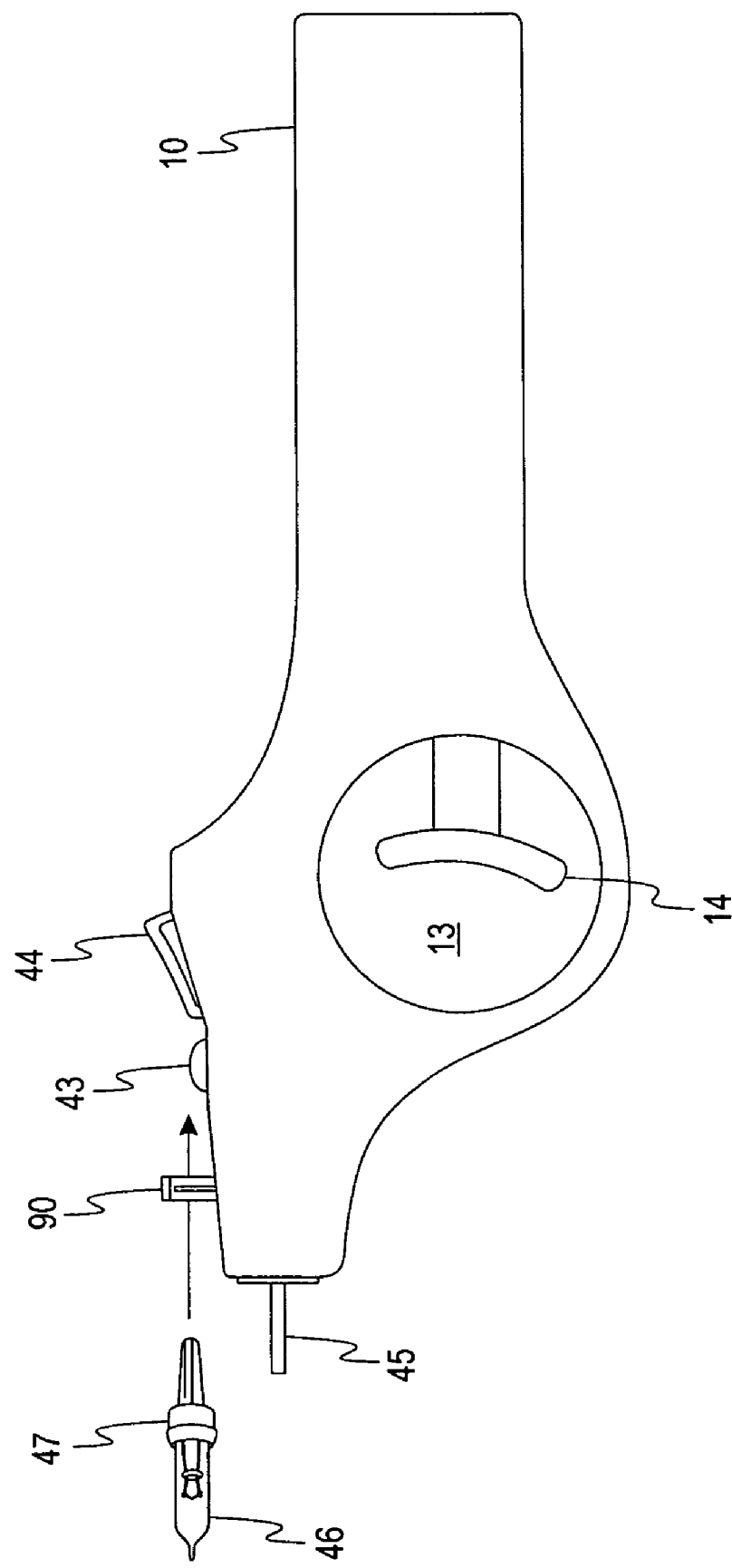
FIG. 3 is a full side elevation of the device of FIG. 2, and illustrating a bulb being tested.

To permit the testing of bulbs with the same device that is used to detect burned-out bulbs, a bulb-testing loop 54 (FIGS. 2 and 3) is formed as an integral part of the housing 10. The inside surface of the loop 54 contains a pair of electrical contacts connected to the same battery B (FIG. 5) that powers the detection circuit, to supply power to the bulb being tested. These contacts are positioned to contact the exposed folded ends of the filament leads on opposite sides of the bulb base when the bulb base is inserted into the loop. The loop 54 may be designed to accommodate the latest commercial miniature bulbs that include a long tab on the bottom of the bulb base to maintain creepage/clearance distances and push snow and dirt out of the socket when it is installed as specified in UL 588, Christmas-Tree and Decorative-Lighting Outfits, Sixteenth Edition. As seen in FIGS. 2 and 3, the loop 54 is preferably placed on the top of the housing 10, although the location is not determinative of its function.

In operation, a bulb base is inserted into the loop 54 from the lower end of the bulb base, and the tapered neck of the base extends all the way through the loop 54. The thickened section of the base limits the insertion of the bulb. At this point, the filament leads exposed on the base of the bulb engage the electrical contacts on the inside surface of the loop 54. Since the contacts have a battery voltage across them, the bulb will illuminate if it is good. If the bulb fails to illuminate, the user can conclude that the bulb is no longer functional.

For the convenience of the user, the housing 10 further includes an integrated storage compartment 100 (see FIG. 2) for storage of spare parts such as bulbs and/or fuses. This storage compartment 100 can be molded into the housing 10. The cover 101 of the storage compartment 100 may be made with an integrally molded living hinge 102 and an integral latch 103. An example of an alternate construction would be a sliding cover, instead of a hinged cover, over the compartment holding the spare parts. The storage compartment is preferably divided into multiple cavities, as can be seen in FIG. 2, to permit different components to be separated from each other to facilitate retrieval of desired components.

A fuse-testing socket 55 may also be provided to permit the testing of fuses as well as bulbs. In the illustrative circuit of FIG. 5, the fuse-testing socket is connected in series with the LED 43 and the battery B, so that insertion of a good fuse into the socket 55 illuminates the LED 43 as a good-fuse indicator, while a defective fuse does not illuminate the LED 43.

The detection circuit of FIG. 5 also includes a continuity indicator to provide the user with a visible indication when a bulb shunt has been fixed by pulses from the piezoelectric device 11. Thus, a second light-emitting diode LED2 (typically a green LED) is connected from the positive side of the battery B to one side of the socket 30 to which the light string is connected. The piezoelectric device 11 is connected across the socket 30 that receives the plug of the light string. It can be seen that the switch 44 isolates the piezoelectric circuit from the detection circuit so that the detection circuit is protected from the high-voltage pulses that are generated to repair a malfunctioning shunt. When a malfunctioning shunt in the light string is repaired, current flows from the battery B through LED2 and the light string to ground, thereby illuminating LED2 to indicate to the user that the shunt has been fixed and continuity restored in the light string.

When LED2 illuminates, indicating that the shunt has been fixed, the light string is then unplugged from the socket 30 and plugged into a standard AC outlet. All the bulbs in the light string will now illuminate, with the exception of the failed bulb, which can be quickly detected and replaced. If desired, the removed bulb can be tested in the loop 54 before it is replaced, to confirm that the failed bulb has been properly identified.

When the LED2 does not illuminate after the trigger 14 has been pulled several times, the user still unplugs the light string from the socket 30 and plugs it into an AC outlet. As described above, this additional, sustained AC power may render operative a shunt not rendered operative by the high-voltage pulses. In either event, the detector may be used to locate the failed bulb if the shunt does not become operative.

The high-voltage pulses used to fix a malfunctioning shunt in a failed bulb may be generated by means other than the piezoelectric source described above. For example, the DC output of a battery may be converted to an AC signal that is passed through a step-up transformer to increase the voltage level, rectified and then used to charge a capacitor that discharges across a spark gap when it has accumulated a charge of the requisite magnitude. The charging and discharging of the capacitor continues as long as the AC signal continues to be supplied to the transformer. The resulting voltage pulses are applied to a light string containing a failed bulb with a malfunctioning shunt, as described above.

Figure 6A:
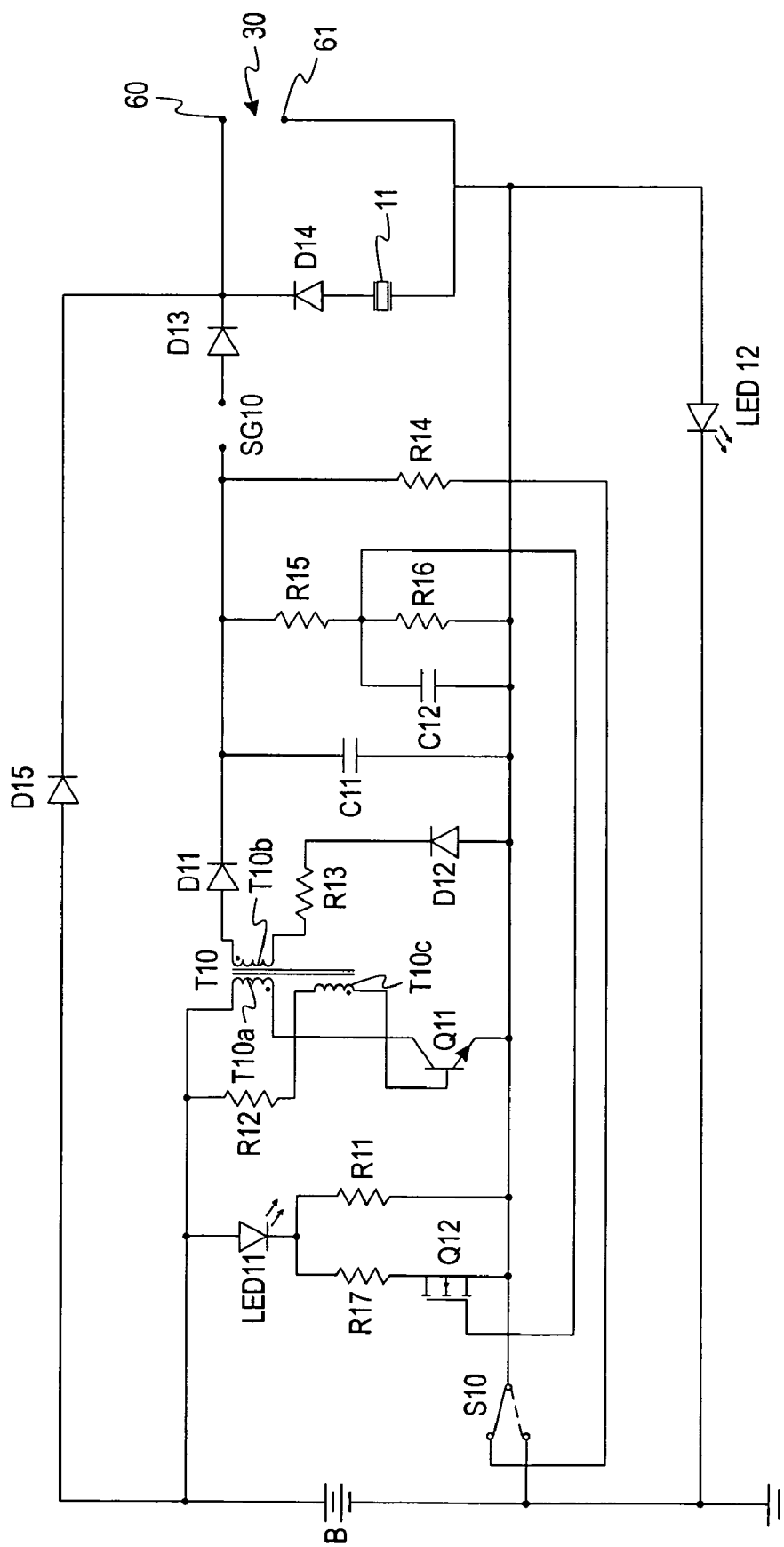
FIG. 6a is a schematic diagram of a battery-powered circuit for generating high-voltage pulses in the device of FIGS. 1-4.

FIG. 6a illustrates a battery-powered circuit for generating high-voltage pulses that may be used independently of, or in combination with, the piezoelectric device 11. The illustrative circuit includes the piezoelectric pulse generator 11 described above, for producing high-voltage pulses across a failed bulb in a light string connected across terminals 60 and 61 in the socket 30. A diode D14 isolates the piezoelectric device 11 from the rest of the circuit, which forms a second high-voltage pulse source powered by a battery B. The spark gap 62 that develops the threshold voltage for the pulse from the piezoelectric device 11 is located between the terminal 61 and the device 11.

Before describing the pulse-generating circuit in FIG. 6a, the overall sequence of operations for troubleshooting an extinguished light string will be described. The battery-powered pulse is produced by simply pressing a switch and holding it down until an LED11 glows brightly, indicating that a capacitor has been fully charged. A pulse from the piezoelectric device 11 is produced by pulling the trigger 14 (shown in FIG. 1) one or more times. If either type of pulse fixes a malfunctioning shunt in a failed bulb, a LED12 is illuminated. If either type of pulse by itself does not fix a malfunctioning shunt, the two pulses can be generated concurrently, which will fix certain shunts that cannot be fixed by either pulse alone.

In general, there are four types of bulbs encountered in actual practice. First, there are bulbs in which the shunt will be fixed by either type of pulse by itself, and thus either the battery-powered pulse or the piezoelectric pulse may be used for this purpose. Second, there are bulbs in which the shunt can be fixed only with the higher-energy pulse produced by concurrent generation of both the battery-powered pulse and the piezoelectric pulse. Third, there are bulbs in which the shunt cannot be fixed, but the failed bulb will glow when the battery-powered circuit constantly applies a high voltage to the bulb; the switch is held down until the glowing bulb is visually detected. Fourth, there are bulbs that will not glow, but will blink or flash in response to the higher-energy pulse produced by concurrent generation of both the battery-powered pulse and the piezoelectric pulse; this pulse can be repeated until the defective bulb is detected by visually observing its flash.

Returning now to FIG. 6a, when the pulse from the piezoelectric device 11 fixes the malfunctioning shunt, a light-emitting diode LED12 is illuminated by current flowing from the battery B through a diode D15, the light string connected to terminals 60 and 61, and the LED12 to ground. The diode D15 protects the remaining circuitry from the high-voltage pulses produced by the piezoelectric device 11. If the shunt is still not conductive after being pulsed by the piezoelectric device 11, current does not flow through the light string and thus the LED12 remains extinguished. Thus, LED12 acts as a continuity indicator to provide the user with a visible indication of whether the malfunctioning shunt in the light string has been fixed.

The balance of the circuit shown in FIG. 6a generates the battery-powered, high-voltage pulse. A switch S10 is pressed to connect the battery (or batteries) B to a conventional ringing choke converter or blocking oscillator operating at a relatively low frequency, e.g., 6.5 kHz, under nominal load. The oscillator converts the 3-volt d-c. output of the battery B to an AC signal that is supplied to the primary winding T10a of a step-up transformer T10. The stepped-up voltage from the secondary winding T10b, which may be hundreds or even thousands of volts AC, is rectified by a pair of diodes D11 and D12 and then stored in a capacitor C11, charging the capacitor C11 to greater than 500 volts. The stored energy is: ½ $CV^2$ where C=0.33 uF and V=500 V–0.04125 joules.

As it may take several seconds for the capacitor C11 to fully charge, the light-emitting diode LED11 indicates when the proper charge has been established. As the voltage on C11 reaches its maximum value, a voltage divider formed by a pair of resistors R15 and R16 starts to bias "on" an N-channel MOSFET Q12. (The resistors R15 and R16 also provide a leakage path for the capacitor C11.) The LED11 increases in brightness as the Vg-s threshold of Q12 is reached and continues to become brighter as the Vg-s increases. A capacitor C12 is charged through the resistor R15 and provides a time delay to insure a full charge on the capacitor C11. Q12 and a resistor R17 are in parallel with the resistor R11 and thus lower the total resistance when Q12 conducts, thereby increasing the current through LED11 to make it glow brighter. The resistor R17 serves as a current-limiting resistor while Q12 is conducting. When the output of the LED11 reaches constant brightness, the output voltage is at its maximum.

When the charge on the capacitor C11 builds up to a threshold level, e.g., 500 volts, it reaches the firing voltage of a gas-filled, ceramic spark gap SG10, thereby applying the voltage to the failed bulb in the light string producing a partial breakdown of the dielectric material in the malfunctioning shunt and reducing the intensity of LED11.

If the LED12 is not illuminated, the switch S10 is held in the depressed position, which causes the charging and discharging cycle to repeat. This is continued for as long as S10 is depressed. If LED12 is still not illuminated, the user pulls the trigger 14 shown in FIG. 1 the next time the LED11 reaches maximum brightness. This produces the concurrent pulses from both the piezoelectric device 11 and the battery-powered circuit. When the device is turned off, any remaining charge on the capacitor C11 is discharged through a resistor R14.

The high-voltage pulse from the piezoelectric device produces an arc across the dielectric material in the defective shunt causing current to flow. The energy stored in C11 then causes the shunt to be permanently repaired, this would then illuminate LED12. If LED12 is not illuminated, the trigger 14 shown in FIG. 1 may be pulled several more times to produce additional pulses. If LED12 is still not illuminated, the user may proceed to the detection modes to attempt to identify the failed bulb or other defect, so that the bulb can be replaced or the other defect repaired.

A first detection mode causes a failed bulb to glow by supplying the light string with the pulse from only the battery-powered circuit, independently of the piezoelectric device 11, by again depressing the switch S10. Again the pulse-triggering device breaks down when the voltage builds up to a threshold level, and then a high voltage will be continually applied to the failed bulb or other discontinuity as long as the switch is held down. This causes a failed bulb of the third type described above to glow, so that it can be visually identified and replaced.

A second detection mode causes a failed bulb to flash by generating concurrent pulses from the piezoelectric device 11 and the battery-powered circuit. As described previously, this combined pulse is produced by pressing switch S10 until LED11 illuminates, and then pulling the trigger 14 shown in FIG. 1 to activate the device 11. This causes a failed bulb of the fourth type described above to flash, so that it can be visually identified and replaced.

The circuit of FIG. 6a permits the user to quickly locate and replace a failed bulb without attempting to fix the shunt associated with that bulb, or the user can first attempt to fix a malfunctioning shunt with high-voltage pulses from either or both of two different sources. If the user does not see a bulb glow or flash the first time a pulse is generated, the pulses may be repeated until a glow or flash is detected.

If desired, the output voltage of the battery-powered circuit can be increased by increasing the turns ratio between the secondary and primary windings of the step-up transformer T10. Also, the circuit parameters may be selected so that the gas-filled spark gap or other triggering device does not break down until the piezoelectric device 11 is also triggered.

Figure 6B:
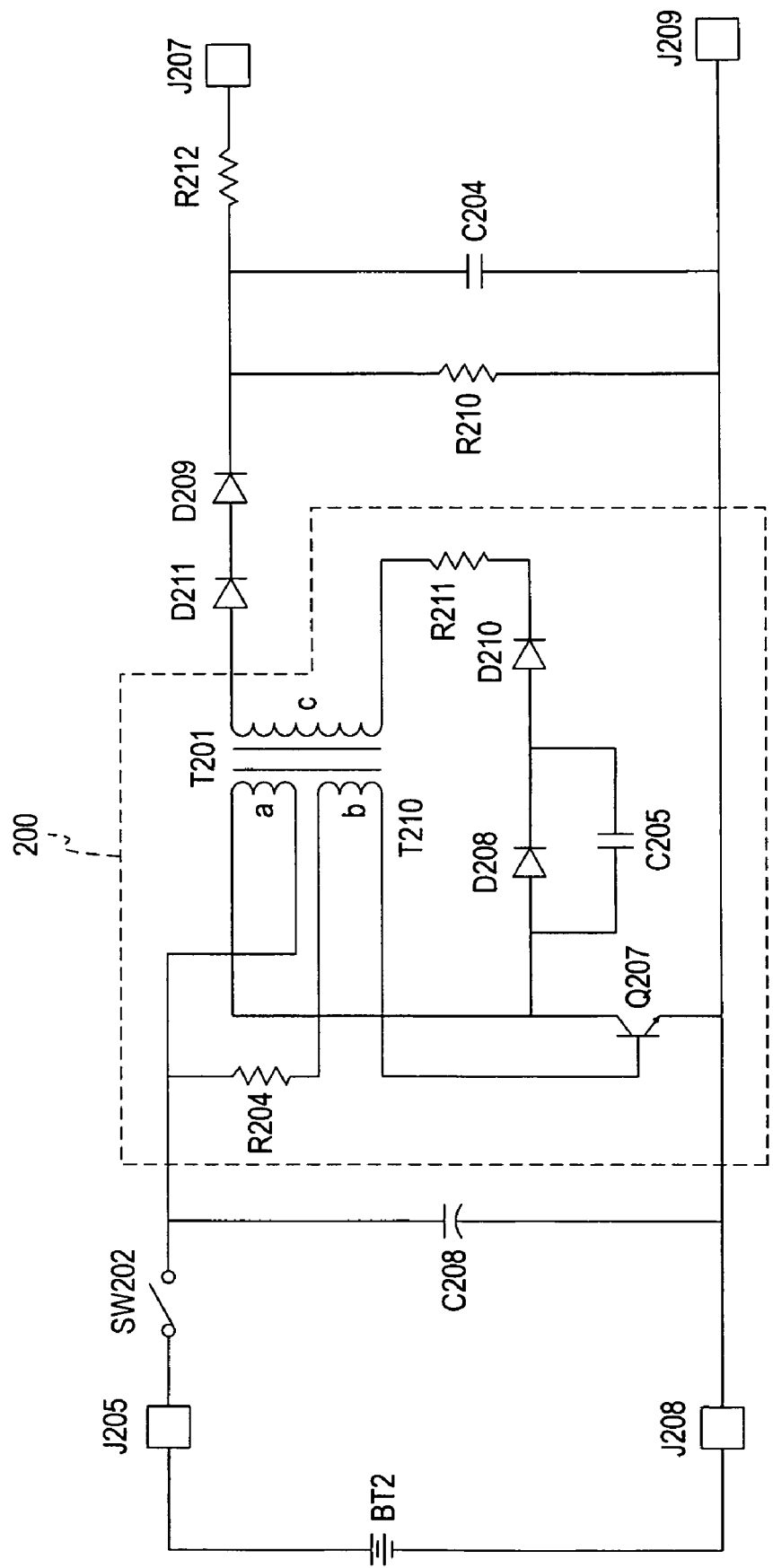
FIG. 6b is a schematic diagram of another battery-powered circuit for generating high-voltage pulses in the device of FIGS. 1-4.
Figure 25:
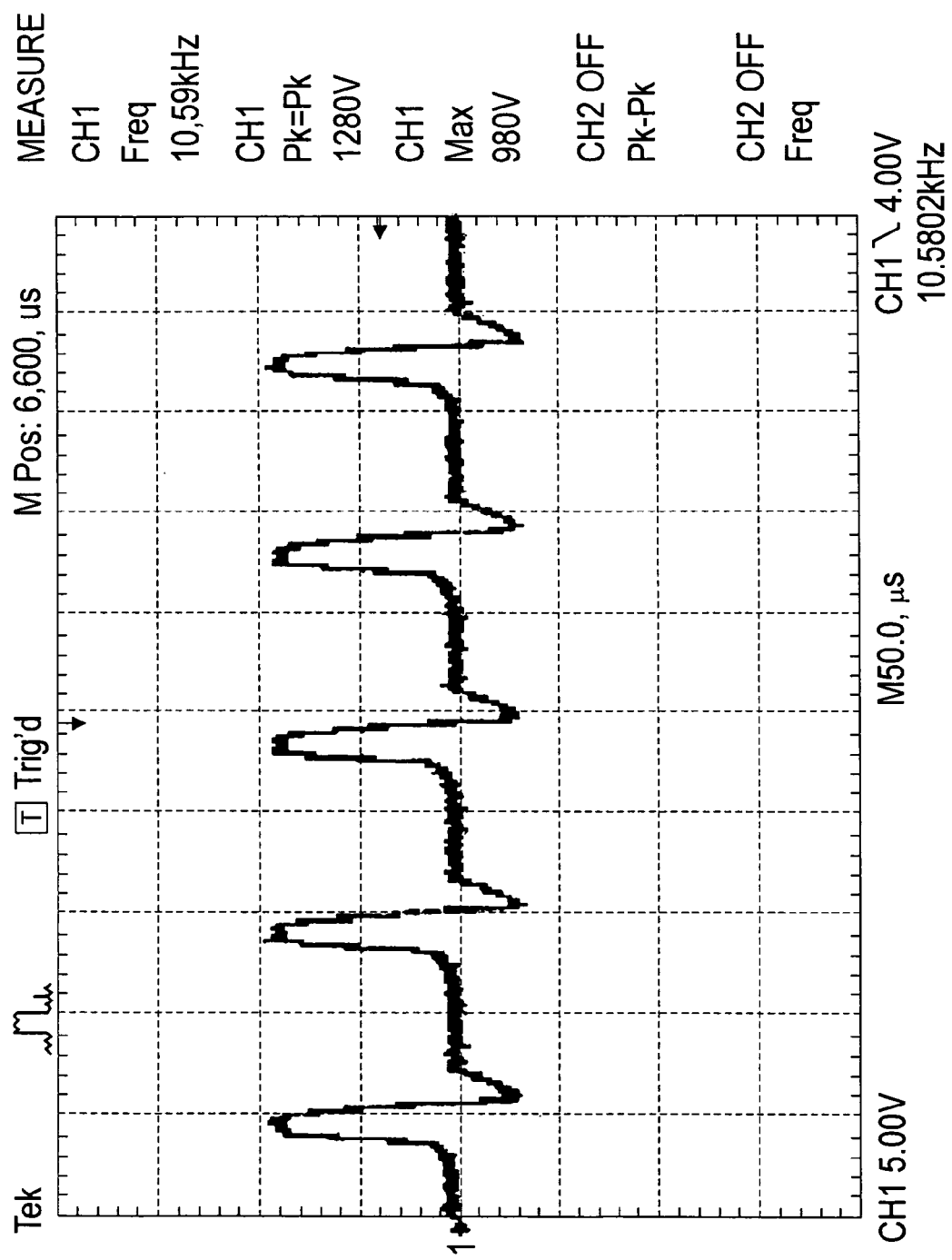

Referring now to FIG. 6b, an alternative circuit for fixing failed shunts includes a battery BT2 that supplies DC power to a blocking oscillator 200 to generate a high-voltage AC signal that is rectified by a pair of diodes D211 and D209 and charges a capacitor C204. A high-impedance resistor R210 acts as a safety bleeder across the capacitor C204. A current-limiting resistor R212 connects the stepped-up, rectified signal with an output terminal J207, and a second output terminal J209 is connected to circuit ground. The light string is connected to the terminals J207 and J208 for repair. FIG. 25 illustrates a series of pulses produced by the oscillator alone connected to a 100-bulb light string with the first and last bulbs removed.

Operation of the oscillator circuit 200 is initiated by closing a switch SW202 which supplies power across a capacitor C208 to the primary winding T201a of a high frequency step-up transformer T201, and to an auxiliary winding T201b through a current-limiting resistor R204. A transistor Q207 has its collector and base connected to the primary windings T201a and T201b, respectively. The circuit 200 operates as a blocking oscillator producing a flyback effect in T201, thus producing a stepped-up AC signal in the secondary winding of T201. A feedback circuit is applied to the collector of Q207 from the secondary winding of T201 through a current-limiting resistor R211 and a rectifier diode D210, which also turns on a LED208 when the circuit 200 is operative. A capacitor C205 across the LED208 protects and reduces the peak energy applied to the LED.

Figure 6C:
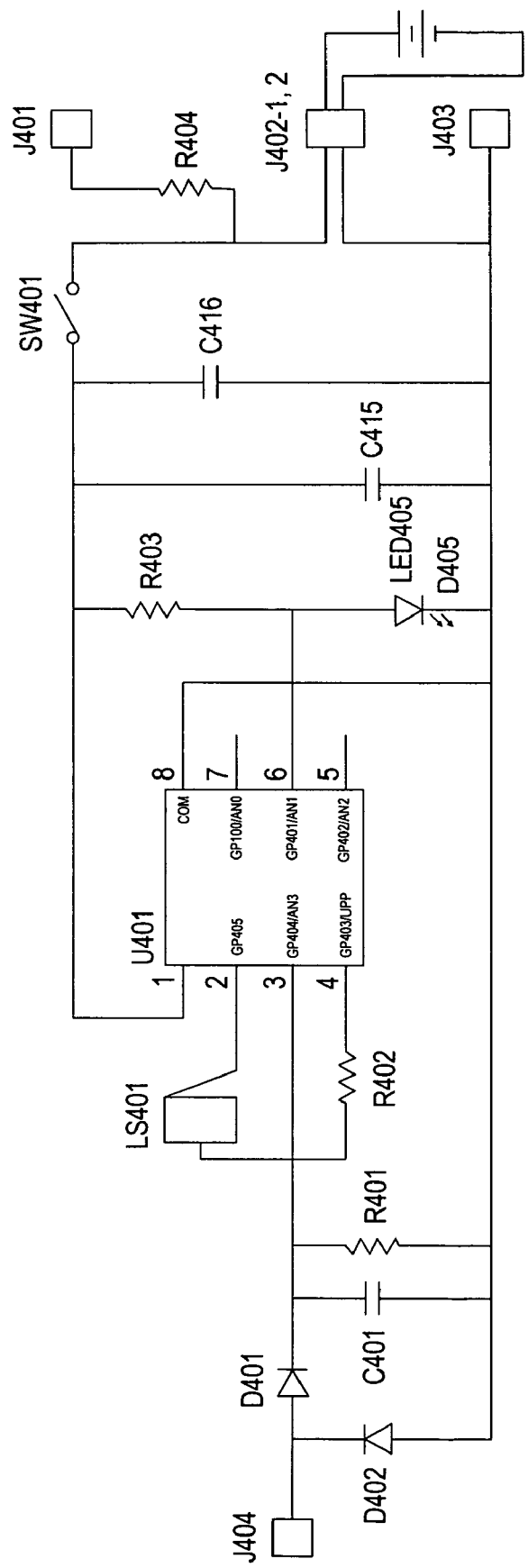
FIG. 6c is a schematic diagram of another electronic circuit for identifying the location of a failed bulb in a light string.

Referring now to FIG. 6c, a schematic diagram of an electronic circuit for identifying the location of a failed bulb in a light string is illustrated. A battery is connected so that the positive terminal of the battery is connected to pin 1 of a terminal J402 and the negative battery terminal is connected to pin 2 of the terminal J402. The connected battery applies power to the circuit when a single pole switch SW401 is closed. A CMOS microcontroller U401, a device such as a PIC12F675 available from Microchip Technology, is used to perform electrostatic charge detection and also to control an LED indicator LED405. The LED405 is powered on through a resistor R403. The voltage developed across the LED is used as a precision low voltage reference by the analog to digital converter section in the microcontroller. The microcontroller U401 controls a beeper or buzzer LS401 in a programmable fashion.

An electrostatic probe circuit is formed by an antenna at terminal J404. The terminal J404 is connected to a voltage doubling circuit formed by switching diodes D401, D402. The switching diodes D401, D402 charge a capacitor C401 which is slowly discharged by a high-impedance resistor R401. A filter time constant is set by R401 and C401. The capacitor C401 provides stable and reliable operation over a fixed range of distances between the probe and the wires of the light string.

When the antenna/probe at terminal J404 is adjacent a conductor connected to an AC power source, the AC electrostatic field surrounding the conductor induces an AC signal in the probe. The microcontroller U401 monitors the probe voltage with the built-in A/D converter. The AC signal in the probe is sampled hundreds of times a second and is averaged to obtain a solid count value. As the operator moves the probe along the light string there are perturbations caused by twists in the light string and light bulbs sticking out. These perturbations can be averaged out and not cause a false detection by using a long time constant. Once a definite change is detected, the averaged value slowly settles into a new value and the beeper is shut off. Then the operator can reverse motion and move at a slower rate and find the transition point where the beeper sounds again. At this point the burnt out bulb in question is detected.

A pair of bulb testing contacts J401, J403 and a current-limiting resistor R404 are also shown. A bulb is tested by making contact with the wire leads of the bulb base and contacts J401 and J403.

Figure 6D:
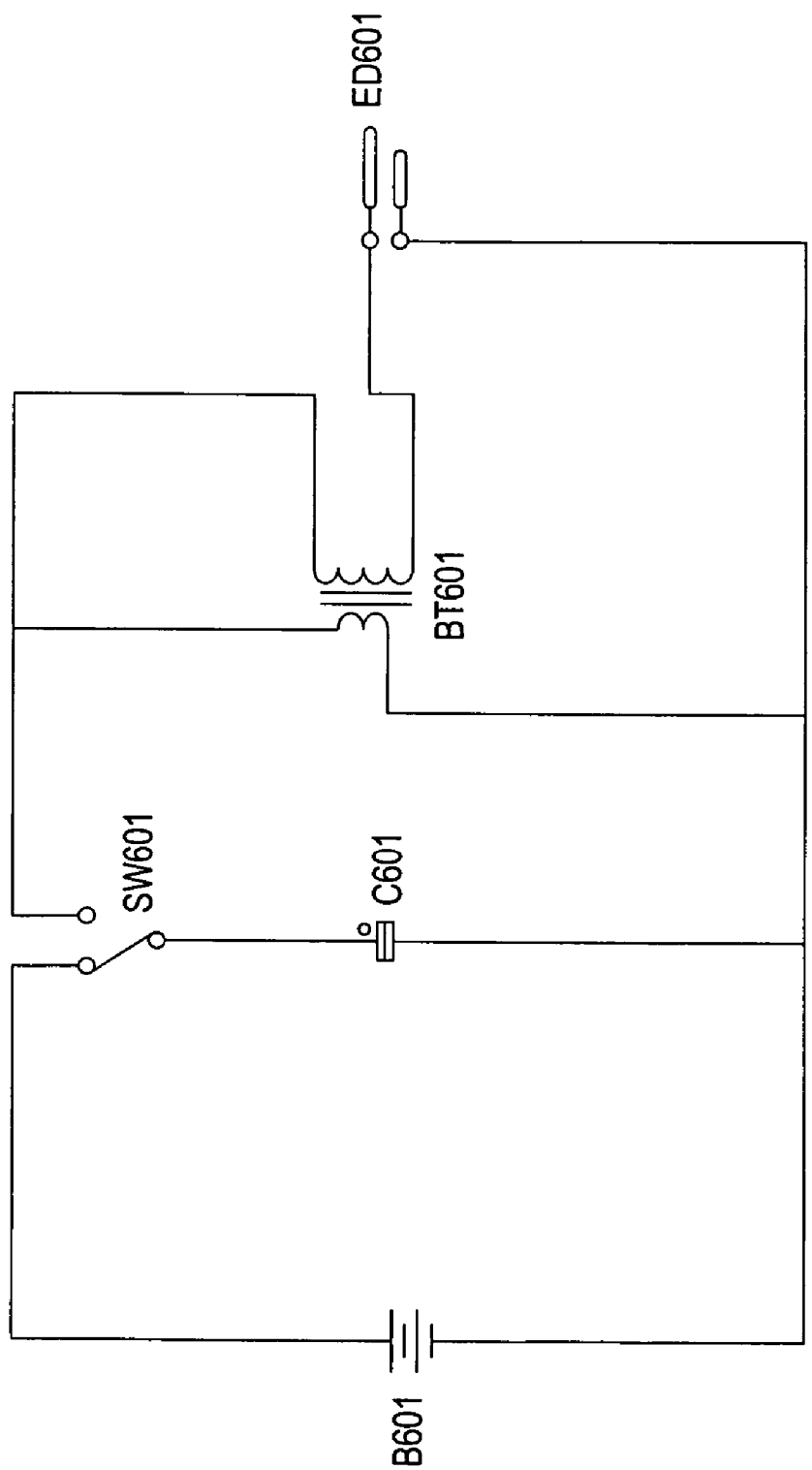
FIG. 6d is a schematic diagram of another battery-powered circuit for generating high-voltage pulses in the device of FIGS. 1-4.

Referring now to FIG. 6d a repair device circuit for fixing malfunctioning shunts in decorative Christmas light strings is illustrated. A switch SW601, when in the "off" position, charges a capacitor C601. When the switch SW601 is in the "on" position, a battery B601 is disconnected from a capacitor C601 and the capacitor C601 discharges through a voltage boosting coil BT601. In some embodiments, the switch SW601 may be of the momentary "on" variety. The secondary winding of the voltage boosting coil BT601 is connected to electric discharge pins ED601 which could be inserted into a lamp base or connected to the light string's standard two prong electrical plug. By using the two position switch SW601, the battery B601 is not subject to back EMF from the high-voltage discharge circuit when activated.

Figure 6E:
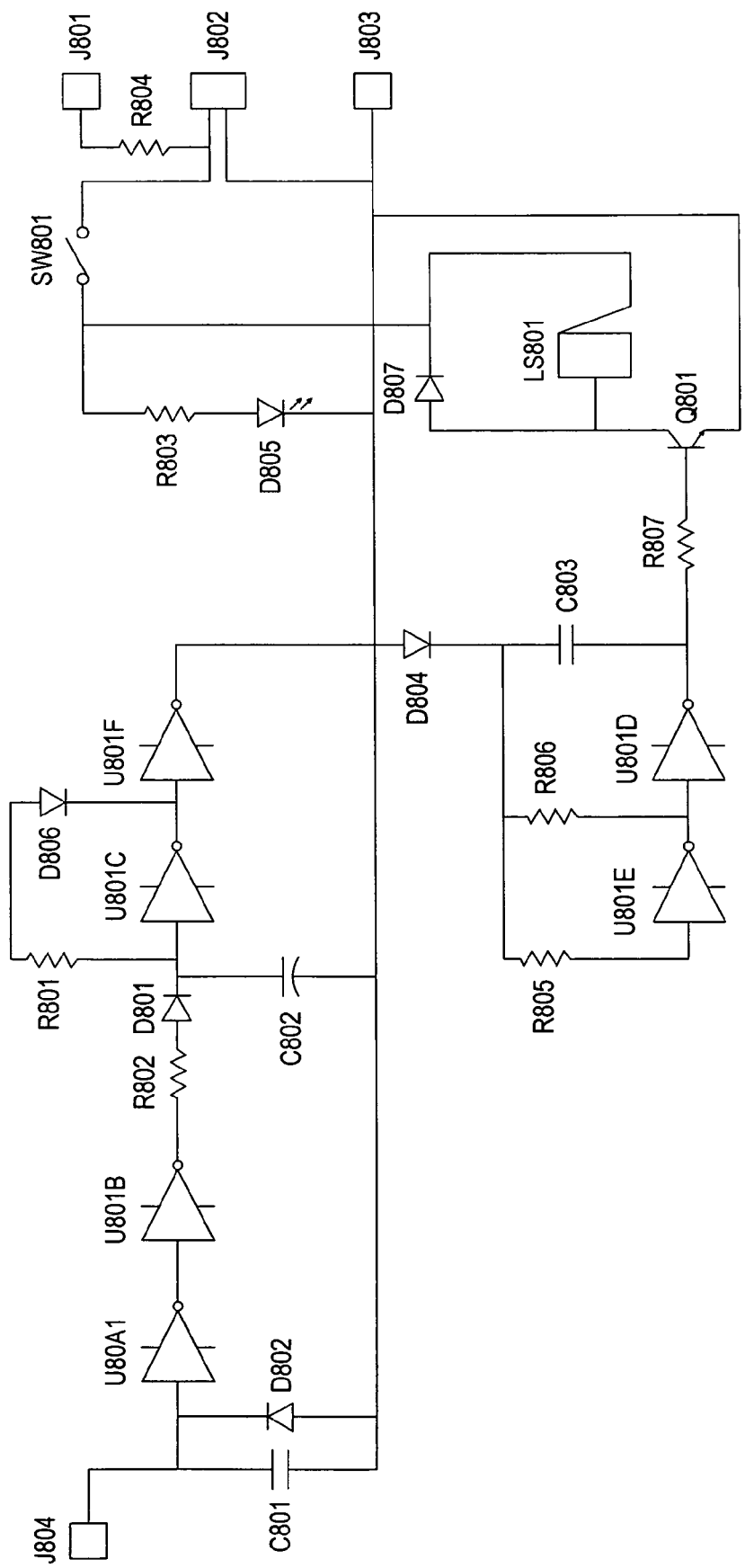
FIG. 6e is a schematic diagram of another electronic circuit of identifying the location of a failed bulb in a light string.

Referring now to FIG. 6e, a novel electrostatic field detection circuit is illustrated. The circuit is powered by three 1.5 volt batteries at terminal J802 through a SPST switch SW801, a current-limiting resistor R803 and an LED D805 which is illuminated when the circuit is powered. A bulb testing interface is provided across terminals J801 and J803 in series with a resistor R804.

A small, 1-2 inch wire antenna is connected to terminal J804. A conductor carrying AC current such as in a string of decorative Christmas tree lamps, creates an electrostatic field. When the antenna, at terminal J804, is within one to two inches of the conductor, the diode D802 clamps the voltage inducted by the antenna to −0.6 volts which is fed to a hex inverter U801A. In this embodiment, a monolithic integrated circuit device, the HCF4069UB, manufactured by STMicroelectronics is illustrated. The HCF4069UB consists of six, independent COS/MOS inverter circuits, all of which are used in the illustrative circuit, U801A-U801F. Creating the pseudo capacitor C801 is as simple as bending a small wire close to the ground plane of the circuit board. When the input signal rises, from the detection of an offset sinusoidal of an electrostatic field to the trip voltage of the inverter U801A, the inverter U801A produces a pulse which is amplified again by the inverter U801B. The resistor R802 current limits the charging current to capacitor C802. As the charge at a capacitor C802 rises, the threshold of the inverter U801C is exceeded. This, in conjunction with a resistor R801 and a diode D806, results in a relaxation oscillator. The input to diode D804 goes high based on the discharge of the capacitor C802.

The remaining inverters U801E and U801D, resistors R805, R806 and capacitor C803 form an oscillator which oscillates at about 3 KHz when enabled by a diode D804. This frequency was chosen to optimize the use of a buzzer LS801. Other buzzers or signal devices may function better with different oscillator frequencies. The output of the oscillator is current limited by a resistor R807 which drives the base of a transistor Q801. The transistor Q801 drives the buzzer LS801 at an audible 3 KHz. A diode D807 placed across the buzzer LS801 catches the interference spikes from the buzzer LS801 and prevents the interference spikes from being conducted through the circuit.

Figure 6F:
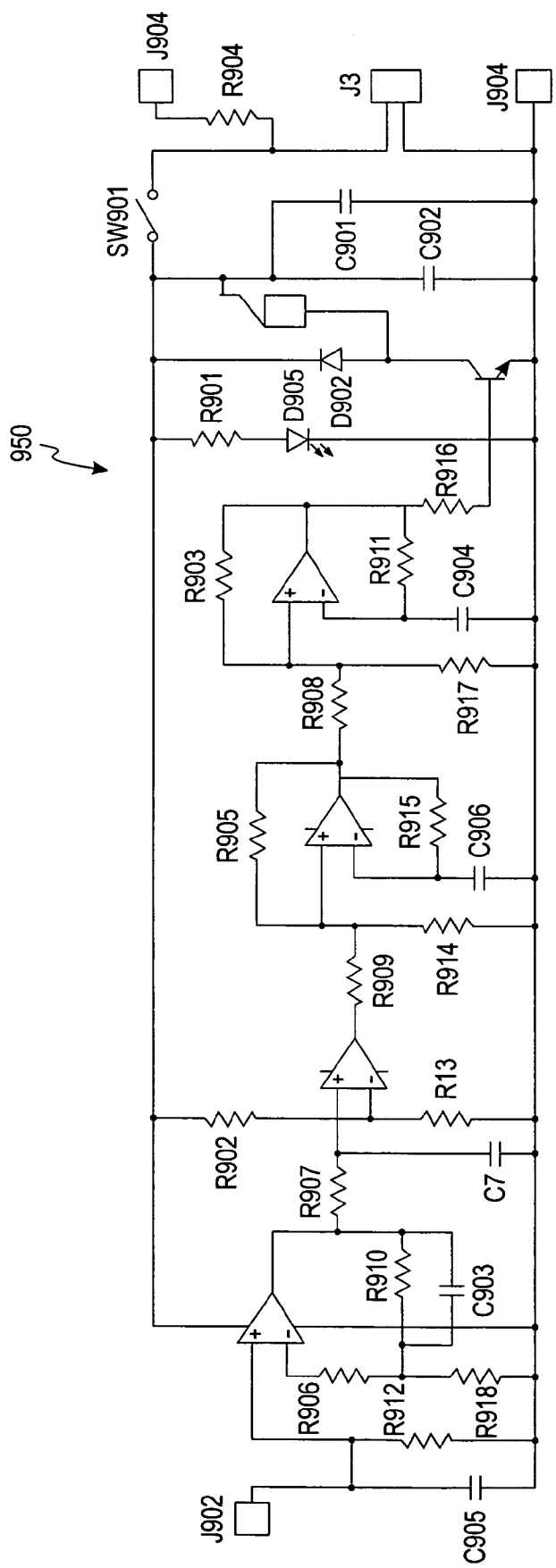
FIG. 6f is a schematic diagram of another electronic circuit of identifying the location of a failed bulb in a light string.

Referring now to FIG. 6f, a novel electrostatic field detection circuit 950, such as used to detect an electrostatic field in a string of decorative Christmas tree lamps, is illustrated. The circuit 950 is powered three 1.5 volt batteries (not shown) and by a bulk capacitor C902, which provides energy storage for transient conditions in parallel with a high frequency bypass capacitor C901. The capacitors C901 and C902 are charged when an SPST switch SW901 is closed, providing connectivity with three 1.5 volt batteries (not shown) at a terminal J902. When the circuit 950 is powered, a current limiting resistor R901 supplies a voltage to illuminate an LED D905. An unswitched ornamental bulb testing interface is provided across terminals J901 and J904, and is directly powered by the batteries connected at the terminal J902 in series with a current limiting resistor R904.

A small 1-2 inch wire antenna connected to the terminal J902 and a capacitor C905 acts as a capacitive pickup circuit. The capacitor C905, further acts as a high frequency filter, and when the antenna comes in proximity with an electrostatic field, a voltage is induced across a high impedance load resistor R912. According to one embodiment of the present invention, a monolithic integrated circuit device such as the LM324, manufactured by STMicroelectronics provides four independent operational amplifier circuits, U1A, U1B, U1C and U1D, all of which are used in the illustrative circuit 950. The detected voltage across the resistor R912 is received by the first section of the LM324, operational amplifier U1A, which is configured as a non-inverting amplifier. A capacitor C903, which is in parallel with the feedback resistor R910, provides further low pass filtering on the received signal. A circuit, formed by resistors R906, R910 and R918, sets the gain of the amplifier and minimizes input offset and bias effects of the circuit U1A, which produces a 60 Hz signal from around zero volts to some higher voltage (depending on the strength of the detected electrostatic field) when an electrostatic field is detected.

The output signal from the operational amplifier U1A is filtered through a current limiting resistor R907 and a capacitor C907, which converts the half-wave output signal to a DC value with a time constant set by the actual R907 and C7 values chosen (around 320 milliseconds with the component values shown). The DC output signal is received by the operational amplifier U1D of the LM324, which is configured as a voltage comparator by resistors R902 and R913. The resistors R902 and R913 sets a voltage output that determines the sensitivity of the circuit.

The output signal of the operational amplifier U1D is then received by the first of two relaxation oscillator stages using the remaining operational amplifier sections of the LM324 U1C and U1B to produce a modified square wave signal in the presence of a DC voltage. The operational amplifier U1C receives the DC signal through a current limiting resistor R909 across a load resistor R914. The operational amplifier U1C is configured to produce a low frequency square wave (of about 10 Hz with the values shown) as determined by a feedback resistor R905 and a time constant determined by a negative feedback resistor R915 and a capacitor C906.

The low frequency signal of the operational amplifier U1C oscillator stage is received by the operational amplifier U1B oscillator stage through a current limiting resistor R908 across a load resistor R917. The operational amplifier U1B oscillator stage is configured to produce a higher frequency square wave (of about 2.8 KHz with the values shown) as determined by a feedback resistor R903 and a time constant determined by a negative feedback resistor R911 and a capacitor C904.

The resulting gated square wave signal from the operational amplifier U1B oscillator stage drives the base of a transistor Q901, which in turn drives a buzzer LS901 with an audible signal. A diode D902, such as a 1N4148, prevents the interference spikes from the buzzer LS901 from being conducted through the circuit 950.

According to one embodiment of the present invention, the output tone of the buzzer LS901 is a distinctive warbled (2.8 KHz) tone as determined by the two serial oscillator stages of the operational amplifiers U1C and U1B. According to another embodiment of the present invention, the output tone of the buzzer LS901 could be a simpler tone as determined by a single oscillator stage.

Figure 6G:
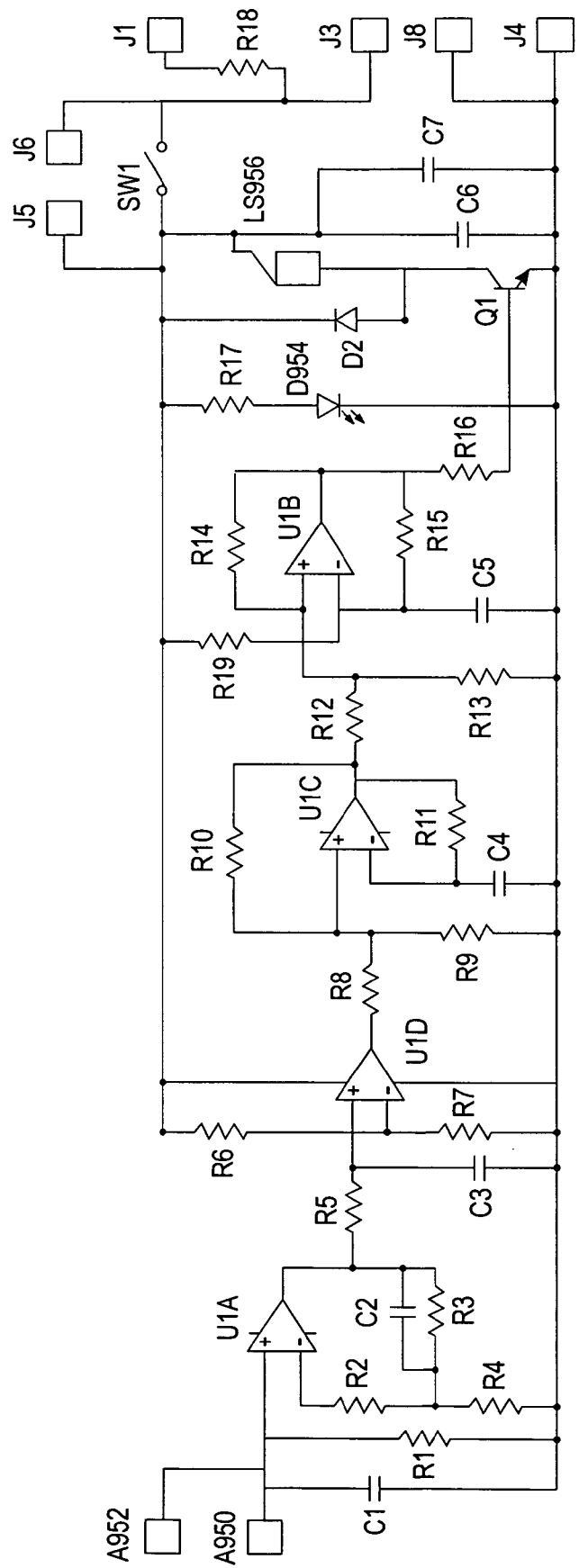
FIG. 6g is a schematic diagram of a circuit for a dual antenna sensor used in conjunction with the circuitry of FIG. 6f described above.

A dual antenna implementation is shown in FIG. 6g. In this configuration, either antenna A950, A952 acquires sufficient signal to operate the detector when in the scan mode. Additionally, when the antennas are placed on opposite sides of a malfunctioning bulb and moved from side to side, the LED D954 and buzzer LS956 will change from activated to deactivated depending upon whether there is AC present at that bulb terminal. This change indicates either the presence of a failed bulb whose shunt has not activated or a failure in the wiring or socket at that location.

Figure 6H:
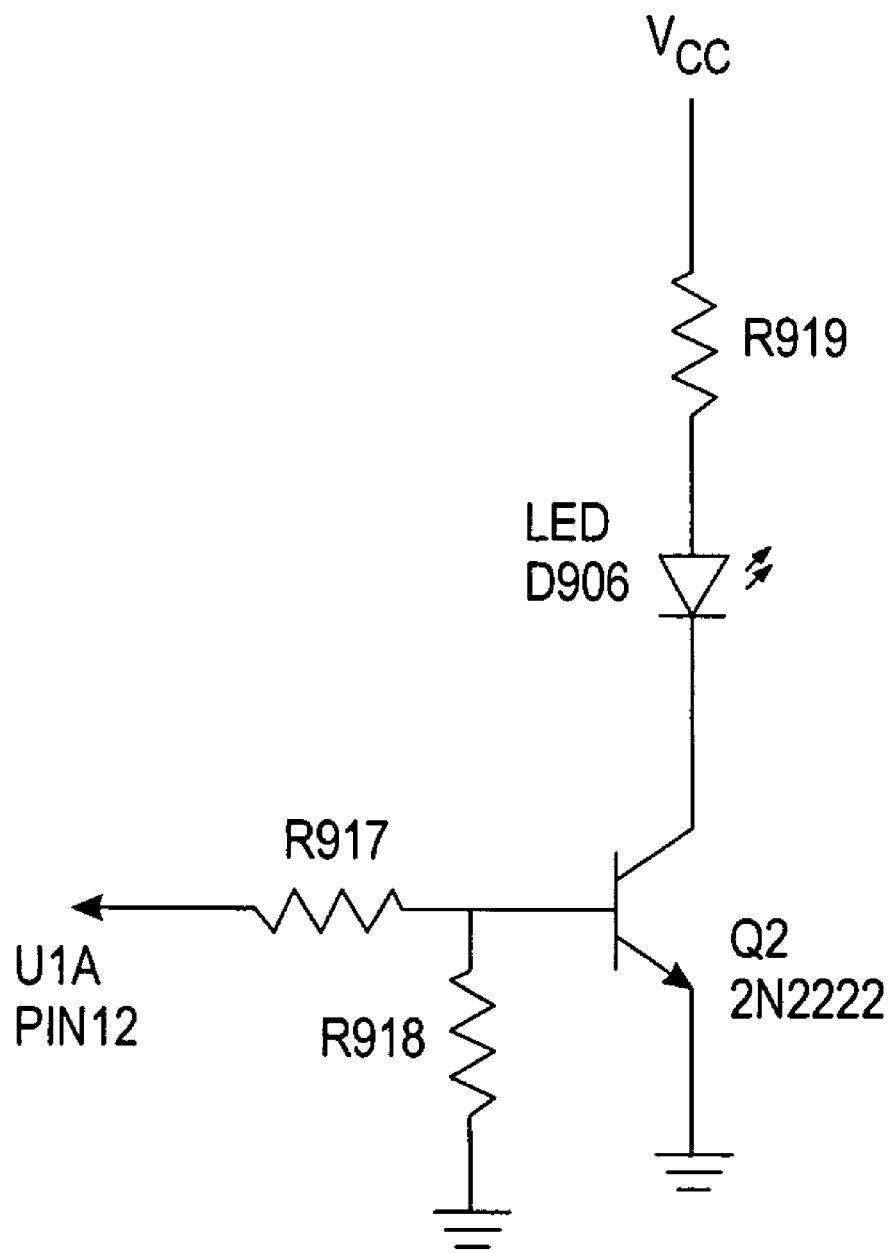
FIG. 6h is a schematic diagram headlamp feature which may be used in combination with FIG. 6f described above.

According to one embodiment of the present invention illustrated in FIG. 6h, the intensity of the light output of a LED D906 is controlled by the strength of the electrostatic field being detected by the first stage operational amplifier U1A. The DC output voltage is delivered to the transistor Q2 through a voltage divider consisting of R917 and R918. As the field strength increases as it would with the detector approaching the energized circuit, the LED light output increases to a level that can be used as a headlamp to improve the visibility in a low light situation. Alternatively, the headlamp could be made to decrease in intensity as the field strength increases. In this embodiment, the circuit of FIG. 6g could be inserted into pin 12—which is also connected to resistor R907—of FIG. 6f.

Figures 7A, 7B:
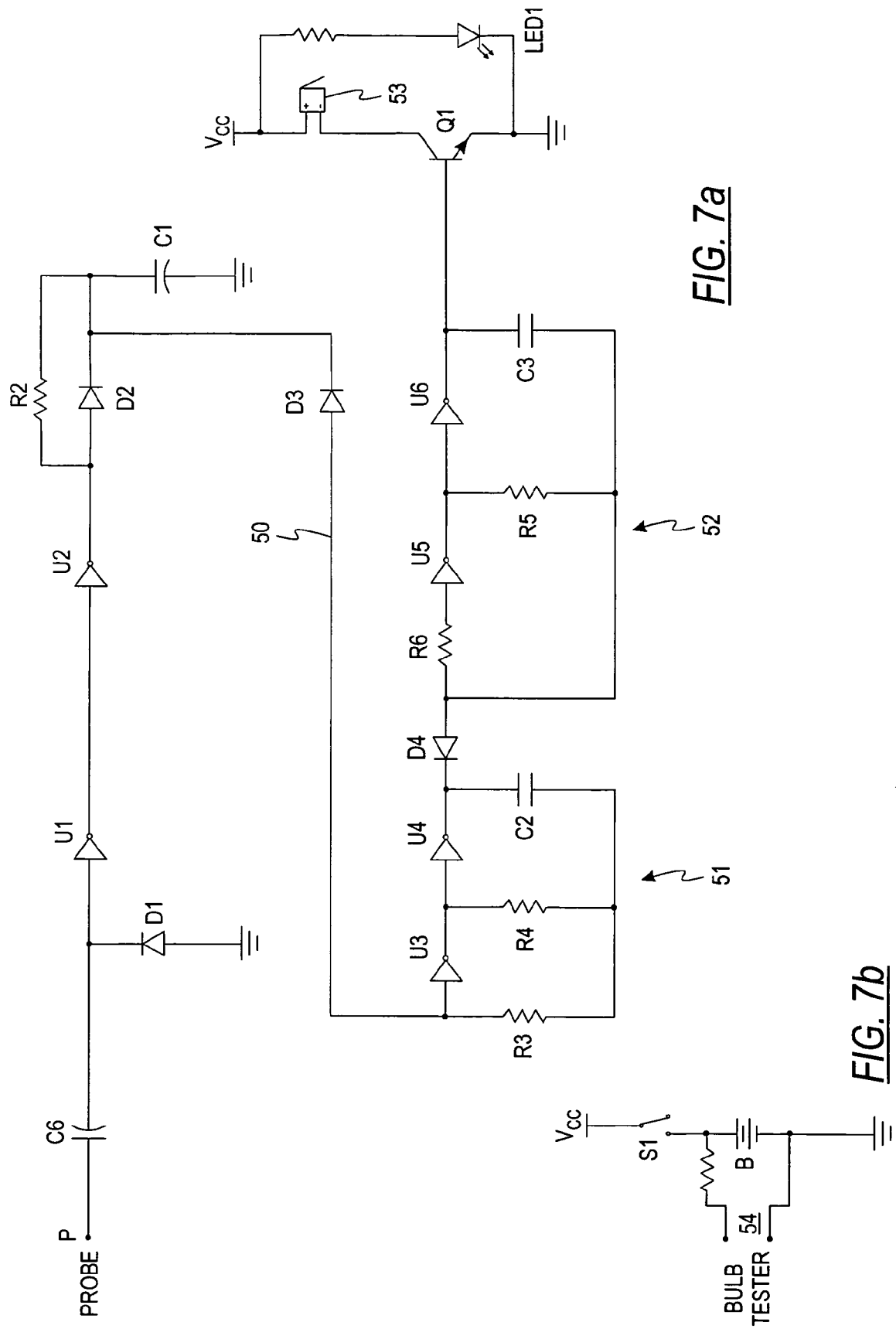

FIG. 7a is a schematic diagram of a circuit that can be used as an alternative to the circuit of FIG. 5 for identifying the location of a failed bulb in a light string. FIG. 7b shows the battery B that is used to provide the voltage $V_{cc}$ that powers the buzzer 53 and LED1 in the circuit of FIG. 7a whenever the switch S1 is closed. The circuit in FIG. 7a is the same as the circuit in FIG. 5 except that (1) the circuit of FIG. 7a eliminates LED2, the sensitivity switch S2 and its associated capacitor C5, and the sub-circuit that includes the transistor Q2, and (2) the resistor R1 is replaced by an electrolytic capacitor C6 (e.g., 4.7 µF). It has been found that the use of the electrolytic capacitor C6 provides more stable and reliable operation over a fixed range of distances between the probe and the wires of the light string. That is, the response of the buzzer 53 remains the same for different light strings, and different ambient conditions, as long as the probe is held within ⅛ to one inch from the wires of the light string.

Figure 8A:
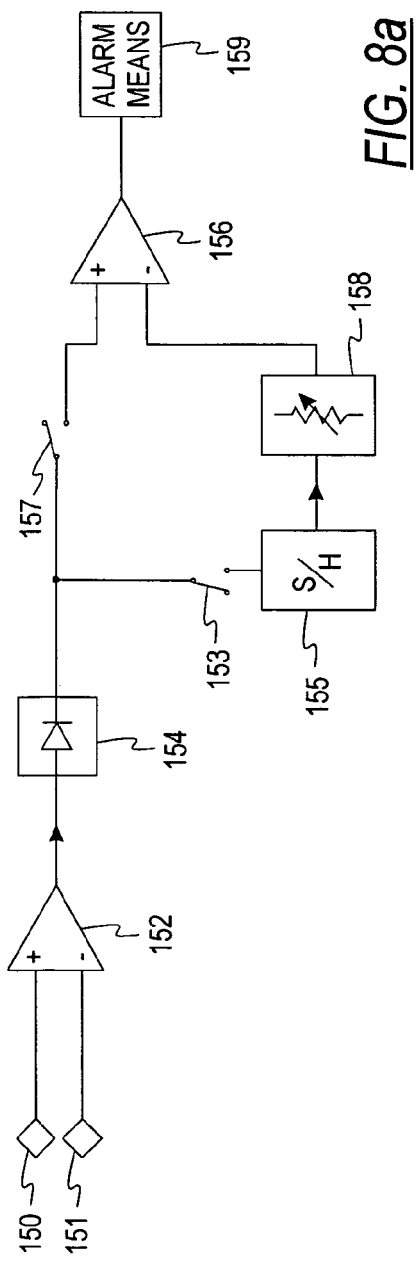
FIG. 8a is a block diagram of a modified circuit for detecting failed bulbs.
Figure 8B:
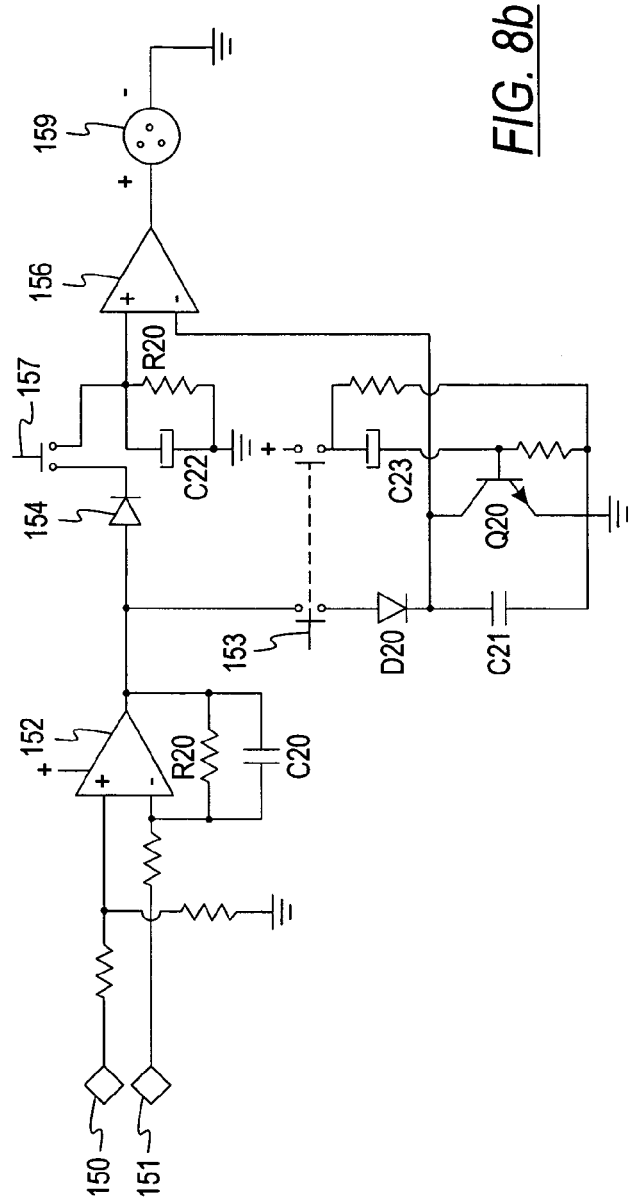

Another alternative to the circuit of FIG. 5 is the circuit shown in FIGS. 8a and 8b, which is a sample-and-hold differential detector. Referring first to the block diagram in FIG. 8a, the AC electrostatic field around an energized light string is detected by a capacitive sensor comprising a pair of spaced parallel plates 150 and 151 connected to the positive and negative inputs of a differential amplifier 152. The plates 150 and 151, which are typically about 0.5 inch square, are located on opposite sides of the light string and pick up the AC field as they are moved along the length of the light string. When the sensor is close to a failed bulb, the field strength decreases by about 50%, and thus the purpose of the detection circuit is to detect that drop in field strength.

Before scanning a light string, the sensor is positioned near the plug end of the wires, and a "sample" switch 153 is closed momentarily to store a sample of the field strength at that location, where the field strength should be at its maximum. More specifically, the output of the differential amplifier 152 is passed through a rectifier 154 and stored in a conventional sample-and-hold circuit 155 when the switch 153 is closed. This stored sample is then used as a reference signal input to a comparator 156 during the scanning of the light string. The other input to the comparator is the instantaneous rectified output of the amplifier 152, which is supplied to the comparator whenever a "test" switch 157 is closed. If desired, the stored sample may be scaled by a scaling circuit 158 before it is applied to the comparator 156. For example, the stored sample may be scaled by about ¾ so that the threshold value used in the comparator is about 75% of the maximum field strength, as determined by the sample taken near the plug end of the wires of the light string.

The comparator 156 is designed to change its output when the actual field strength falls below about 50% of the threshold value, indicating that the sensor is adjacent a bad bulb. An alarm or indicator 159 responds to the change in the output of the comparator 156 to produce a visible and/or audible signal to the user that a bad bulb has been located. The sample level can also be taken with the plug in the unpolarized position so that the change at the defective bulb corresponds to an increase in the level instead of a decrease. The threshold value can also be set so that this increase above the sample level triggers the alarm or indicator. The two approaches can also be combined so that the customer does not need to check the polarity of the plug before testing the string. The sample is taken and then circuitry looks for a change, either up or down, and either will trigger the indicator.

FIG. 8b is a schematic diagram of a circuit for implementing the system illustrated by the block diagram of FIG. 8a. The differential amplifier 152 includes a capacitor C20 in parallel with its feedback resistor R20 to roll off the high frequency response and thereby prevent erratic operation from noise and RF signals propagating along the power line. When the "sample" switch 153 is momentarily closed, the output of the differential amplifier is passed through a diode D20 to a capacitor C21. The diode D20 functions as a half wave rectifier, while the capacitor C21 stores the peak level of the signal for use as a threshold signal in the comparator 156. Closure of the "sample" switch 153 also sends a pulse through a capacitor C23 to the base of a transistor Q20 to turn the transistor on for about 0.01 second to discharge the previously stored sample before the new sample is stored in the capacitor C21.

As the sensor plates 150, 151 are moved along the light string, the "test" switch is closed to supply the rectified output of the differential amplifier 152 to a current-value storage filter formed by a capacitor C22 and a resistor R20 connected in parallel with each other between the switch 157 and ground. The value stored in the filter is supplied to the positive input of the comparator 156 which compares that value with the threshold value from the capacitor C21. When the current value falls below a predetermined value, the comparator output changes to activate the alarm device 159.

Figure 9:
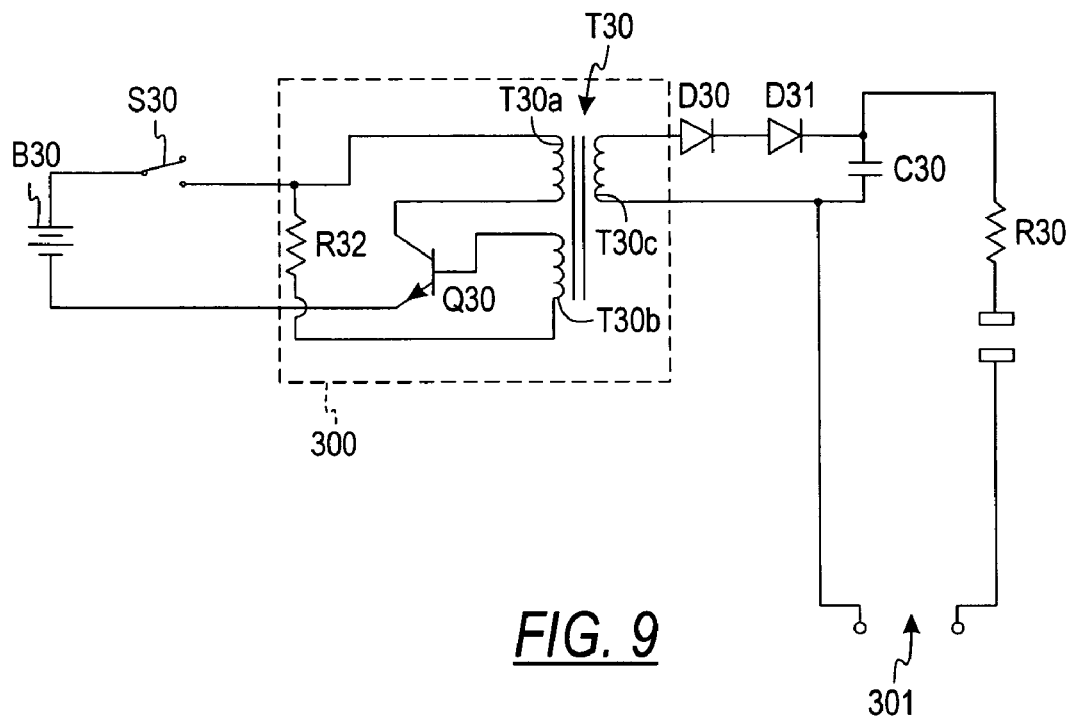
FIG. 9 is a schematic diagram of an alternative battery-powered circuit for generating high-voltage pulses.

A variety of different circuits may be used to generate signals (which in some embodiments may be pulsed signals) of a magnitude greater than the standard AC line voltage to fix a malfunctioning shunt. One such alternative circuit is illustrated in FIG. 9, in which a battery B30 supplies DC power to a blocking oscillator 300 to generate a high-voltage AC signal that is rectified by a pair of diodes D30 and D31 and then used to charge a capacitor C30. When the capacitor C30 charges to a predetermined level, it discharges through a resistor R30 to produce high-voltage pulses that are applied to a light string plugged into a socket 301. The resistor R30 functions to stretch the pulses, while the spark gap device SG30 controls the voltage level. It has been found that the addition of a resistance (e.g., ~1000 ohms) in series with the discharge path of the capacitor into the light string increases the rate of success in fixing malfunctioning shunts.

Operation of the oscillator 300 is initiated by closing a switch S30 that supplies power from the battery B30 to the primary winding T30a and an auxiliary winding T30b of a transformer T30. A transistor Q30 has its collector and base connected to the two windings T30a and T30b, respectively, and its emitter is connected to the negative side of the battery B30. A resistor R32 is connected in series with T30b to supply base current to Q3 from the two windings T30a and T30b. The blocking oscillator operates in the conventional manner, producing a stepped-up AC signal in the secondary winding T30c of the transformer as long as the switch S30 remains closed.

Figure 10:
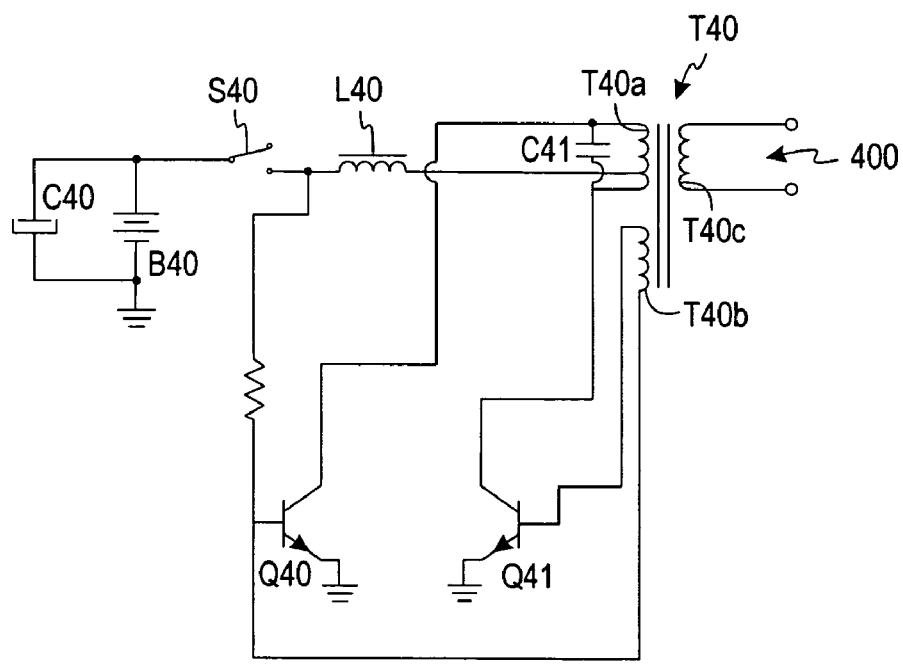
FIG. 10 is a schematic diagram of another alternative battery-powered circuit for generating high-voltage pulses.

FIG. 10 illustrates a current-fed sinusoidal converter that may be used as an alternative to the circuit of FIG. 9. Power is supplied to the converter from a battery B40 via inductor L40 whenever a switch S40 is closed. The battery B40 is connected in parallel with an electrolytic capacitor C40 that stores energy from the battery for producing the desired high-voltage signal. The desired sinusoidal signal is produced by a conventional sine-wave generating circuit that includes a pair of transistors Q40 and Q41 connected to a pair of primary windings T40a and T40b of a transformer T40. A capacitor C41 is connected across the winding T40a. As long as the switch S40 remains closed, the transistors Q40 and Q41 are repetitively turned on and off, with one of the transistors always being on while the other is off, so as to produce a sinusoidal output signal in the secondary winding T40c of the transformer T40. This sinusoidal output is applied directly to a light string plugged into a socket 400 connected to opposite ends of the winding T40c.

Figure 11:
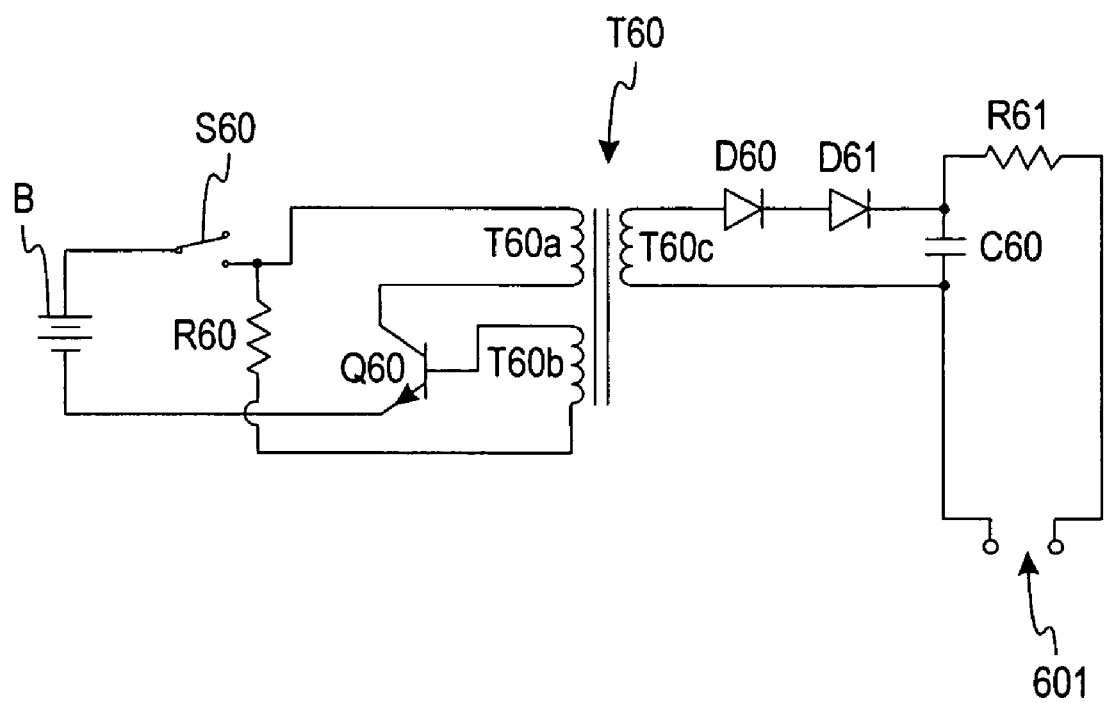
FIG. 11 is a schematic diagram of another alternative battery-powered circuit for generating high-voltage pulses.

FIG. 11 illustrates a circuit that uses a battery B as a power source and a conventional blocking oscillator consisting of the NPN transistor Q60; a transformer T60 with a primary winding T60a, a feedback winding T60b, and a secondary winding T60c; and a resistor R60. The transformer T60 is a step-up transformer with a secondary winding T60c consisting of many turns to raise the peak AC voltage to about 1000 volts, which is rectified by a pair of diodes D60 and D61 and used to charge a capacitor C60 (e.g., 0.1 µF) to a voltage determined by the breakdown voltage of the defective shunt in the failed bulb. When this voltage is reached, typically 500 to 1000 V, the oxide or other insulation on the shunt breaks down and the voltage across the bulb falls abruptly to a low value as a heat-producing discharge occurs between the shunt and the filament support wires. This discharge has been shown to cause breakdown and burn-through of the oxide in a malfunctioning shunt in a light string plugged into a socket 601, rendering the shunt conductive and allowing the light string to function normally. Shaping the pulse by the use of inductive, capacitive, resistive and/or active component elements has been shown to improve the effectiveness of the pulse. For example, increasing the length of the discharge current pulse with the resistor R61 (e.g., 1000 ohms) produces a statistically significant increase in the number of malfunctioning shunts that are rendered conductive. As some malfunctioning shunts are not true open circuits but rather comprise a high resistance which inhibits charging of the capacitor C60, the addition of a spark gap in series with the resistor R61 allows full charging of the capacitor C60 before current is delivered to the light string.

Figure 12:
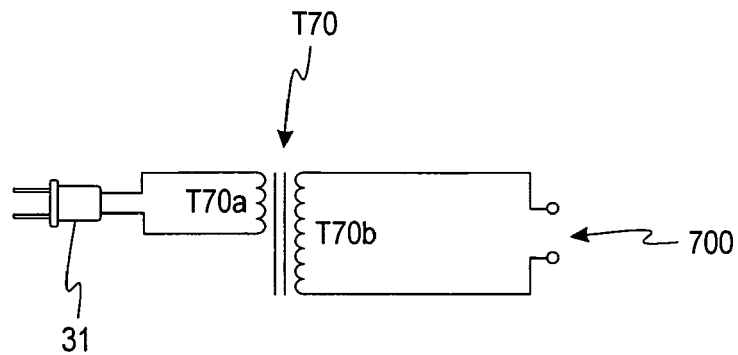
FIG. 12 is a schematic diagram of an AC source for generating high-voltage pulses.

FIG. 12 illustrates a circuit that uses the reactance of a transformer T70 to limit current from an AC power source to safe values (about 10 to 30 mA) and cause breakdown of and subsequent shorting of a malfunctioning shunt by virtue of the voltage and current applied over several AC line cycles. The transformer windings T70a and T70b are chosen to form a step-up transformer that applies a higher-than-rated voltage to a light string plugged into a socket 700, to cause the malfunctioning shunt to conduct. The exact duration and peak current and other characteristics of the high voltage can vary widely and still accomplish the same function.

Figure 13:
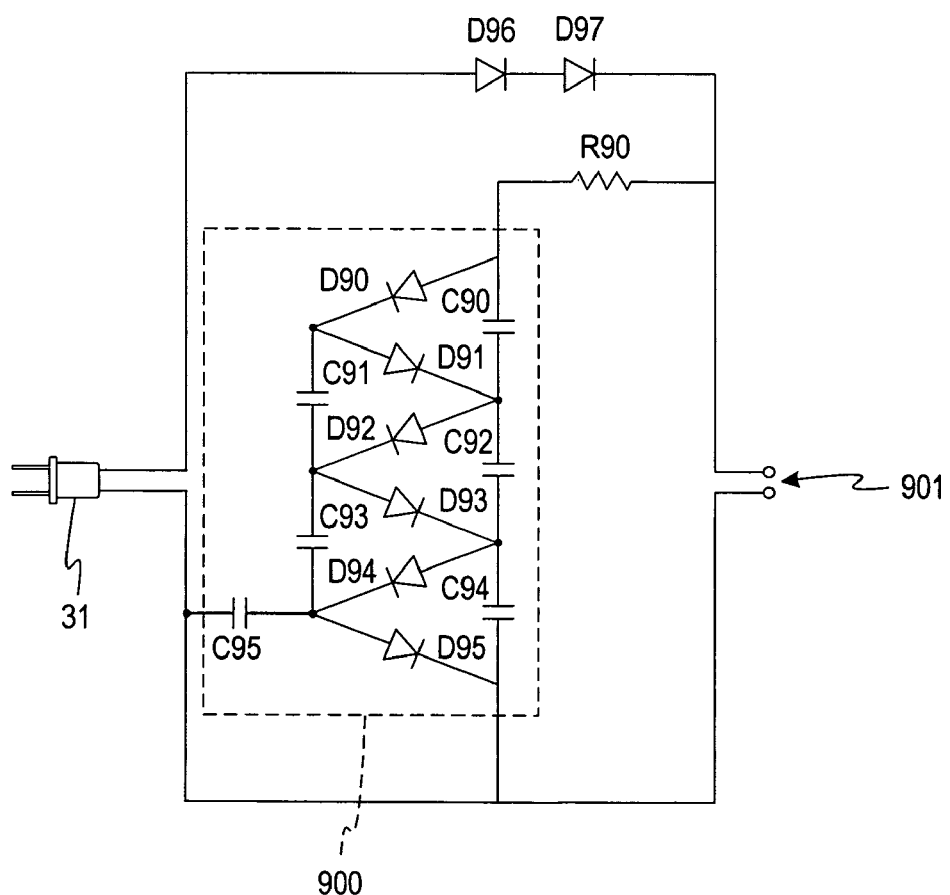
FIG. 13 is a schematic diagram of another alternative circuit for generating high-voltage pulses, using power from a standard AC outlet.
Figure 14:
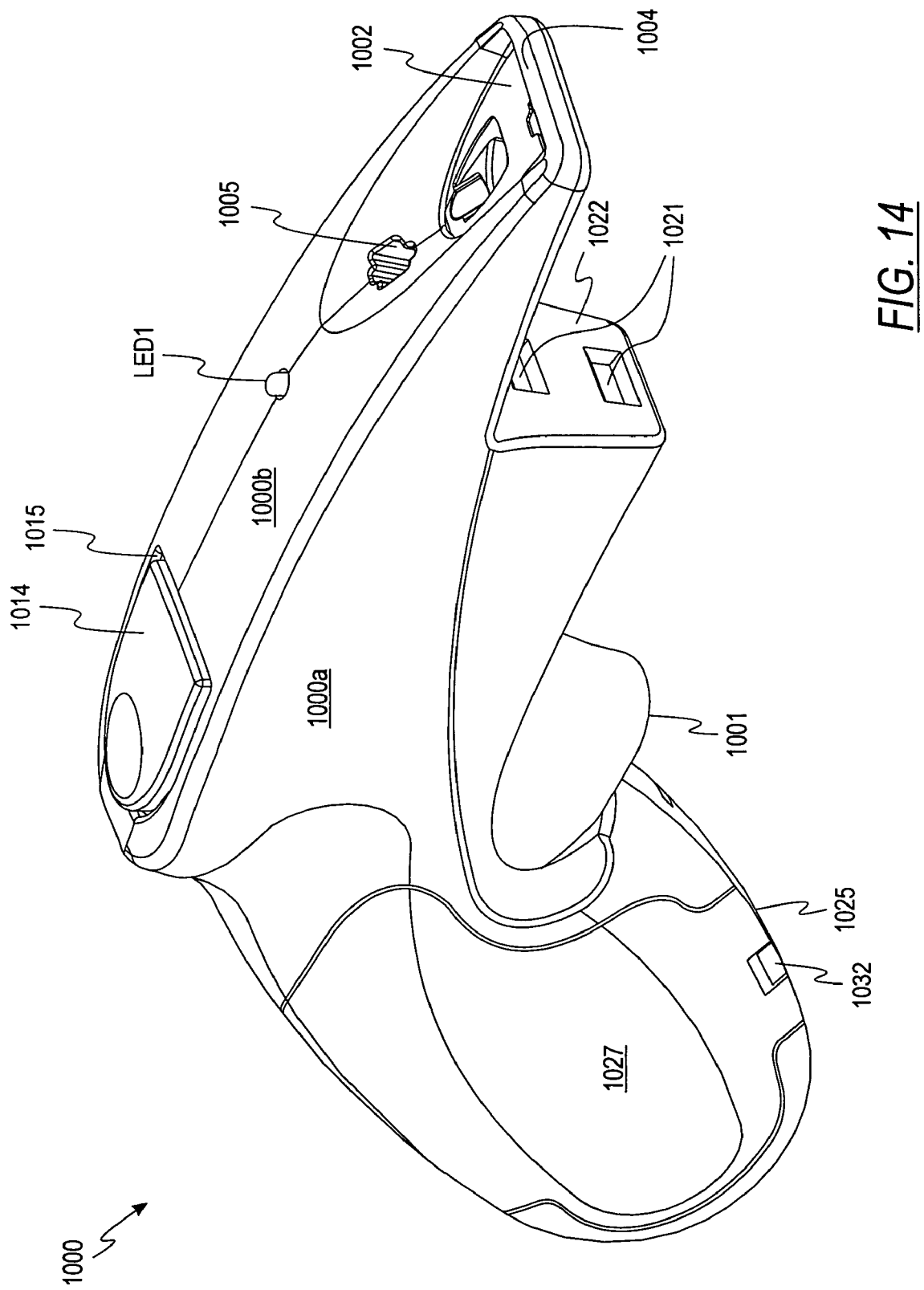
FIG. 14 is a front perspective view of another modified repair device embodying the invention.
Figure 15:
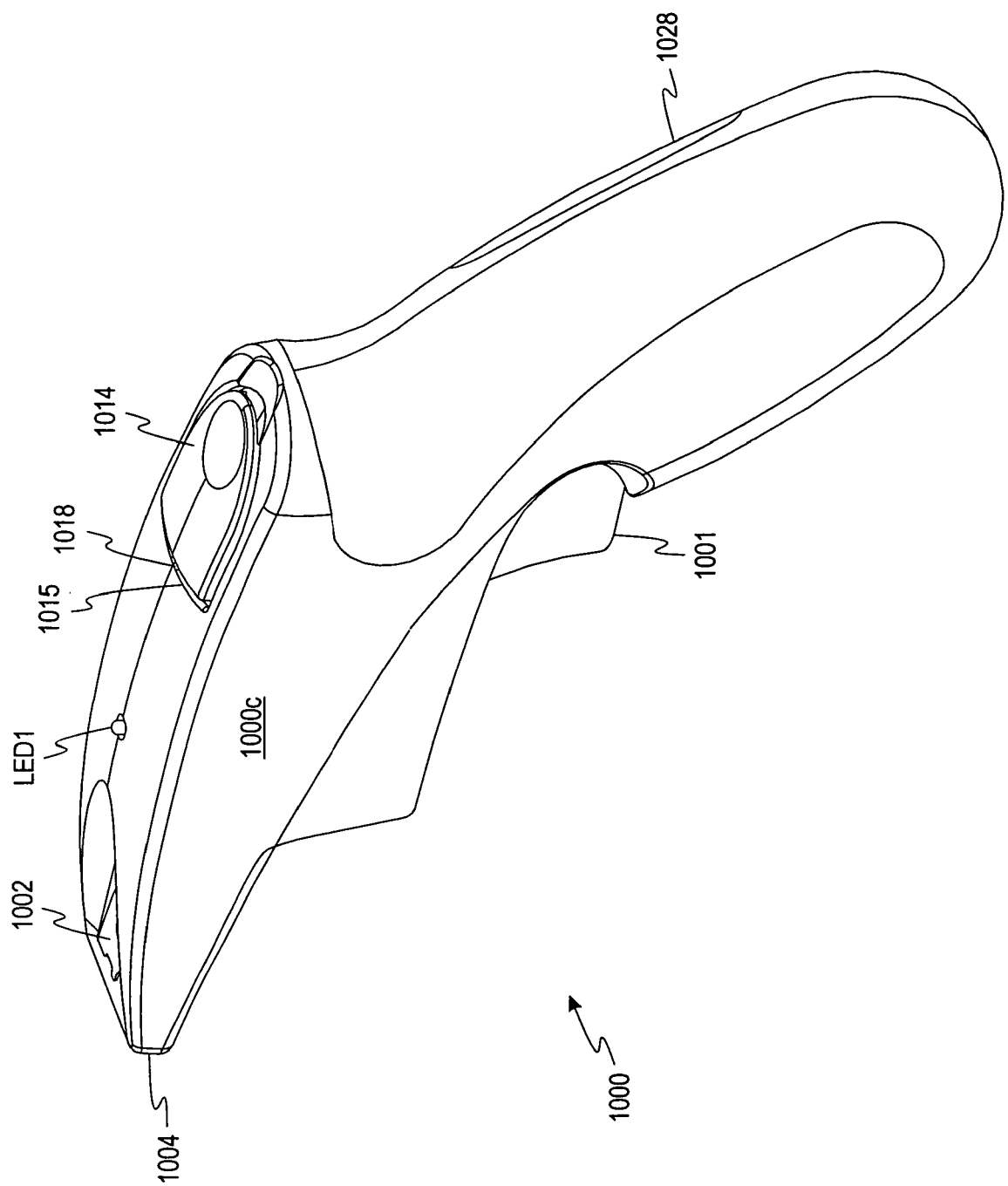
FIG. 15 is a back perspective view of the embodiment shown in FIG. 14.
Figure 17:
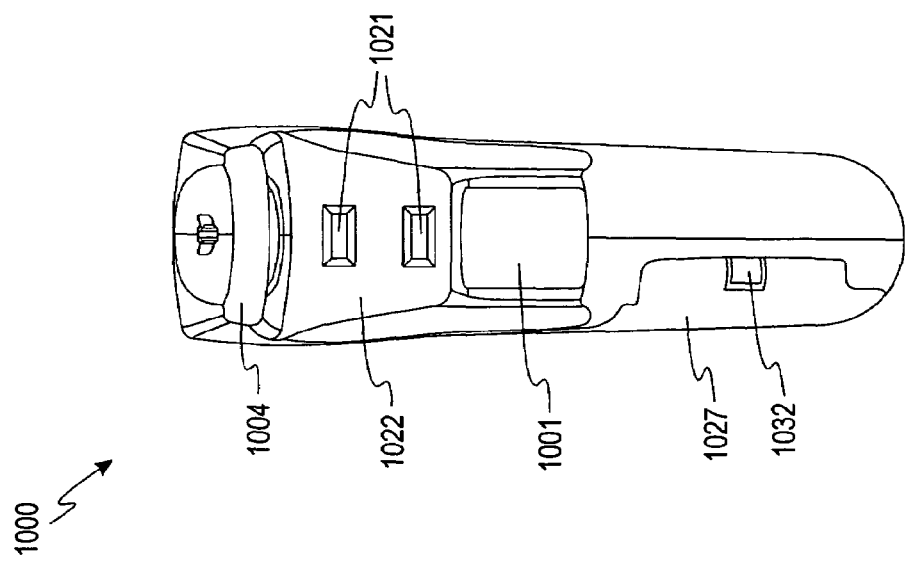
FIG. 17 is a front elevation of the embodiment shown in FIG. 16.
Figure 16:
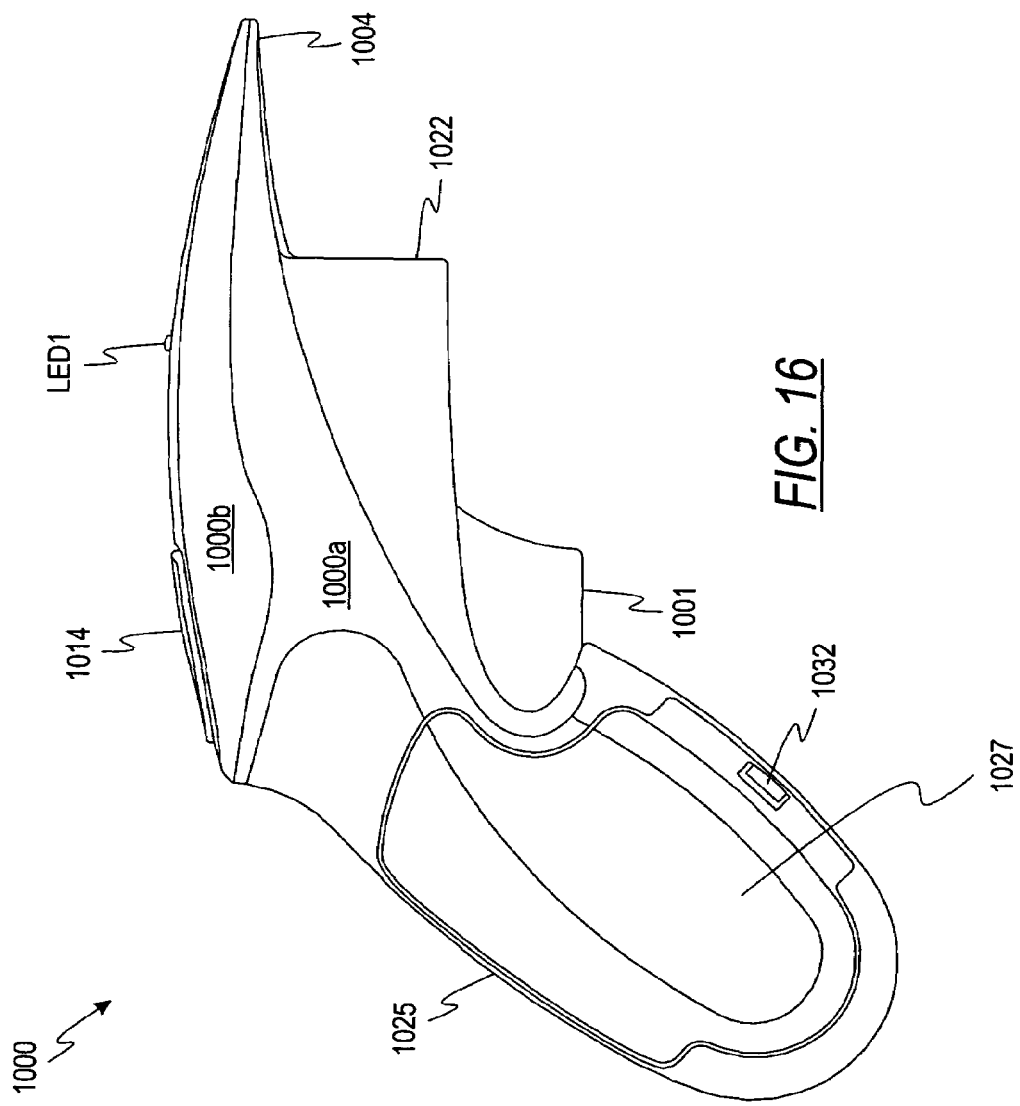
FIG. 16 is a right side elevation of the embodiment shown in FIGS. 14 and 15.
Figure 19B:
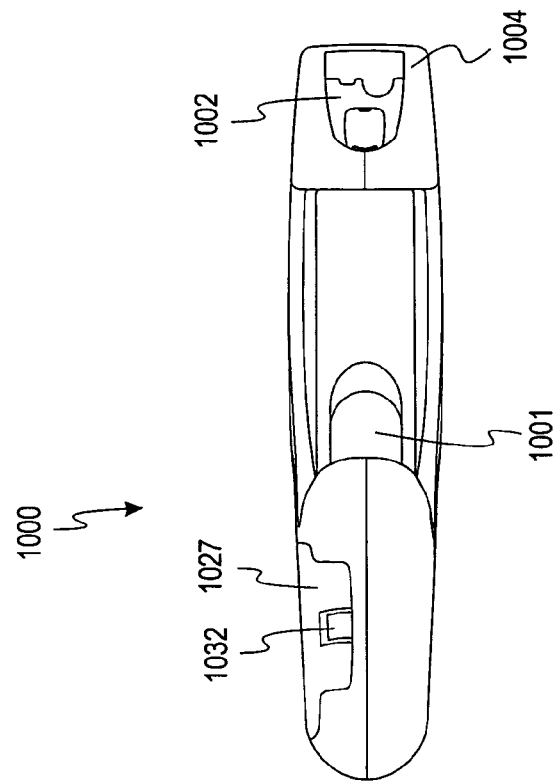
FIG. 19b is a bottom plan view of the embodiment shown in FIGS. 14-18b.
Figure 19A:
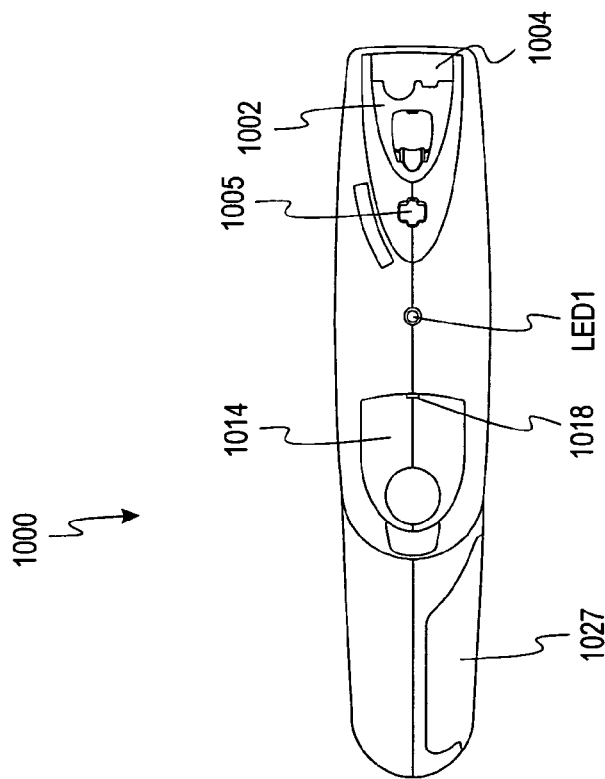
FIG. 19a is a top plan view of the embodiment shown in FIGS. 14-18b.
Figure 23:
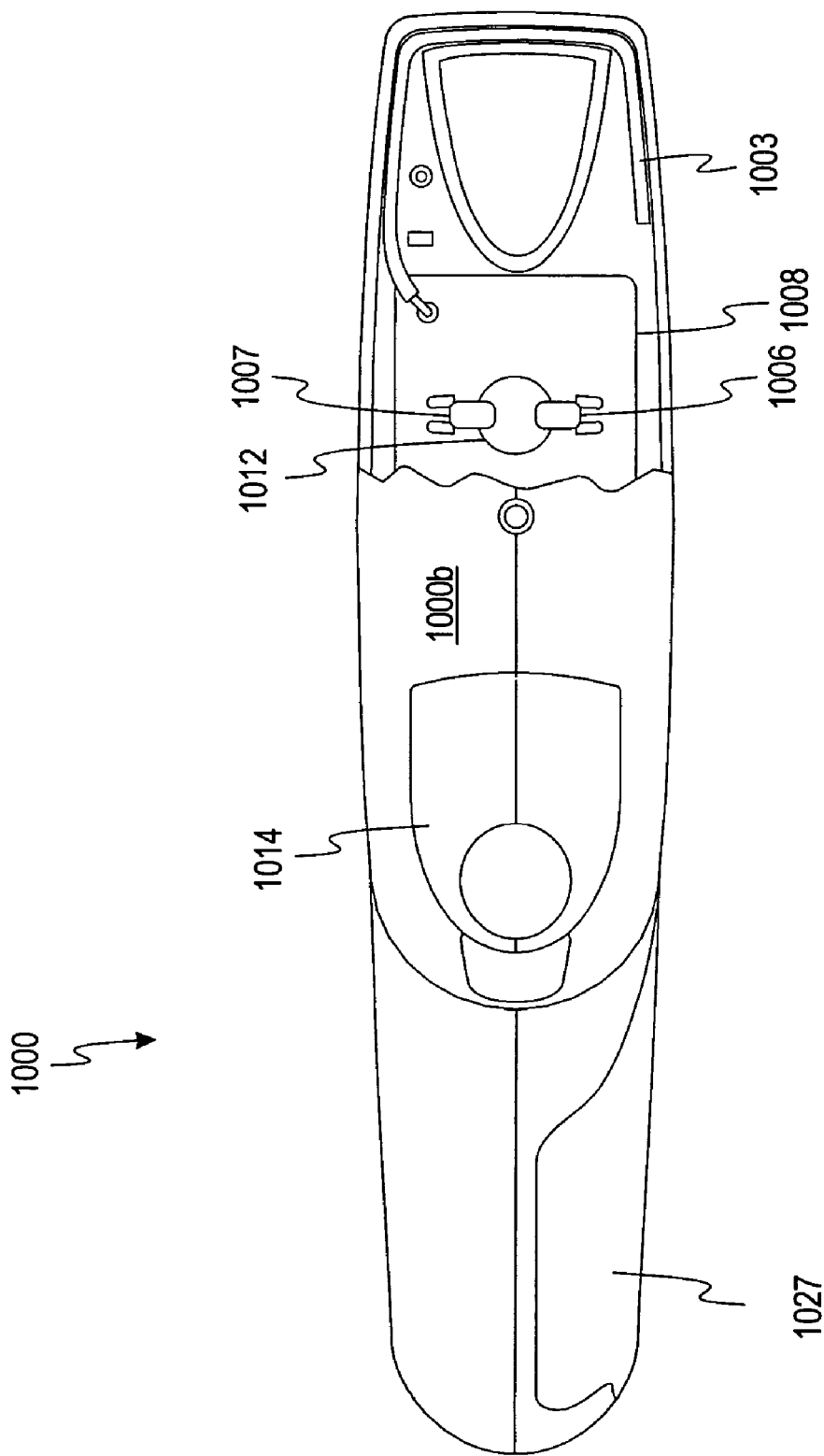
FIG. 23 is a top plan view of the embodiment shown in FIGS. 14-18b, with a portion broken away to show the internal structure.

FIG. 13 depicts the use of a conventional Cockroft-Walton voltage multiplier array in another AC line-operated configuration for repairing a malfunctioning shunt in a light string plugged into a socket. The three-stage multiplier 900, formed by diodes D90-D95 and capacitors C90-C95 and connected to the AC source boosts the voltage to about 900-1000 volts, and discharges through a resistor R90 when the breakdown voltage of the malfunctioning shunt is reached. Connected between the AC source and a socket 901 for receiving the plug of the light string, is a pair of diodes D96 and D97 that are reverse biased (and therefore non-conductive) by the high voltage DC, but conduct on positive half cycles of the AC line voltage to immediately illuminate the string of lights dimly once the initial breakdown occurs, thus giving the operator fast feedback on the success of the repair procedure.

Another preferred embodiment of the invention is illustrated in FIGS. 14-23. In this embodiment the overall shape of the housing has been modified to form a generally L-shaped body 1000 resembling the profile of a futuristic handgun. In the illustrative embodiment, the body 1000 is made in three molded plastic parts 1000a-1000c fastened together by a few détente latches and screw sockets molded as integral parts of the interior surfaces of the body parts, and screws threaded onto the molded sockets.

The trigger 1001 protrudes from the housing 1000, having no obstructions on the free side 1001a of the trigger 1001 in order to give the user easy access. A metal bulb pulling tool 1002 is located at the top of the housing 1000 in front of the trigger 1001 and inside a wire loop 1003 which forms the probe P of the circuit illustrated in FIGS. 5 and 7a. A plastic cover 1004 formed by the housing 1000 encases the wire loop 1003 and forms a guard extending along and slightly spaced from the leading edge of the bulb pulling tool 1002 to protect the user from the sharp edges on the tool.

The bulb testing socket 54 of FIGS. 5 and 7a is formed by a hole 1005 in the top wall of the housing 1000, directly behind the bulb pulling tool 1002, and a pair of spring contacts 1006 and 1007 mounted on a printed circuit board (PCB) 1008 directly beneath the hole 1005. To accommodate light bulbs with long bases, an aperture 1012 (see FIG. 23) is formed in the PCB 1008 between the two spring contacts 1006 and 1007. The contacts 1006 and 1007 are connected via the PCB 1008 to a second pair of spring contacts 1009 and 1010 mounted on the PCB 1008 for receiving a battery 1011 (see FIG. 18a) or stack of batteries. When a bulb base is inserted through the hole 1005 into the space between the contacts 1006 and 1007, the bulb is connected to the battery B, causing the bulb to illuminate if it is a good bulb.

To facilitate battery replacement, the battery B is housed in a cavity 1013 formed as an integral part of a molded plastic element 1014 inserted in an opening 1015 at the handle end of the top wall of the housing 1000 (see FIGS. 18a and 21). The element 1014 serves as a combined removable battery holder and manually operable switch actuator. The ends of the battery B are exposed at opposite ends of the cavity 1013 to engage the spring contacts 1009 and 1010 when the element 1014 is inserted into the opening 1015. A lug 1016 depending from a flexible actuator 1017 formed as an integral part of the rear portion of the element 1014 engages a switch S1 mounted at the rear edge of the PCB 1008 and forming part of a manually actuated battery test circuit. When the actuator 1017 is pressed downwardly, it closes the switch S1 to illuminate the LED1 mounted on the PCB 1008 and extending upwardly through an aperture in the top wall of the housing 1000, indicating that a good battery is in place and the device is ready to operate. A latch 1018 on the front edge of the element 1014 mates with an aperture 1018a in the opposed wall of the housing to hold the element 1014 in place in the housing 1000.

All the other elements of the field-detecting and signaling circuit of FIG. 7a, except the buzzer 53, are mounted on the PCB 1008, which is captured in the housing 1000 above a longitudinal septum 1019. A pair of wire leads 53a and 53b connect the PCB 1008 to the buzzer 53 mounted in the interior of the cover 1004. The piezoelectric pulse generator 1020 is mounted beneath the septum 1019, so that the septum shields the PCB and its circuitry from any arcs that might be produced by the piezoelectric device 1020 if the trigger 1001 is pulled when no light string is plugged into the housing 1000. An electrical receptacle 1021 for receiving the prongs of the plug on a light string is formed in the lower front wall 1022 of the housing 1000, below and to the rear of the tool 1002. A pair of metal sockets 1023 and 1024 receive the two prongs of the plug, and the two sockets 1023 and 1024 are connected to opposite sides of the piezoelectric pulse generator 1020. The trigger 1001 is mounted for reciprocating sliding movement in the housing 1000 directly beneath the piezoelectric device 1020 and in direct engagement with the movable striker of the piezoelectric device. The internal return spring in the piezoelectric device 1020 serves to return the trigger 1001 to its advanced position after every pull of the trigger.

In the preferred embodiment, the piezoelectric device 1020 comprises two piezoelectric pulse generators connected in parallel with each other. Both generators are actuated in tandem by the same trigger 1001.

The handle 1025 of the housing 1000 forms a storage area 1026 that is conveniently divided into three compartments 1026a-c for separate storage of fuses and different types of bulbs. The storage compartments are covered by a removable lid 1027 which has a pair of rigid hooks 1028 and 1029 on its upper edge for engaging mating lugs 1030 and 1031 on the wall of the central compartment 1026b. The opposite edge of the lid 1027 forms a flexible latch 1032 that releasably engages mating lugs 1033 on the wall of the central compartment 1026b.

Figure 26:
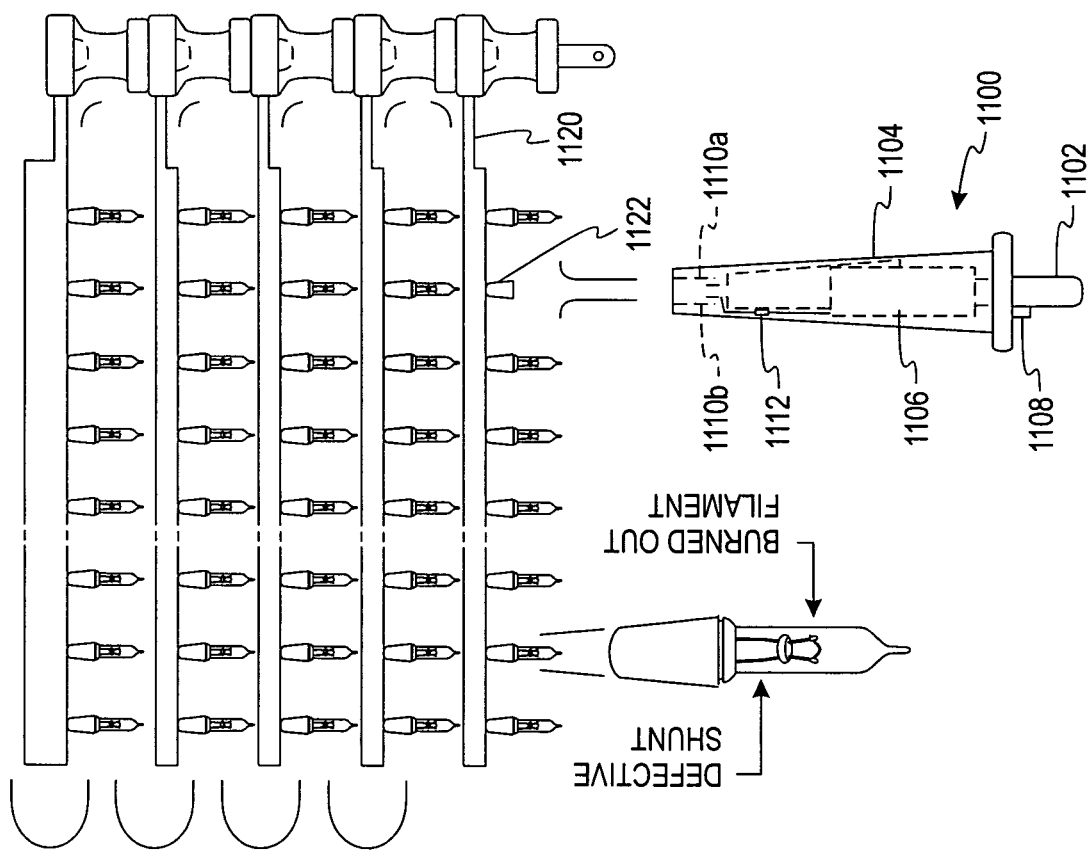
FIG. 26 is a side view of a repair device according to another embodiment of the invention.

Turning now to FIGS. 26 and 27, an alternative embodiment of a repair device 1100 will be described. The repair device 1100 is a handheld device that includes a handle 1102 and a body 1104. The body 1104 houses a repair mechanism that includes a high voltage generator 1106 and a trigger 1102. In this embodiment, the high voltage generator 1106 is a piezoelectric pulse generator as described above. The body 1104 extends over a pair of metal electrical contacts 1110a, 1110b (FIG. 27). Also included is a fuse 1112. The fuse 1112 is connected to the high voltage generator.

Referring back to FIG. 26, the use of the repair device 1100 will be described. The repair device 1100 is shown in conjunction with a light string 1120. The light string 1120 has a burned out bulb. In operation, once a bulb has burned out, the user unplugs the light string 1120 from the electrical socket. The light string 1120 with the burned out bulb does not need to be removed from any other light strings it is connected to and the plug for the light string 1120 does not need to be found and plugged into the repair device 1100. This is especially useful when repairing shunts in light strings on a pre-lit tree. Since the pre-lit trees often come with many strings of lights connected together, finding the correct plug may be difficult and time-consuming. Once the light string 1120 is unplugged from the electrical outlet, a bulb other than the burned out bulb is removed, revealing a bulb socket 1122. The repair device 1100 is placed onto the bulb socket 1122, such that the electrical contacts 1110a, 1110b of the repair device 1100 come into electrical contact with a pair of metal contacts 1124a, 1124b in the bulb socket 1122.

The user then pulls the trigger 1102, activating the high voltage generator 1106. The high voltage signal that is generated by the high voltage generator 1106 travels through the electrical contacts 1110a, 1110b and into the light string 1120 via the metal contacts 1124a, 1124b. The signal then travels along the light string and acts to repair the bad shunt as described above.

The alternate repair device 1100 allows the user to repair the bulb without having to unplug the string from other light strings. In many pre-lit trees, there are up to 20 light strings connected together and the plugs are taped together. With this device, the user does not have to find the plug, untape it and then unplug it. Instead, the user only has to remove a bulb from the bad light string to repair the bad bulb.

Figure 28A:
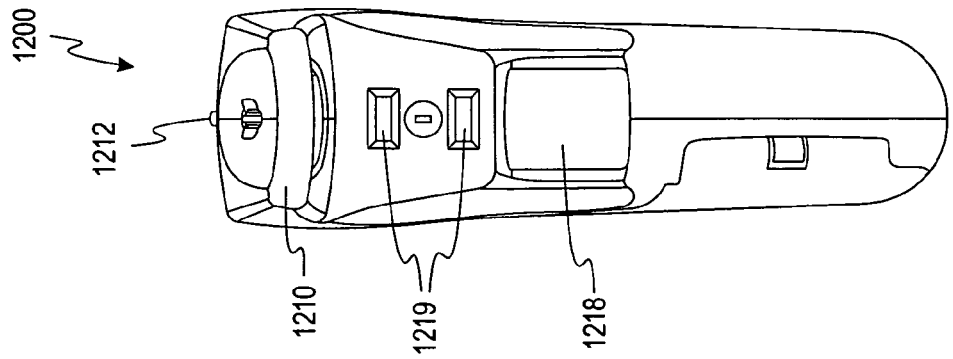
FIG. 28a is a front view of a repair device according to another embodiment of the present invention.

Turning now to FIG. 28a, a repair device 1200 according to another embodiment of the present invention will be described. The repair device is similar to the repair device described in FIGS. 1-4 in that it can both sense and repair a bad bulb. The repair device 1200 utilizes a sensor 1210 that operates to detect the location of a bad bulb. This may be done using circuitry similar to that described above. An LED 1212 and a buzzer may be included on the repair device 1200 to aid in designating the location of the bad bulb as described above. The device 1210 also includes a repair mechanism 1214 for repairing a bad bulb. The repair mechanism 1214 includes two electrical contacts 1216a, 1216b, which operate the same as the electrical contacts 1116a, 1116b, described above. A trigger 1218 is also included on the repair device 1200 and is electrically connected to the repair mechanism 1214. The repair mechanism 1214 also includes a plug socket 1219 for receiving a plug on the end of a light string 1220, as described above in relation to FIG. 1.

Figure 28B:
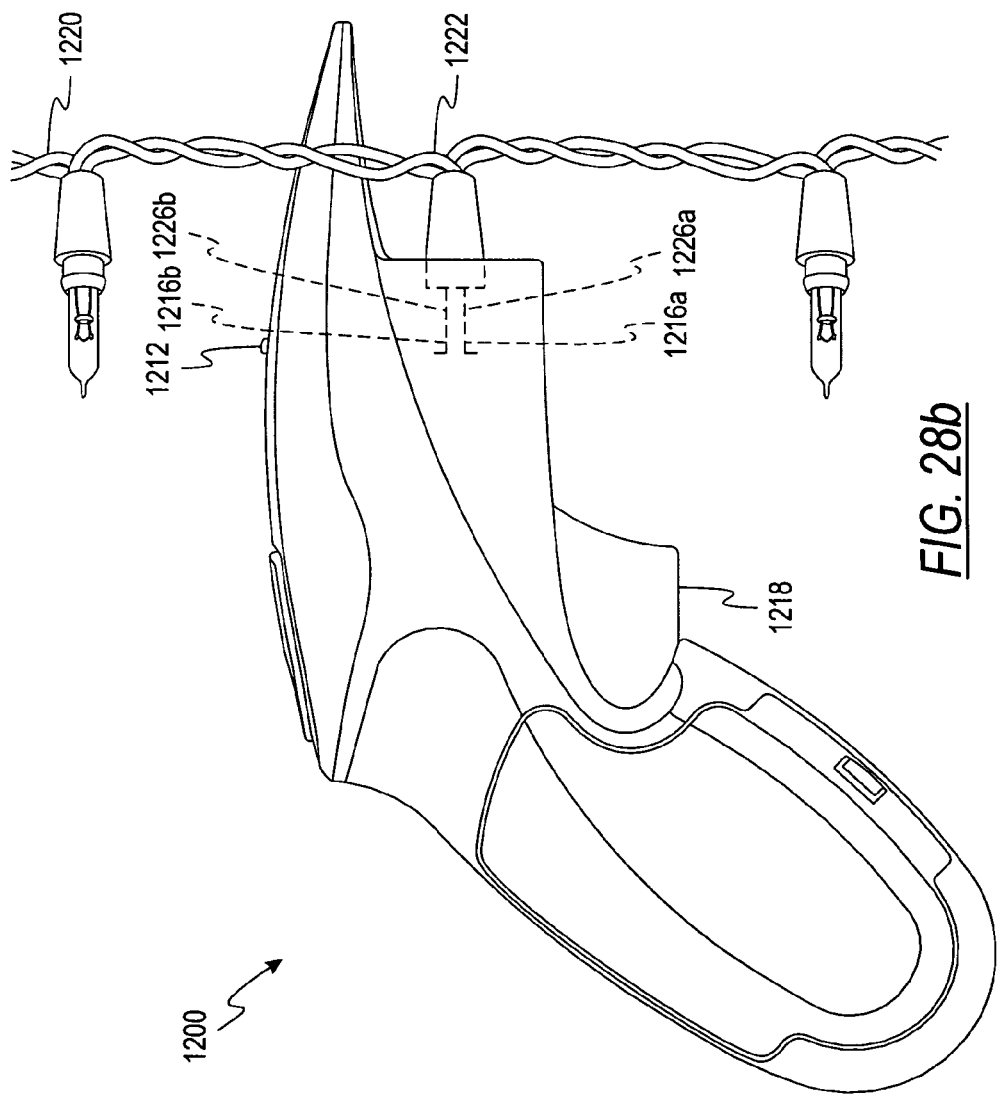
FIG. 28b is a side view of the repair device of FIG. 28a engaging a light string.

Turning now to FIG. 28b, the operation of the repair mechanism 1214 of the repair device 1200 will be described. In some cases, the electrical contacts 1216a, 1216b may connect with metal contacts 1226a, 1226b of the light string 1220 and the device repairs the shunt as described above in relation to FIGS. 26 and 27.

Also, because the repair mechanism 1214 still includes the plug socket 1219, the repair device 1200 can still accept the plug of the light string 1220 if the user wants to fix the bad bulb using that method.

Turning now to FIGS. 29a and 29b, a front view and a side view, respectively, of another repair device 1300 according to the present invention is shown. The repair device 1300 includes a detection mechanism 1302 and a repair mechanism 1304. The repair mechanism includes a plug socket 1306 and an internal socket 1308 as described above in relation to FIGS. 27-28b. The plug socket 1306 and internal socket 1308 are connected to a trigger 1310 and a shunt clearing circuit (not shown), which act to repair the bad bulb as described above.

The detection mechanism 1302 includes a sensor 1314, an LED 1316, and a buzzer. The sensor 1314 may act in any of the ways a sensor and/or a probe is described above. The sensor 1314 is connected to the LED 1316 and the buzzer. When the sensor 1314 detects a change in the AC electrostatic field, a signal is sent to the LED 1316 and the buzzer. However, unlike the sensor described above, instead of merely sensing the presence or absence of the AC electrostatic field, the sensor 1314 detects the strength of the AC electrostatic field. The sensor 1314 then transmits a signal relative to the strength of the AC electrostatic field to the buzzer and LED 1316. In this embodiment, the LED 1316 emits a light whose brightness is relative to the signal being sensed, i.e. instead of the LED 1316 either being on or off, it has a varying brightness relating to the strength of the AC electrostatic field being sensed. The same is true of the buzzer. In the buzzer described above, the buzzer sounded when an AC electrostatic field was detected and stopped buzzing in the absence of an AC electrostatic field. However, in this embodiment of the present invention, the buzzer emits a sound in varying intensity (loudness) depending on the intensity of the AC electrostatic field. This is beneficial because it provides an indication to the user as soon as the AC electrostatic field begins to change. Instead of only indicating to the user two states of on and off, the user is signaled as to changes in the AC electrostatic field.

In some embodiments of the repair device 1300, the detection mechanism 1302 may also include a sensitivity switch 1318. The switch 1318 is connected to the sensor 1314, the LED 1316, and the buzzer. When the switch 1318 is in an "on" position, the LED 1316 and buzzer are set to indicate any change in the AC electrostatic field. However, when the switch is in an "off" position, the LED 1316 and the buzzer only indicate whether an AC electrostatic field exists (the way described in previous embodiments). The user can then decide if they need to be able to sense any change or if they would rather only be notified of the existence of an AC electrostatic field.

Figure 30:
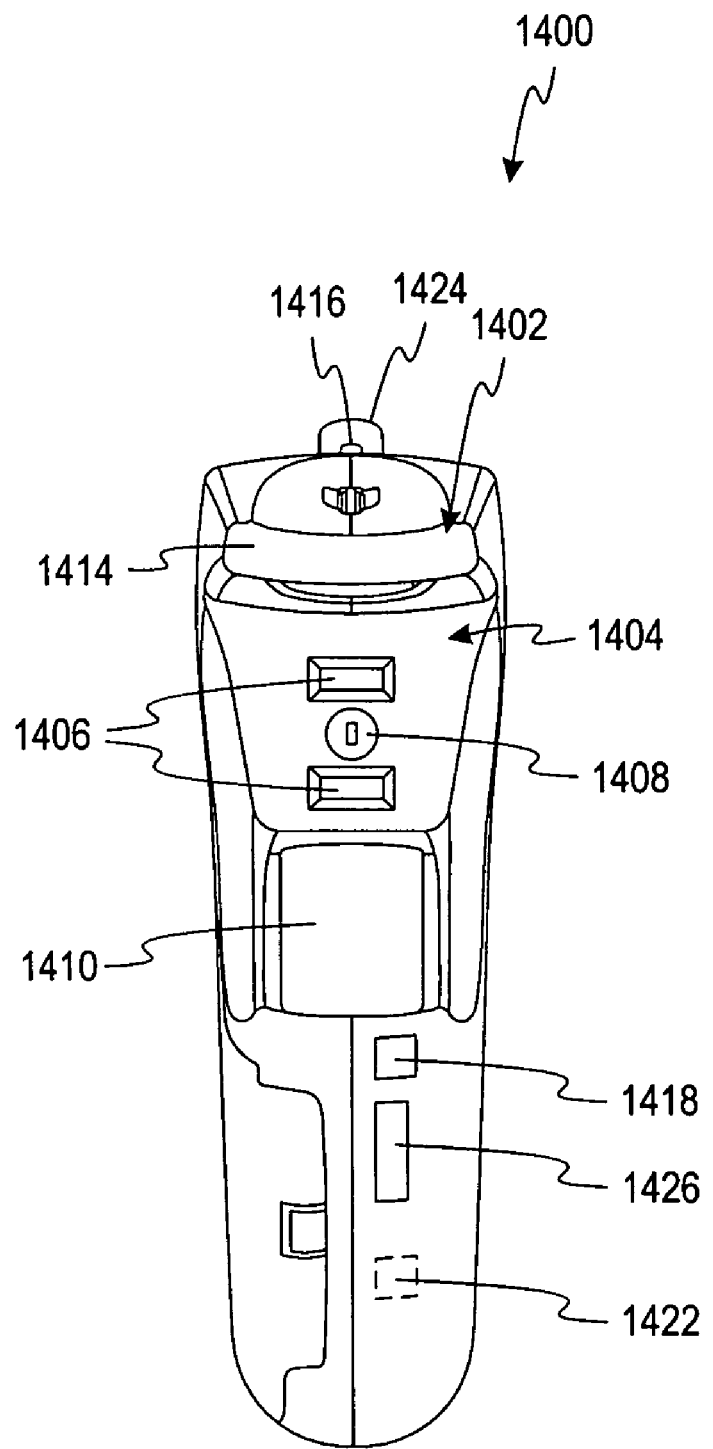
FIG. 30 is a front view of a repair device according to another embodiment of the present invention.

In FIG. 30, another embodiment of the present invention is illustrated. In this embodiment, a repair device 1400 is shown that includes a includes a detection mechanism 1402 and a repair mechanism 1404. The repair mechanism 1404 includes a plug socket 1406 and an internal socket 1408 as described above in relation to FIGS. 27-28b. The plug socket 1406 and internal socket 1408 are connected to a trigger 1410 and a shunt clearing circuit, which act to repair the bad bulb as described above. The detection mechanism 1402 includes a sensor 1414, an LED 1416, and a buzzer. The sensor 1414 may act in any of the ways a sensor and/or a probe is described above. The detection mechanism 1402 may also include a sensitivity switch 1418. The repair device 1400 also includes a light assembly. The light assembly includes a battery 1422, a light source 1424 and a switch 1426. The switch 1426 connects the light source 1424 to the battery 1422. When the switch 1426 is in an "on" position, the battery 1422 provides power to the light source 1424. The light source 1424 illuminates the area surrounding the repair device 1400, allowing a user to use the repair device 1400 in the dark.

Turning now to FIGS. 31a and 31b, a repair device 1500 according to another embodiment of the present invention is described. The repair device 1500 is similar to the devices described above and includes a repair mechanism 1502, a sensing mechanism 1504, and a trigger 1506. The sensing mechanism 1504 operates to sense failed bulbs in any of the methods described above. The repair mechanism 1502 includes a high voltage generator 1508 that can repair light bulb strings from multiple different countries. The repair mechanism 1502 includes multiple sets of electrical contacts 1510a, 1510b, 1510c, 1510d. Each set of electrical contacts 1510a, 1510b, 1510c, 1510d are adapted to receive light bulb string plugs from different countries. The high voltage generator 1508 generates a high voltage signal when the trigger 1506 is activated by the user. The high voltage signal travels through the electrical contact and into the plug. The signal then moves through the light string, clearing the shunt of the bad bulb as described above.

Figure 32:
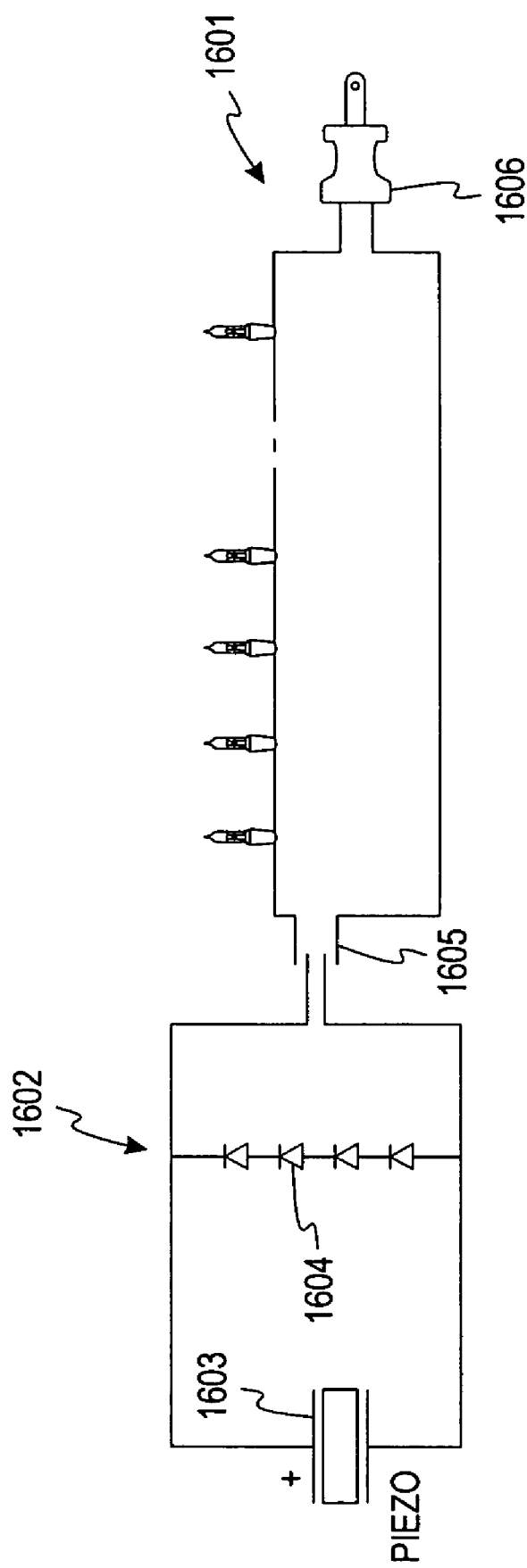
FIG. 32 is a schematic and circuit diagram of a repair device according to another embodiment of the present invention.

Referring now to FIG. 32, another circuit for repairing failed shunts in an otherwise operating light string, utilizes the AC line voltage in conjunction with the piezo pulse to repair defective shunts. Shown is a light string 1601 with one or more defective bulbs. A repair device 1602 including a piezo 1603 and a series of diodes 1604. The repair device 1602 plugs into a bulb socket 1605 (as described above in relation to FIGS. 26-28), while the light string 1601 is still plugged into an AC socket by an AC plug 1606. By pulling the trigger (not shown) of the repair device 1602, the piezo pulse first breaks down the non-conductive material in the failed bulb. This is immediately followed by the automatic application of the half wave rectified AC line voltage from the AC plug 1606. This energy causes the shunt to weld and thereby allow current to flow to the remaining lamps in the string. The functional lights in the light string will be illuminated at a reduced brightness with the failed bulb not illuminated. This embodiment is very useful in fixing bulb strings that have multiple functions, i.e., the lights can blink, all be on at once, etc. . . . , because it allows for the functions to still be running during the repair.

Figure 33:
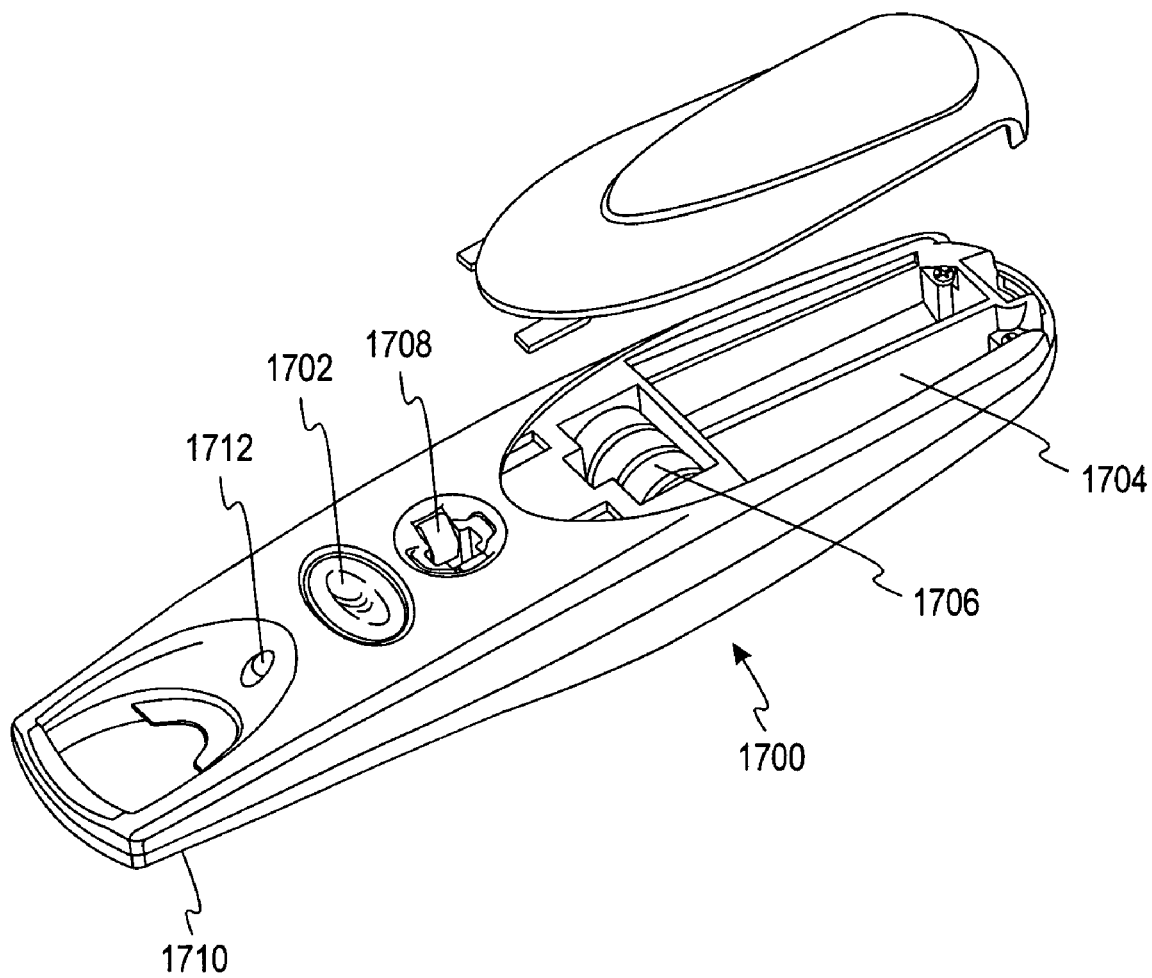
FIG. 33 is a perspective view of a sensing device according to another embodiment of the present invention.

Turning now to FIG. 33, a perspective view of another embodiment of a sensing device 1700 is illustrated. The sensing device includes an on/off switch 1702, a storage box 1704 for storing replacement bulbs (not shown) or extra fuses 1706, a bulb tester 1708, a dual antenna sensor 1710, and an LED 1712. The dual antenna sensor works as described in relation to FIG. 6g. The user passes the antenna over the light string, and as the AC electrostatic field strength changes, the LED 1712 changes in intensity. The bulb tester 1708 works as described in relation to FIG. 6c. Alternatively, other known circuits for testing bulbs may also be implemented.

Turning now to FIG. 34, a repair device 1800 according to another embodiment of the present invention is illustrated. According to this embodiment, the repair device 1800 includes a dual-antenna sensor 1802a, 1802b as discussed in FIG. 6g and a repair mechanism 1804 as described in any of the embodiments discussed above. In this embodiment, a bulb 1806 in a light string 1808 can be placed between the two antennas 1802a and 1802b. The repair device 1800 is moved from side to side, bringing the bulb 1806 adjacent to first one antenna 1802a and then to the other antenna 1802b. If the bulb is the malfunctioning bulb, the sensor will sense a change in the AC electrostatic field strength and send a signal indicating the change to an LED 1810 as described above. The LED 1810 will then alternate between being activated and deactivated when a bad bulb is between the two antennas.

Figure 35A:
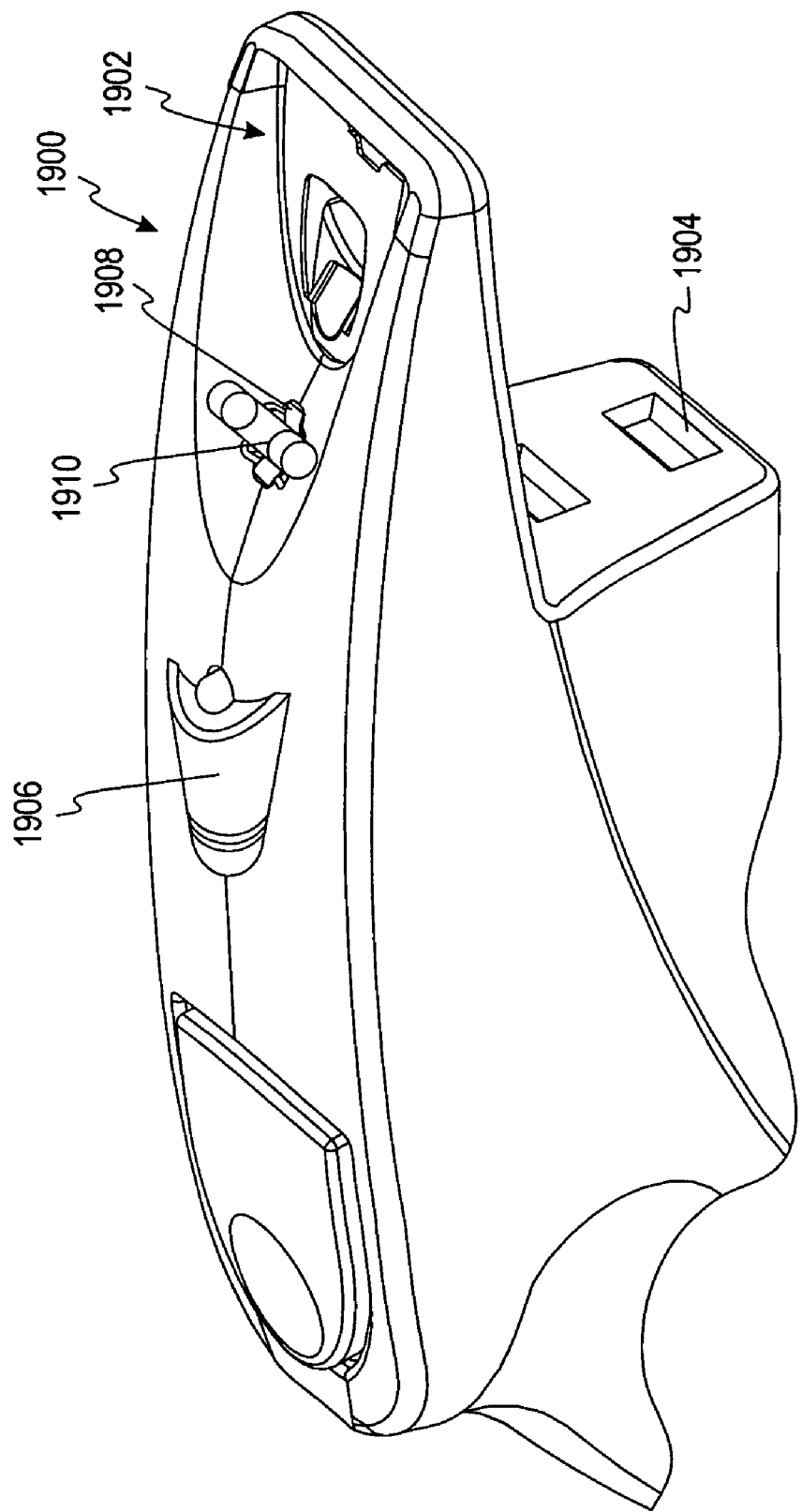
FIG. 35a is a perspective view of a repair device according to another embodiment of the present invention.
Figure 35B:
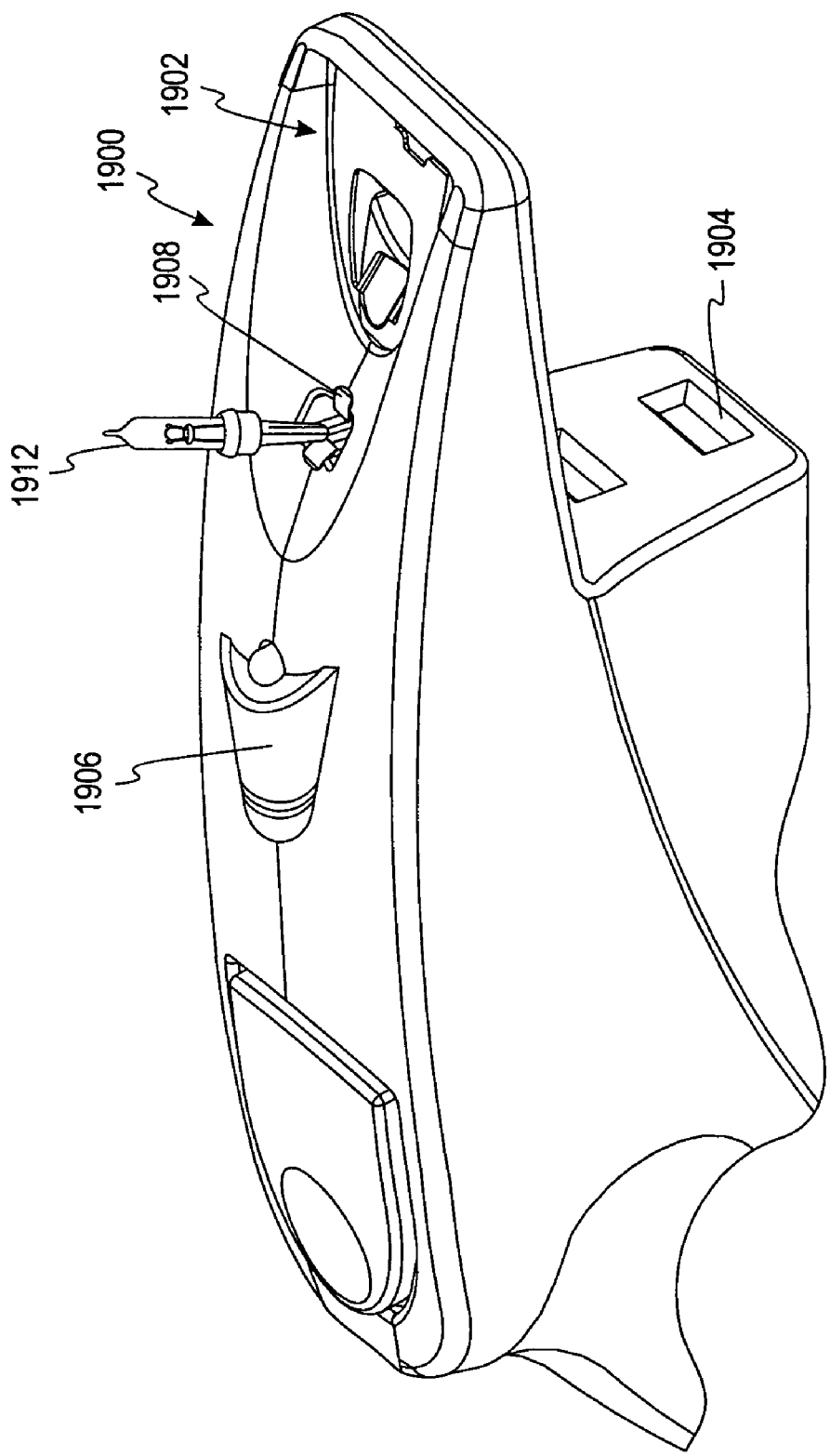
FIG. 35b is a perspective view of the repair device of FIG. 35a performing another function.

Turning now to FIG. 35a, a repair device 1900 according to another embodiment of the present invention is illustrated. In addition to including a sensor 1902, a repair mechanism 1904, and a headlamp 1906 (all described in detail above), this embodiment also includes a fuse/light bulb tester 1908. In this embodiment, the fuse/light bulb tester 1908 can be used to test either a fuse or a light bulb. In FIG. 35a, the repair device 1900 is shown testing a fuse 1910. The fuse tester works as previously described in the description of FIG. 5. Also, as shown in FIG. 35b, the fuse/light bulb tester 1908 is shown testing a light bulb 1912. The light bulb portion of the tester 1908 works as described above. Such a device is extremely handy because it allows the user to fix or test almost any portion of a decorative light string or associated circuitry. Thus, instead of having to carry multiple tools, the user only needs one to find (and fix) the problem.

Figure 36:
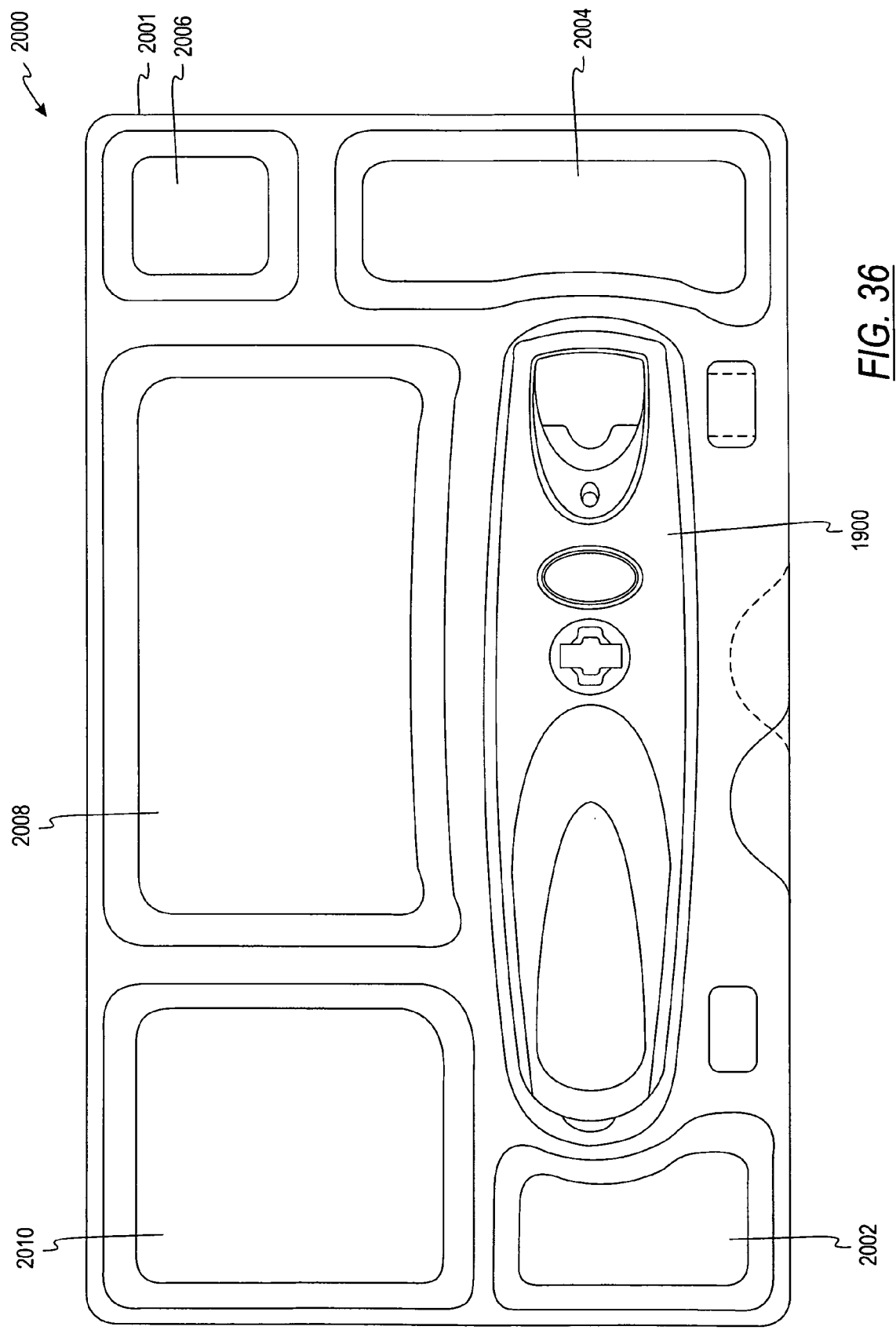
FIG. 36 is a top view of a kit according to the present invention containing the sensing device of a FIG. 33.

Turning now to FIG. 36, a kit 2000 containing the sensing device 1900 is illustrated. In this embodiment, the kit 2000 may be a thermoform package 2001 containing a storage spot 2002 for 3.5 V bulbs, a storage spot 2004 for 2.5 V bulbs, and a storage spot 2006 for fuses. The kit 2000 may also include other storage wells 2008, 2010. The kit is useful because it allows a seller to package all the necessary components to repair a malfunctioning bulb—the sensing device, replacement bulbs and fuses, and instructions—all in a single package.

In an alternative embodiment, the kit 2000 may contain any of the repair or sensing devices described previously in this application. Furthermore, it is understood that while many of the circuits or features have been described in isolation, any of them may be combined to form a repair and/or sensing device (e.g., the dual antenna sensor of the sensing device may be combined with the AC-assisted repair mechanism).

The invention claimed is:

1. A method of sensing a malfunctioning shunt across a failed filament in a light bulb in a group of series-connected miniature decorative bulbs, wherein said group of series-connected decorative bulbs is in a light string that includes wires connecting said bulbs to each other and conducting electrical power to said bulbs, said method comprising:
   passing a dual antenna sensor along said wires, sensing the strength of the AC electrostatic field around a portion of said wires adjacent to said sensor and producing a single electrical signal representing the magnitude of said field strength at a common output, wherein said dual-antenna sensor comprises a first antenna and a second antenna;
   placing a suspected failed bulb between the first antenna and the second antenna;
   moving said first and second antennas, so that a socket of the suspected failed bulb is adjacent first one of said first antenna and second antenna and then the other of the first antenna and the second antenna;
   if a failed bulb is between the first and second antennas, said first antenna sensing an AC electrostatic field when said failed bulb is adjacent said first antenna and said second antenna failing to sense an AC electrostatic field when said failed bulb is adjacent said second antenna; and
   producing an output signal when an AC electrostatic field is sensed by either antenna and ceasing to produce the output signal when the AC electrostatic field is no longer sensed.

\* \* \* \* \*